(12) United States Patent
Ishigaki

(10) Patent No.: US 9,312,267 B2
(45) Date of Patent: Apr. 12, 2016

(54) SEMICONDUCTOR DEVICE

(71) Applicant: RENESAS ELECTRONICS CORPORATION, Kawasaki-shi, Kanagawa (KR)

(72) Inventor: Yoshiyuki Ishigaki, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/807,049

(22) Filed: Jul. 23, 2015

(65) Prior Publication Data
US 2016/0049415 A1 Feb. 18, 2016

(30) Foreign Application Priority Data
Aug. 13, 2014 (JP) .................................. 2014-164808

(51) Int. Cl.
*H01L 29/788* (2006.01)
*H01L 27/115* (2006.01)
*H01L 23/535* (2006.01)
*H01L 23/522* (2006.01)

(52) U.S. Cl.
CPC ...... *H01L 27/11521* (2013.01); *H01L 23/5226* (2013.01); *H01L 23/535* (2013.01)

(58) Field of Classification Search
CPC .............. H01L 23/5226; H01L 23/535; H01L 27/11521; H01L 27/11536; H01L 27/11541; H01L 27/11546; H01L 27/11529; H01L 29/7881
See application file for complete search history.

(56) References Cited

U.S. PATENT DOCUMENTS

| 6,541,324 | B1 | 4/2003 | Wang | |
|---|---|---|---|---|
| 7,598,561 | B2 * | 10/2009 | Chen | H01L 29/7885 257/314 |
| 7,786,524 | B2 * | 8/2010 | Hazama | H01L 27/105 257/316 |
| 7,948,021 | B2 * | 5/2011 | Maekawa | H01L 27/115 257/302 |
| 2010/0155814 | A1 * | 6/2010 | Sato | H01L 27/0207 257/319 |

FOREIGN PATENT DOCUMENTS

JP   2003-152121 A   5/2003

\* cited by examiner

*Primary Examiner* — Thanh Y Tran
(74) *Attorney, Agent, or Firm* — Shapiro, Gabor and Rosenberger, PLLC

(57) ABSTRACT

In a memory cell array region and a source contact region defined in a surface of a semiconductor substrate, a memory cell transistor including a floating gate electrode and a control gate electrode is formed. In a gate contact region, a dummy floating gate electrode is arranged to partially be superimposed on a dummy element formation region in a two-dimensional view. In a first interlayer insulating film and a second interlayer insulating film covering the memory cell transistor, a contact plug is formed to penetrate the first interlayer insulating film and a via is formed to penetrate a second interlayer insulating film.

10 Claims, 57 Drawing Sheets

SEMICONDUCTOR DEVICE

BACKGROUND OF THE INVENTION

1. Field of the Invention

The present invention relates to a semiconductor device and in particular it can suitably be used for a semiconductor device including a non-volatile memory including a floating gate electrode and a control gate electrode.

2. Description of the Background Art

A semiconductor device including a non-volatile memory having a floating gate electrode represents one of non-volatile memories. In a surface of a semiconductor substrate of such a semiconductor device, a memory cell array region and a gate contact region are defined. In the memory cell array region, a memory cell transistor is arranged. An interlayer insulating film is formed to cover the memory cell transistor. In a portion of the interlayer insulating film located in the gate contact region, a contact plug and a via for electrical connection between a control gate electrode and a word line shunt are formed.

In the memory cell array region, a memory cell transistor is formed in an element formation region defined by an element isolation region. On the other hand, the gate contact region is arranged in the element isolation region (an element isolation insulating film). In the gate contact region, in order to achieve uniform processing accuracy of the floating gate electrode, a dummy floating gate electrode is formed at a pitch in conformity with a pitch of the floating gate electrode formed in the memory cell array region. Here, the dummy floating gate electrode is formed on the element isolation insulating film. Japanese Patent Laying-Open No. 2003-152121 represents one example of documents disclosing a semiconductor device including a non-volatile memory.

SUMMARY OF THE INVENTION

A conventional semiconductor device including a non-volatile memory has been found to suffer the following problems. In a gate contact region, a dummy floating gate electrode is formed on an element isolation insulating film. Therefore, a value for a coupling ratio of the dummy floating gate electrode is greater than a value for a coupling ratio of the floating gate electrode located in a memory cell array region, which is close to 1. Thus, with charge up at the time of via opening, a potential of the dummy floating gate electrode is different from a potential of the floating gate electrode.

Consequently, during baking in a subsequently conducted wafer test, movable ions in an interlayer insulating film are non-uniformly distributed due to a potential of the dummy floating gate electrode, and it has been found that the problem of erroneous determination as retention failure of a memory cell transistor in the memory cell array region, in particular in the vicinity of the gate contact region occurs.

Other objects and novel features will become apparent from the description herein and accompanying drawings.

A semiconductor device according to one embodiment includes a semiconductor substrate, a first region, a second region, a plurality of memory cell transistors, a dummy floating gate electrode, a word line, an interlayer insulating film, and a conductor portion. The first region is arranged in a surface of the semiconductor substrate and includes a plurality of first element formation regions each defined by a first element isolation region. The second region is arranged in the surface of the semiconductor substrate as being adjacent to the first region and includes a dummy element formation region defined by a second element isolation region. The plurality of memory cell transistors are formed in a plurality of the first element formation regions and each include a floating gate electrode and a control gate electrode. The dummy floating gate electrode is formed in the second region. The word line is formed on the dummy floating gate electrode so as to cross the dummy floating gate electrode and electrically connected to the control gate electrode of at least one memory cell transistor of the plurality of memory cell transistors. The interlayer insulating film is formed to cover the word line. The conductor portion is formed in a portion of the interlayer insulating film located in the second region and electrically connected to the word line. The dummy floating gate electrode is arranged to partially be superimposed on the dummy element formation region in a two-dimensional view.

A semiconductor device according to another embodiment includes a semiconductor substrate, a first region, a second region, a plurality of memory cell transistors, a dummy floating gate electrode, a word line, an interlayer insulating film, and a conductor portion. The first region is arranged in a surface of the semiconductor substrate and includes a plurality of first element formation regions each defined by a first element isolation region. The second region is arranged in the surface of the semiconductor substrate as being adjacent to the first region and includes a dummy element formation region defined by a second element isolation region. The plurality of memory cell transistors are formed in a plurality of the first element formation regions and each include a floating gate electrode and a control gate electrode. The dummy floating gate electrode is formed in the second region. The word line is formed on the dummy floating gate electrode so as to cross the dummy floating gate electrode and electrically connected to the control gate electrode of at least one memory cell transistor of the plurality of memory cell transistors. The interlayer insulating film is formed to cover the word line. The conductor portion is formed in a portion of the interlayer insulating film located in the second region and electrically connected to the word line. The dummy floating gate electrode and the word line are electrically connected to each other.

According to the semiconductor device in one embodiment, erroneous determination as retention failure of a memory cell transistor can be suppressed.

According to a semiconductor device in another embodiment, erroneous determination as retention failure of a memory cell transistor can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A first example of a semiconductor device including a non-volatile memory will be described here.

Figure 1:
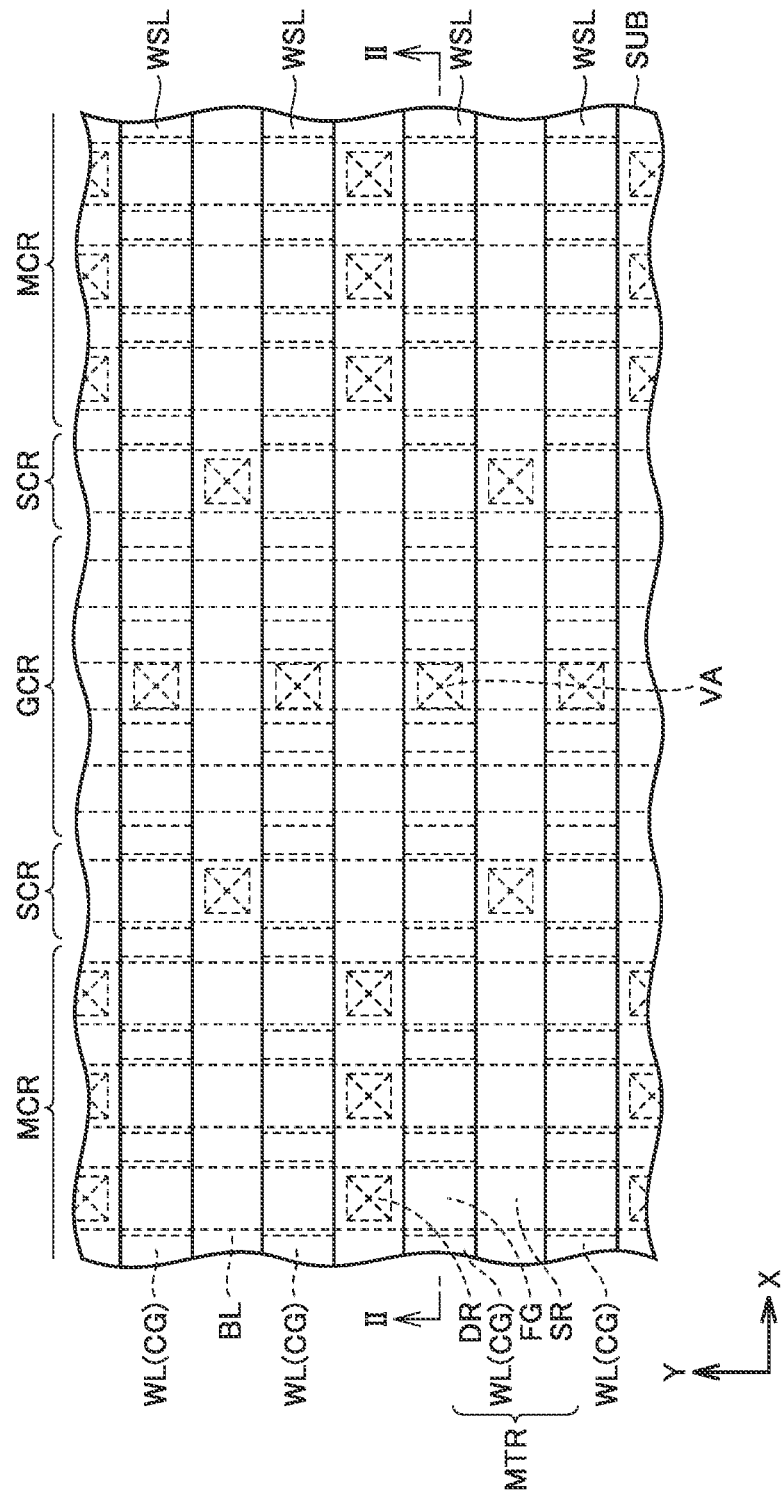
FIG. 1 is a plan view showing a layout of a semiconductor device according to a first embodiment.
Figure 2:
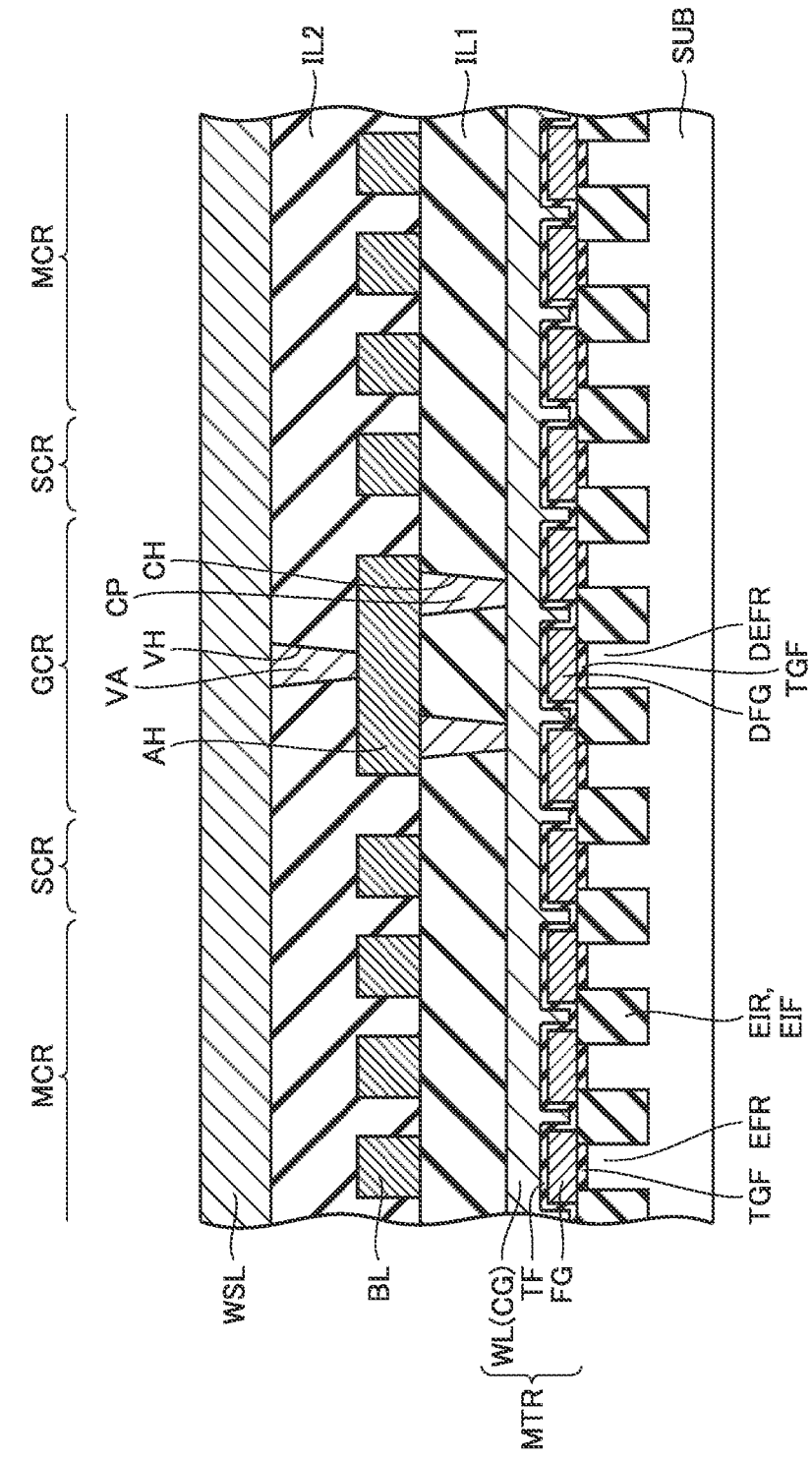
FIG. 2 is a cross-sectional view along the line II-II shown in FIG. 1 in the first embodiment.

As shown in FIGS. 1 and 2, in a surface of a semiconductor substrate SUB, a memory cell array region MCR and a source contact region SCR (a first region) as well as a gate contact region GCR (a second region) are defined. In memory cell array region MCR and source contact region SCR, an element formation region EFR is defined by an element isolation region EIR. In gate contact region GCR, with a pattern in conformity with a pattern of element isolation region EIR formed in memory cell array region MCR, element isolation region EIR is formed and a dummy element formation region DEFR is defined.

In memory cell array region MCR and source contact region SCR, a floating gate electrode FG is formed on a prescribed portion in element formation region EFR, with a tunnel insulating film TGF being interposed. In gate contact region GCR, a dummy floating gate electrode DFG is formed on a prescribed portion in dummy element formation region DEFR, with tunnel insulating film TGF being interposed. Dummy floating gate electrode DFG is arranged to partially be superimposed on dummy element formation region DEFR in a two-dimensional view. A two-dimensional view intends a two-dimensional layout.

As will be described later, dummy floating gate electrode DFG is formed with a pattern in conformity with a pattern of floating gate electrode FG formed in memory cell array region MCR, in order to achieve uniform processing accuracy of floating gate electrode FG in a surface of semiconductor substrate SUB. A word line WL is formed on floating gate electrode FG and dummy floating gate electrode DFG, with an ONO film TF being interposed. ONO film TF is a stack film constituted of a silicon oxide film, a silicon nitride film, and a silicon oxide film. Word line WL extends in an X direction. In gate contact region GCR, word line WL is formed to cross dummy floating gate electrode DFG.

A portion of word line WL two-dimensionally superimposed on floating gate electrode FG serves as a control gate electrode CG. In each portion of element formation region EFR located on a side of a Y direction (positive) with respect to word line WL, a drain region DR is formed, and in each portion of element formation region EFR located on the side of the Y direction (negative), a source region SR is formed. Floating gate electrode FG, control gate electrode CG, source region SR, and drain region DR implement a memory cell transistor MTR.

A first interlayer insulating film IL1 is formed from an undoped oxide film so as to cover memory cell transistor MTR. In a portion of first interlayer insulating film IL1 located in gate contact region GCR, a contact hole CH penetrating first interlayer insulating film IL1 and reaching word line WL is formed. In that contact hole CH, a contact plug CP electrically connected to word line WL is formed. Contact plug CP is arranged to partially be superimposed on dummy element formation region DEFR in a two-dimensional view.

A bit line BL is formed on a surface of a portion of first interlayer insulating film IL1 located in memory cell array region MCR and source contact region SCR. Bit line BL extends in the Y direction so as to intersect with word line WL. An interconnection AH electrically connected to contact plug CP is formed on a surface of a portion of first interlayer insulating film IL1 located in gate contact region GCR. Bit line BL and interconnection AH are formed from an aluminum film or the like.

A second interlayer insulating film IL2 is formed from an undoped oxide film so as to cover bit line BL and interconnection AH. In a portion of second interlayer insulating film IL2 located in gate contact region GCR, a via hole VH penetrating second interlayer insulating film IL2 and reaching interconnection AH is formed. In via hole VH, a via VA electrically connected to interconnection AH is formed. On a surface of second interlayer insulating film IL2, a word line shunt WSL electrically connected to via VA is formed. Word line shunt WSL extends in the X direction. A main portion of a semiconductor device is constructed as above.

Figure 3:
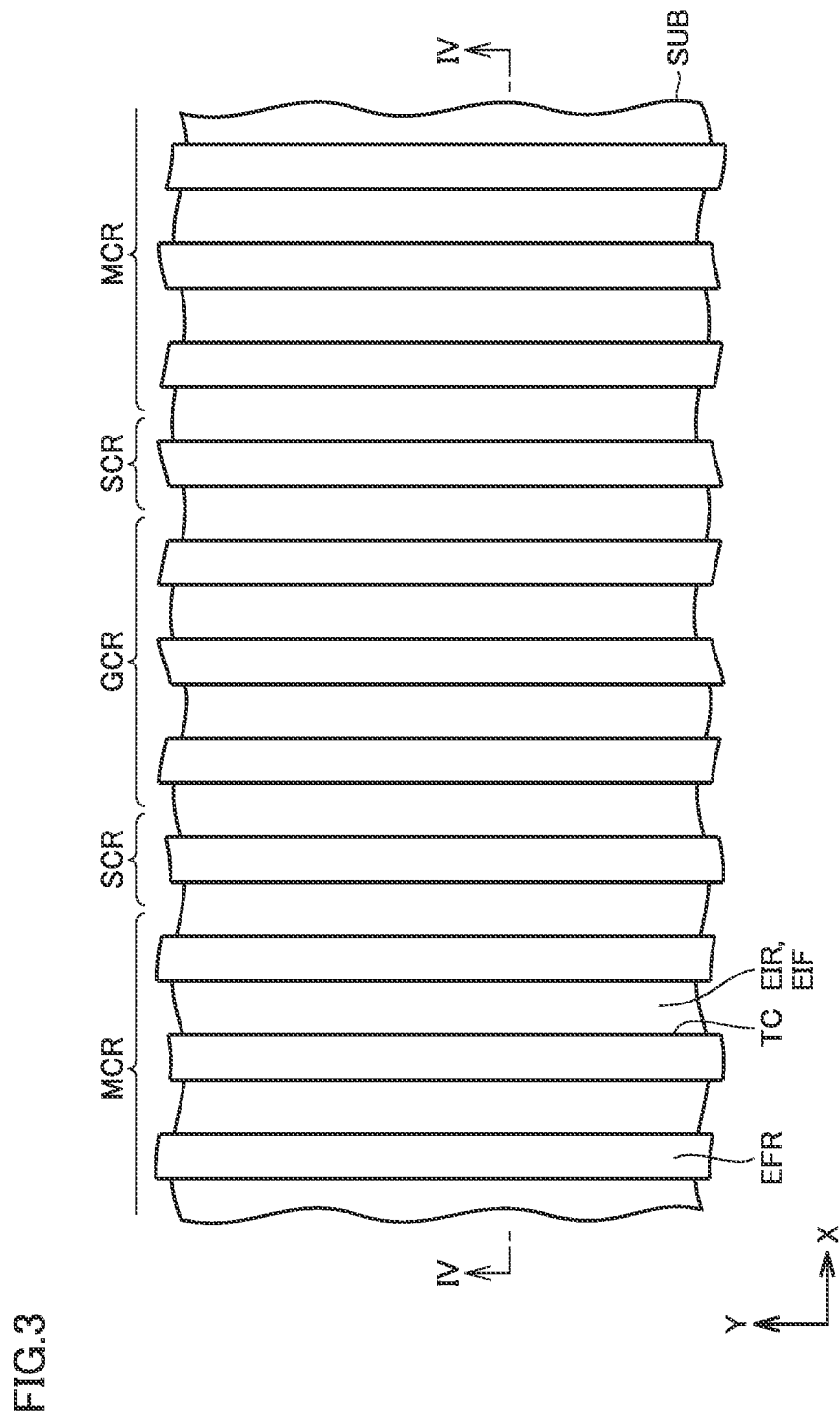
FIG. 3 is a plan view showing one step in a method of manufacturing a semiconductor device in the first embodiment.
Figure 4:
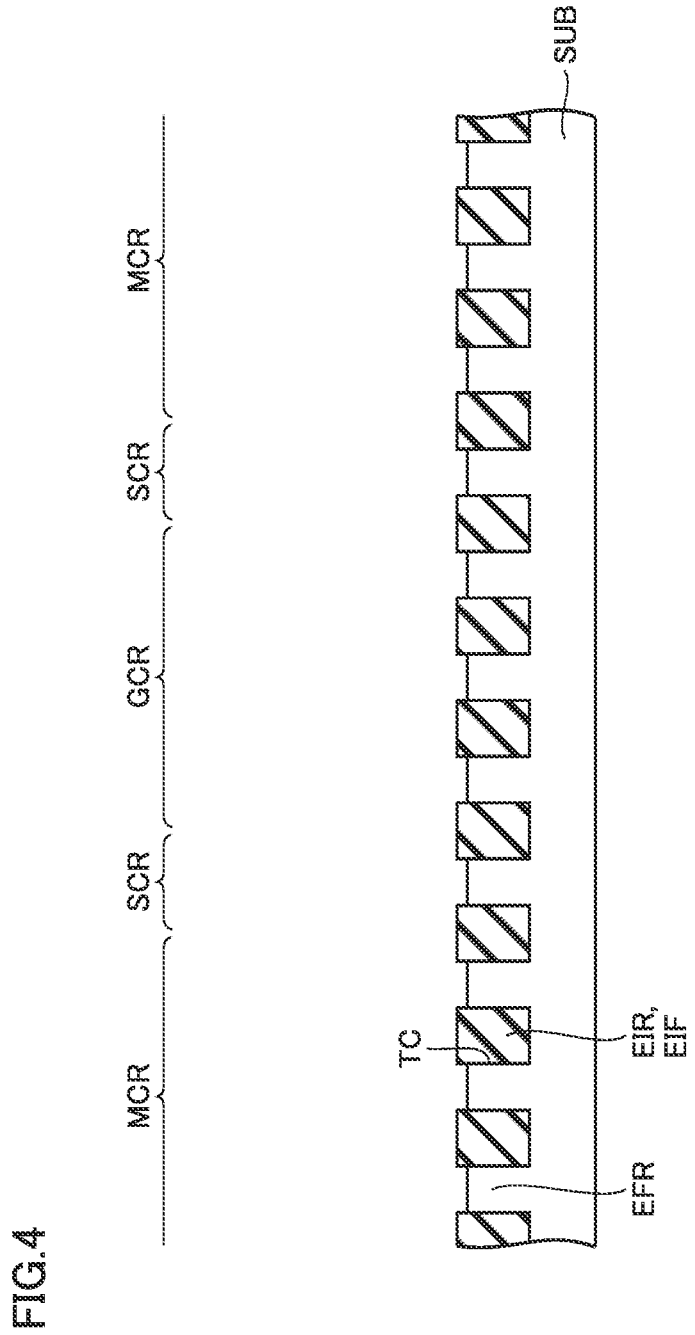
FIG. 4 is a cross-sectional view along the line IV-IV shown in FIG. 3 in the first embodiment.

A method of manufacturing the semiconductor device including the non-volatile memory described above will now be described. Initially, as shown in FIGS. 3 and 4, element isolation region EIR is formed by forming an isolation trench TC in a surface of a semiconductor substrate and filling isolation trench TC with an element isolation insulating film EIF. Element isolation region EIR defines element formation region EFR. In gate contact region GCR, as in memory cell array region MCR, element isolation region EIR is formed to define element formation region EFR.

Figure 5:
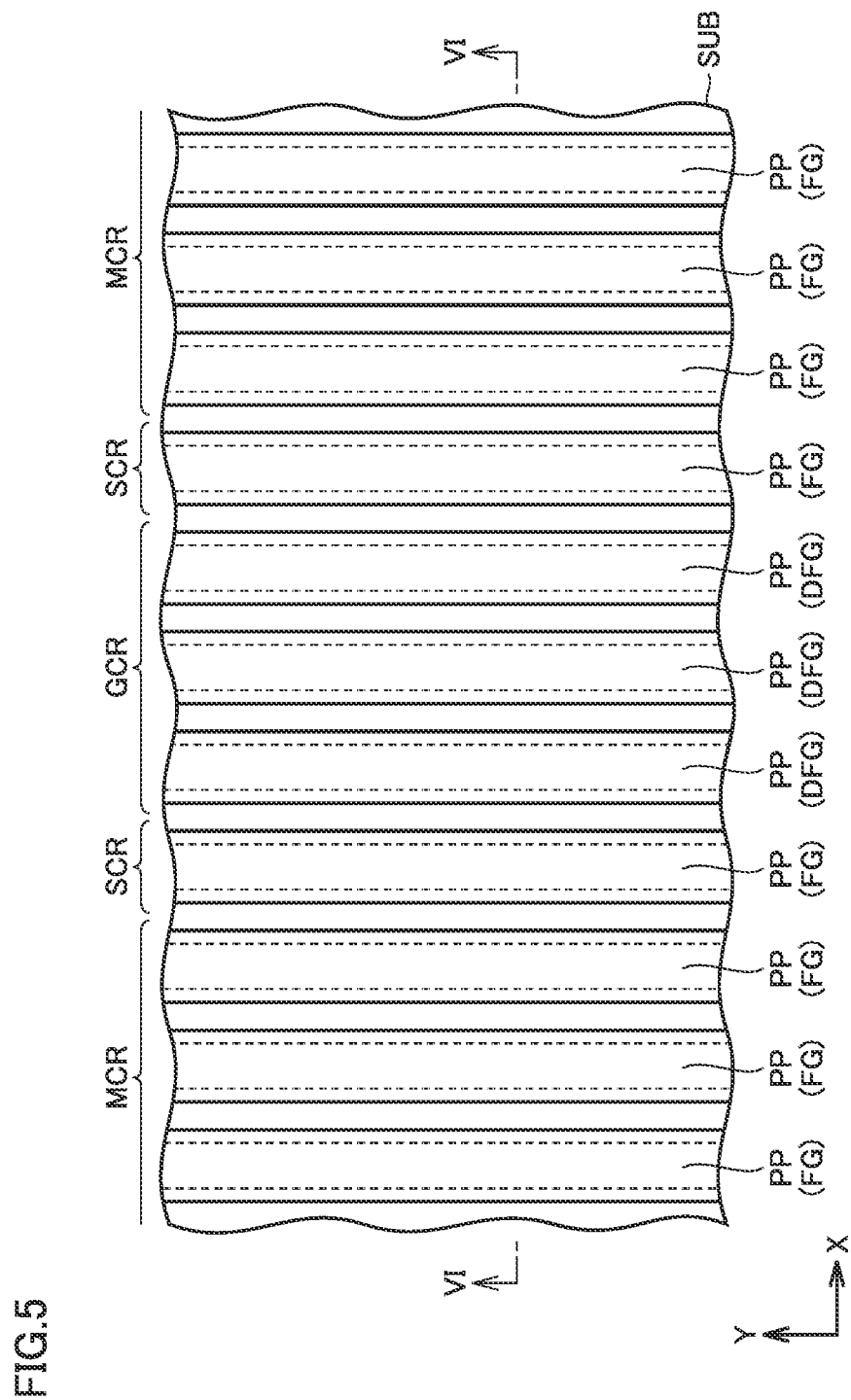
FIG. 5 is a plan view showing a step performed after the step shown in FIGS. 3 and 4 in the first embodiment.
Figure 6:
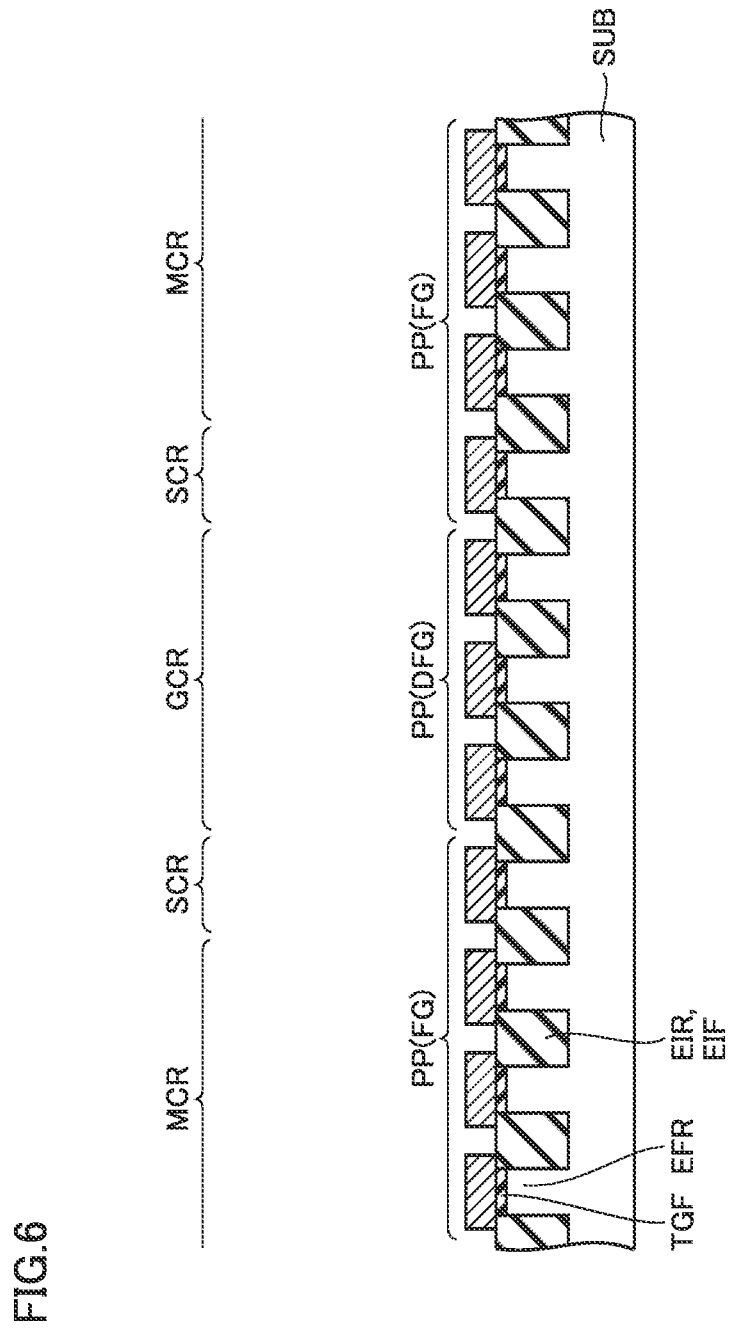
FIG. 6 is a cross-sectional view along the line VI-VI shown in FIG. 5 in the first embodiment.

Then, through thermal oxidation treatment, tunnel insulating film TGF (having a film thickness of approximately 10 nm) is formed on a surface of element formation region EFR (see FIG. 6). Then, a polysilicon film (not shown) having a film thickness of approximately 100 nm is formed to cover tunnel insulating film TGF. Then, through a prescribed photolithography process and an etching process, as shown in FIGS. 5 and 6, a polysilicon film pattern PP to be a floating gate electrode is formed. In order to ensure accuracy in patterning of polysilicon film pattern PP and planarity of a subsequently formed first interlayer insulating film, polysilicon film pattern PP is formed also in gate contact region GCR.

Figure 7:
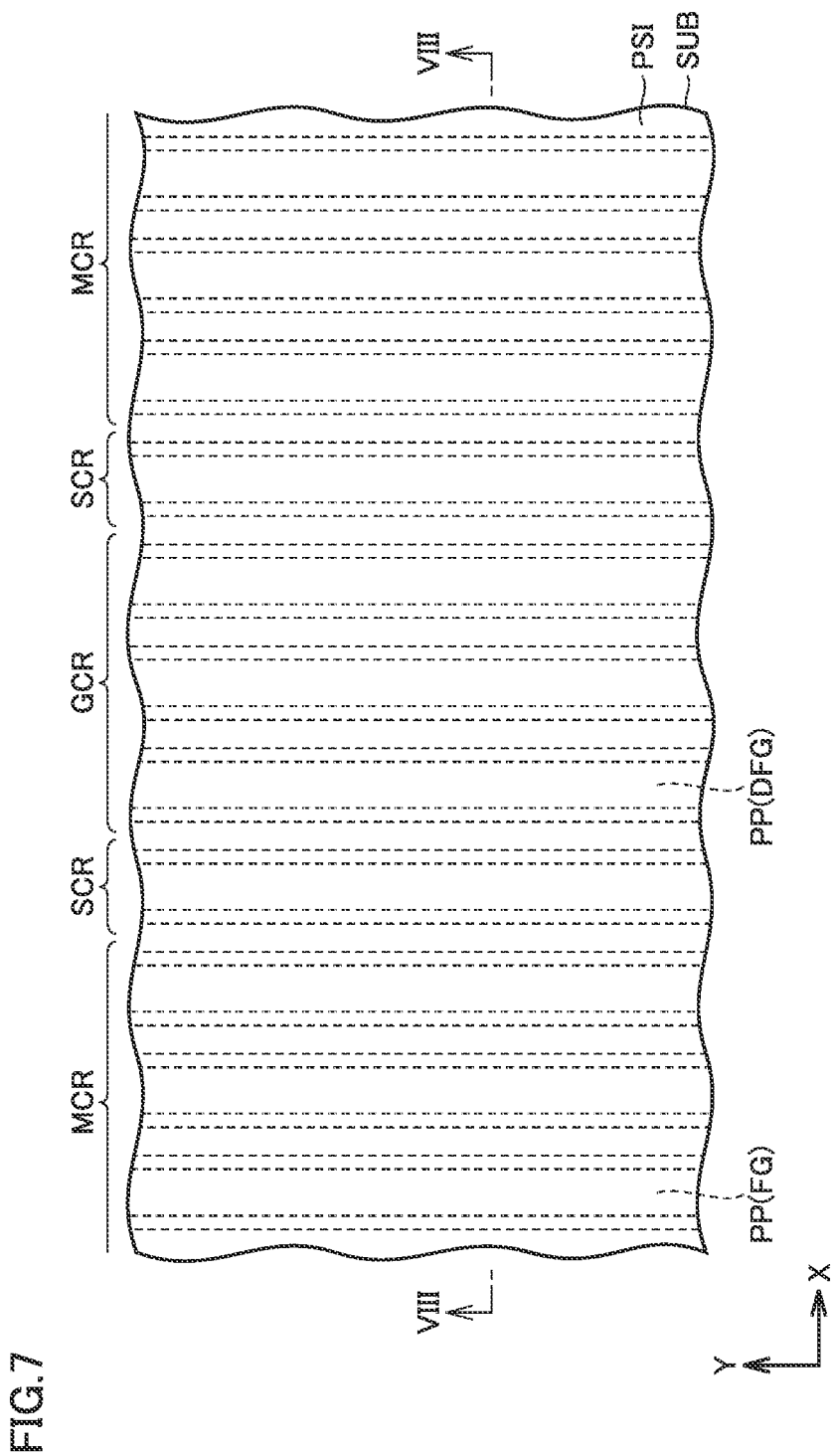
FIG. 7 is a plan view showing a step performed after the step shown in FIGS. 5 and 6 in the first embodiment.
Figure 8:
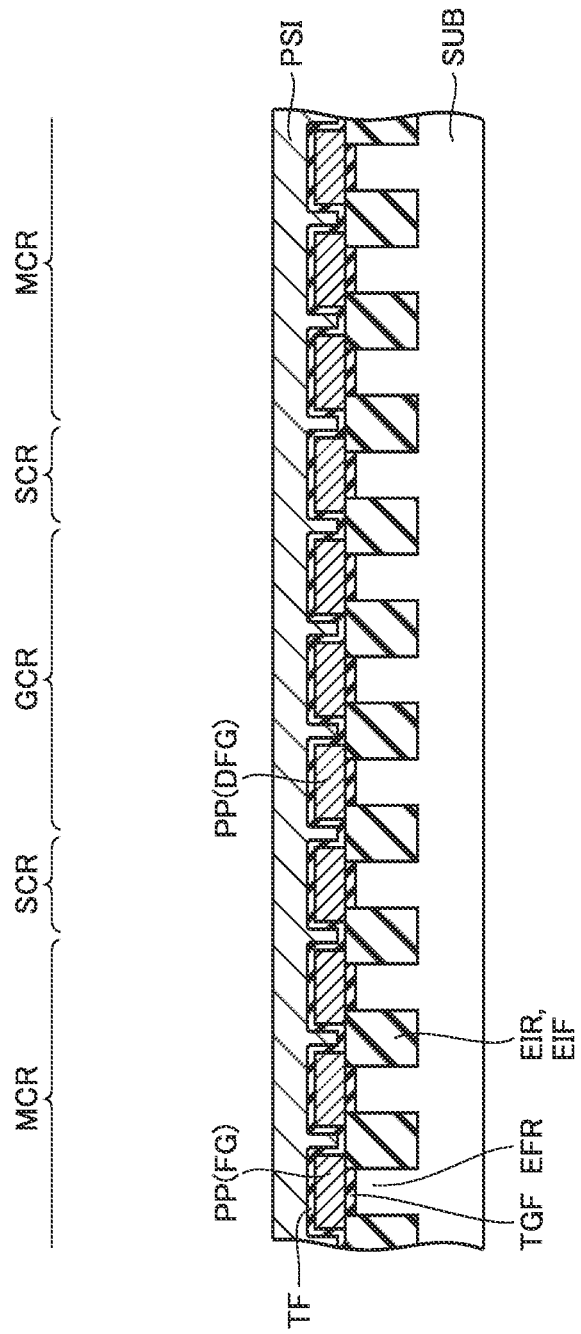
FIG. 8 is a cross-sectional view along the line VIII-VIII shown in FIG. 7 in the first embodiment.

Then, ONO film TF (see FIG. 8) is formed to cover polysilicon film pattern PP, by successively depositing a silicon oxide film (having a film thickness approximately from 3 to 5 nm), a silicon nitride film (having a film thickness approximately from 6 to 10 nm), and a silicon oxide film (having a film thickness approximately from 3 to 5 nm). Then, as shown in FIGS. 7 and 8, a polysilicon film PSI (having a film thickness approximately from 100 to 200 nm) to be a word line is formed to cover ONO film TF.

Figure 9:
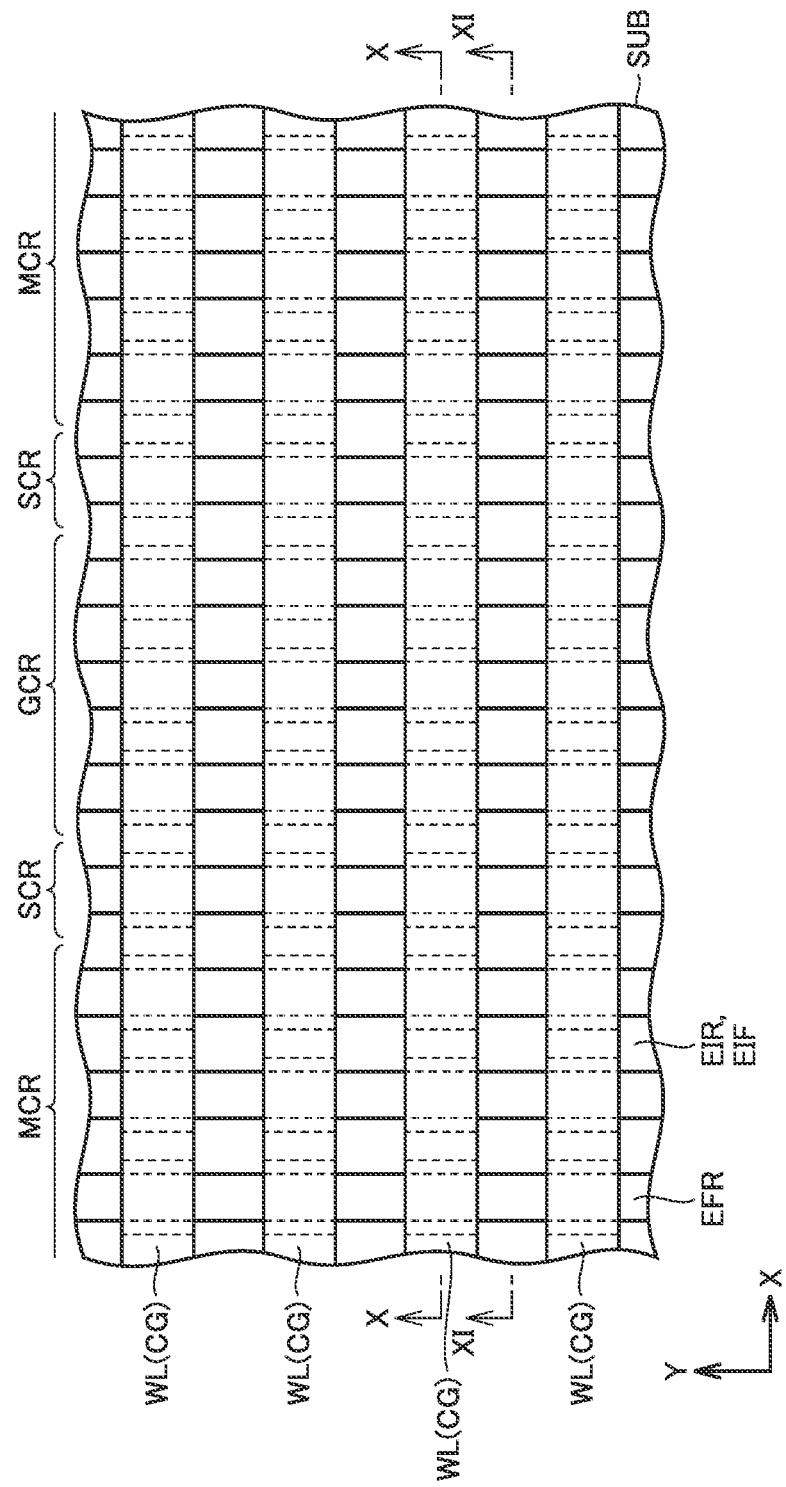
FIG. 9 is a plan view showing a step performed after the step shown in FIGS. 7 and 8 in the first embodiment.
Figure 10:
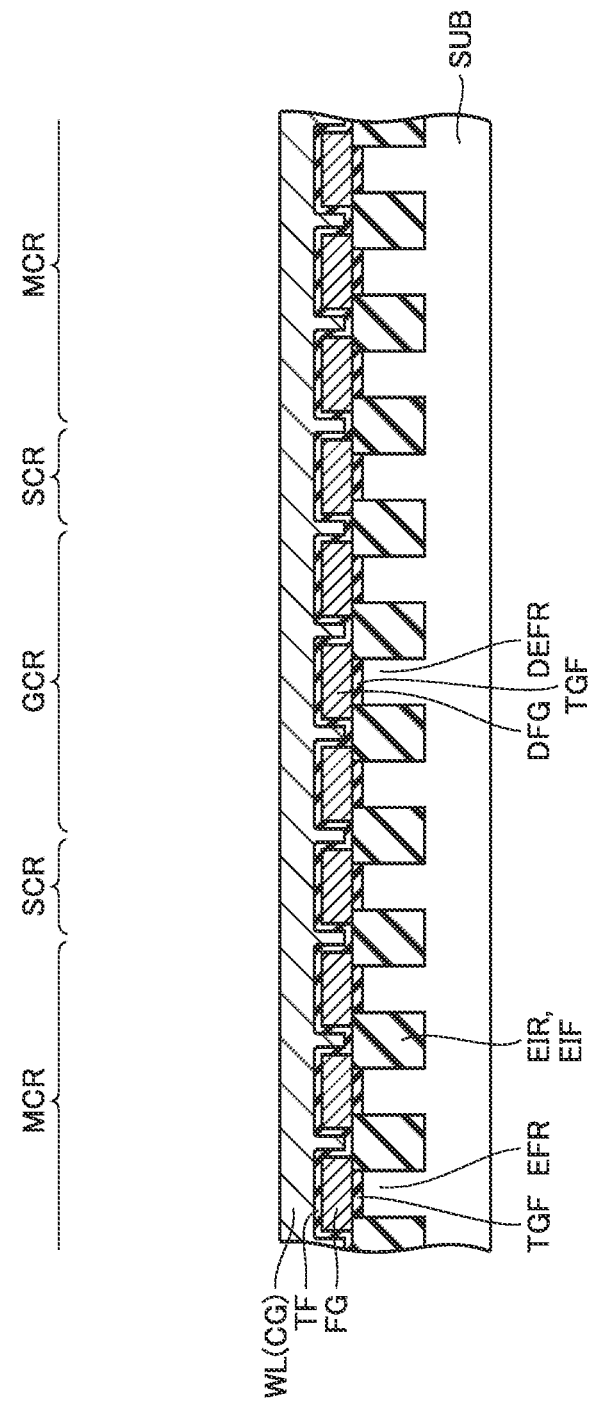
FIG. 10 is a cross-sectional view along the line X-X shown in FIG. 9 in the first embodiment.
Figure 11:
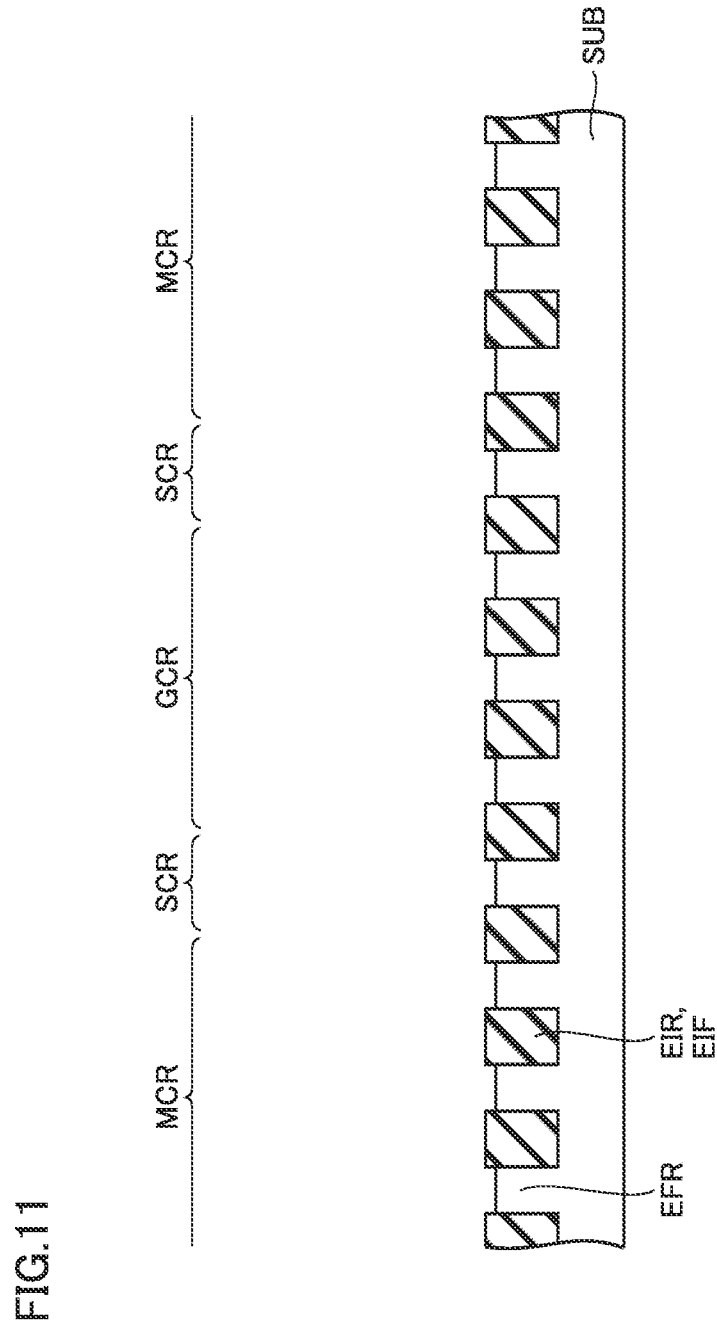
FIG. 11 is a cross-sectional view along the line XI-XI shown in FIG. 9 in the first embodiment.

Then, through a prescribed photolithography process and an etching process on polysilicon film PSI, word line WL is formed as shown in FIGS. 9, 10, and 11. Here, a portion of polysilicon film pattern PP exposed between the word lines is also subjected to the etching process so as to remove the portion of polysilicon film pattern PP. Thus, floating gate electrode FG is formed in memory cell array region MCR. Dummy floating gate electrode DFG is formed in gate contact region GCR. A portion of word line WL superimposed on floating gate electrode FG in a two-dimensional view serves as control gate electrode CG. Dummy floating gate electrode DFG is formed to partially be superimposed on dummy element formation region DEFR in a two-dimensional view.

Figure 12:
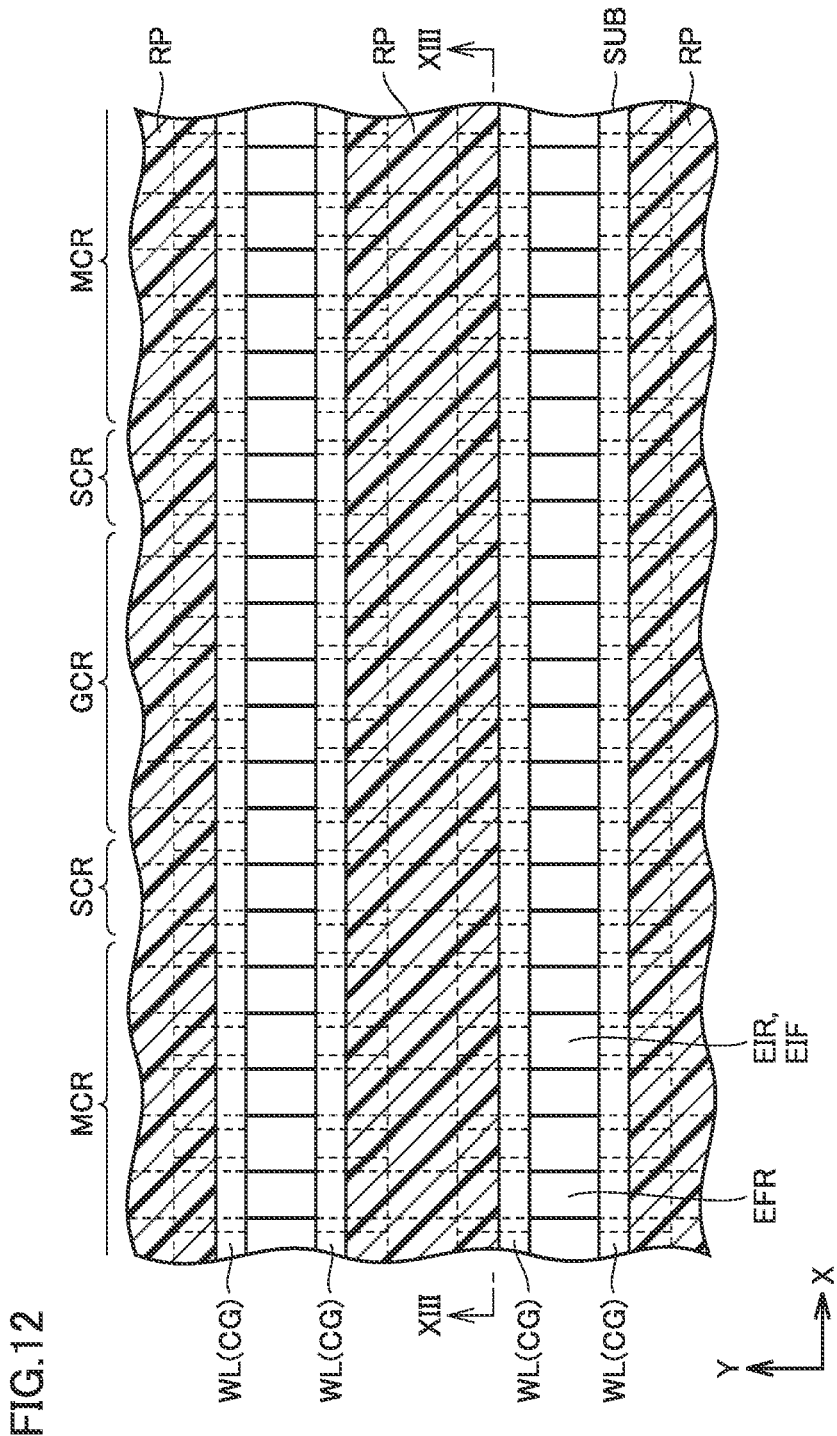
FIG. 12 is a plan view showing a step performed after the step shown in FIGS. 9, 10, and 11 in the first embodiment.
Figure 13:
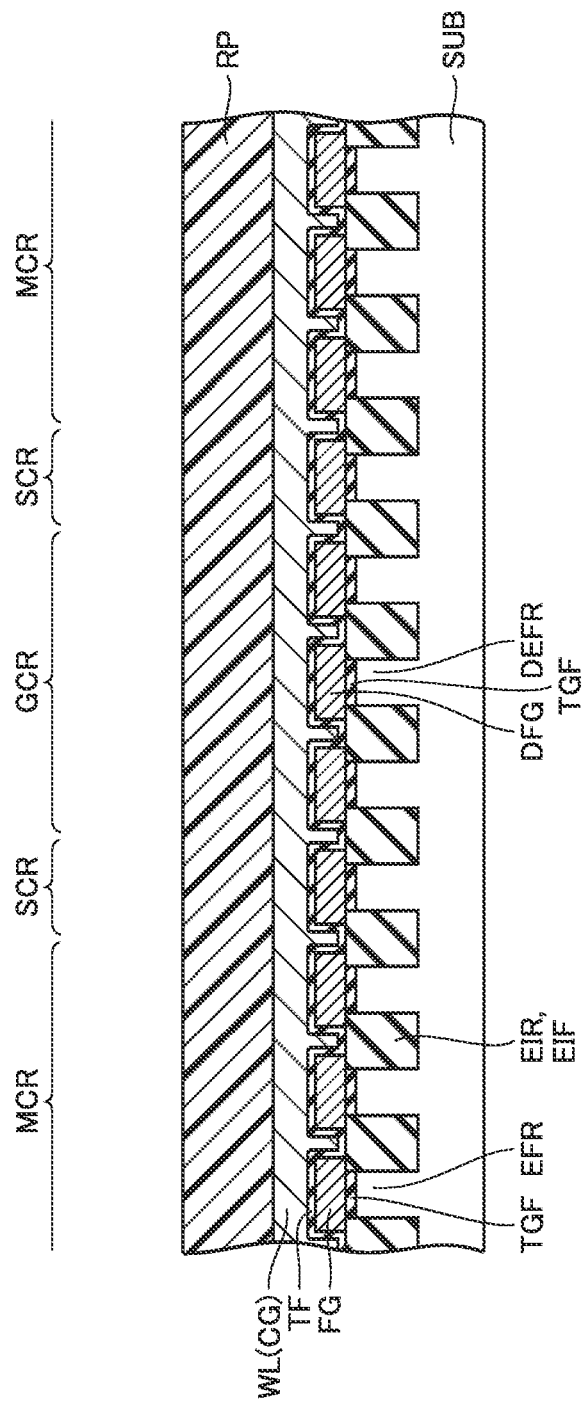
FIG. 13 is a cross-sectional view along the line XIII-XIII shown in FIG. 12 in the first embodiment.
Figure 14:
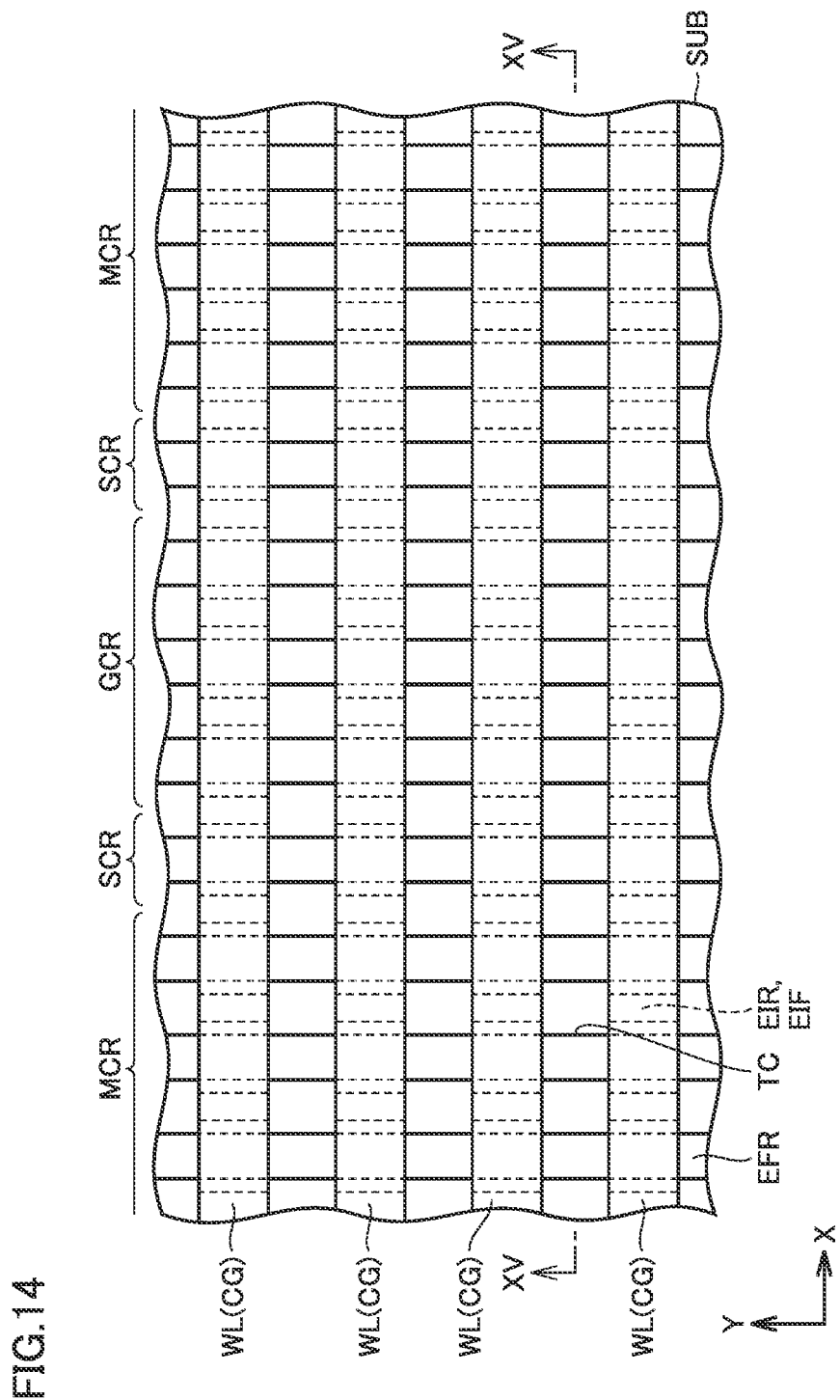
FIG. 14 is a plan view showing a step performed after the step shown in FIGS. 12 and 13 in the first embodiment.
Figure 15:
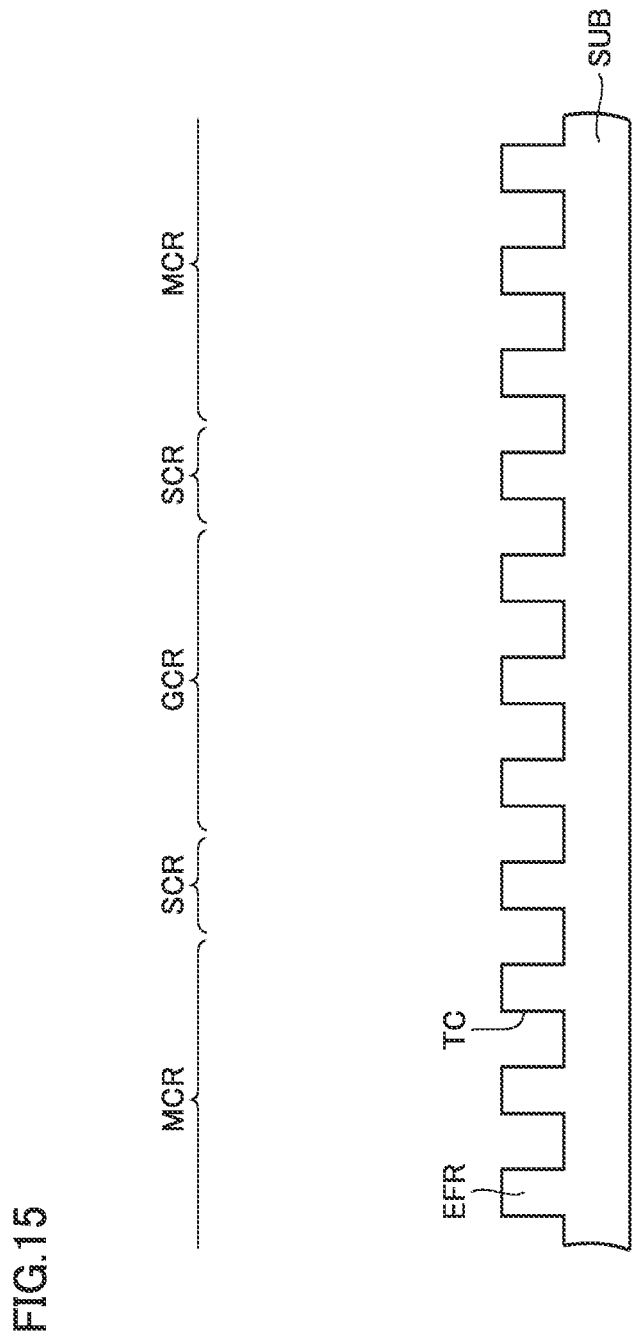
FIG. 15 is a cross-sectional view along the line XV-XV shown in FIG. 14 in the first embodiment.

Then, as shown in FIGS. 12 and 13, a resist pattern RP exposing element formation region EFR and element isolation insulating film EIF located in a region where a source interconnection including a source region is to be formed and covering other regions is formed. Then, through an etching process with resist pattern RP serving as an etching mask, as shown in FIGS. 14 and 15, exposed element isolation insulating film EIF is removed to expose a sidewall and the like of isolation trench TC. Thereafter, resist pattern RP is removed.

Figure 16:
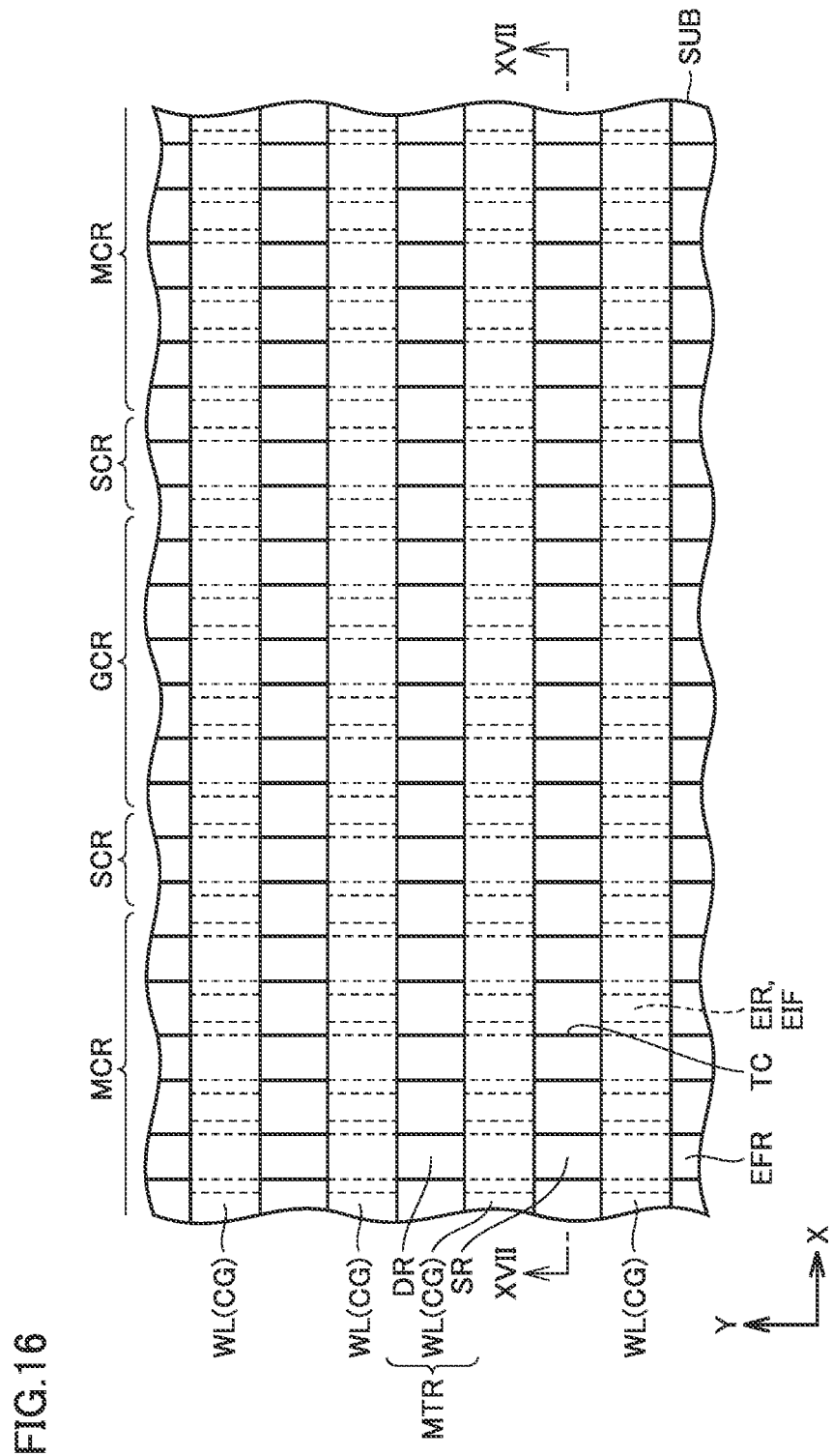
FIG. 16 is a plan view showing a step performed after the step shown in FIGS. 14 and 15 in the first embodiment.
Figure 17:
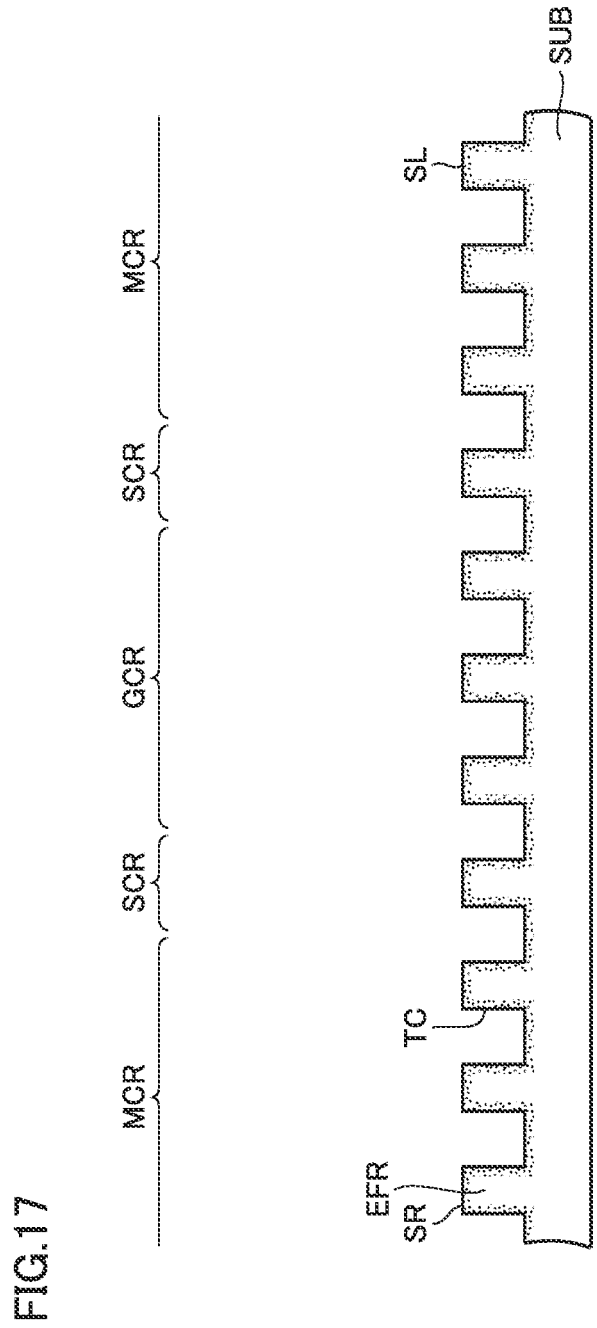
FIG. 17 is a cross-sectional view along the line XVII-XVII shown in FIG. 16 in the first embodiment.

Then, as shown in FIGS. 16 and 17, with word line WL serving as an implantation mask, for example, an impurity at a high concentration such as arsenic (As) is implanted. Thus, arsenic or the like is introduced into a portion of each of element formation region EFR and the sidewall and the like of isolation trench TC exposed on one side with respect to word line WL so that a source interconnection SL including source region SR is formed. Arsenic or the like is introduced into a portion of each element formation region EFR exposed on the other side with respect to word line WL so that drain region DR is formed. Thus, memory cell transistor MTR including control gate electrode CG, floating gate electrode FG, source region SR, and drain region DR is formed.

Figure 18:
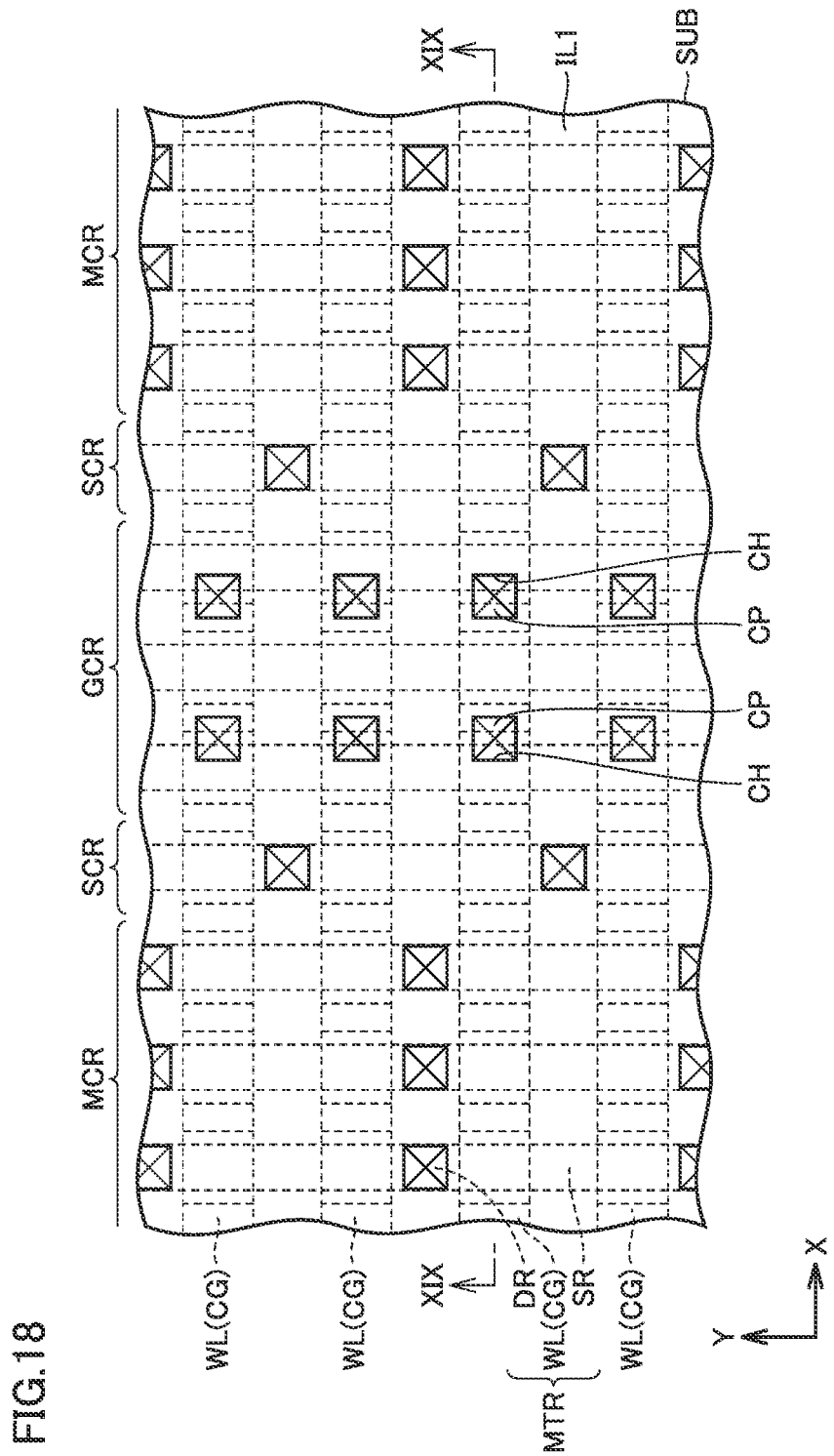
FIG. 18 is a plan view showing a step performed after the step shown in FIGS. 16 and 17 in the first embodiment.
Figure 19:
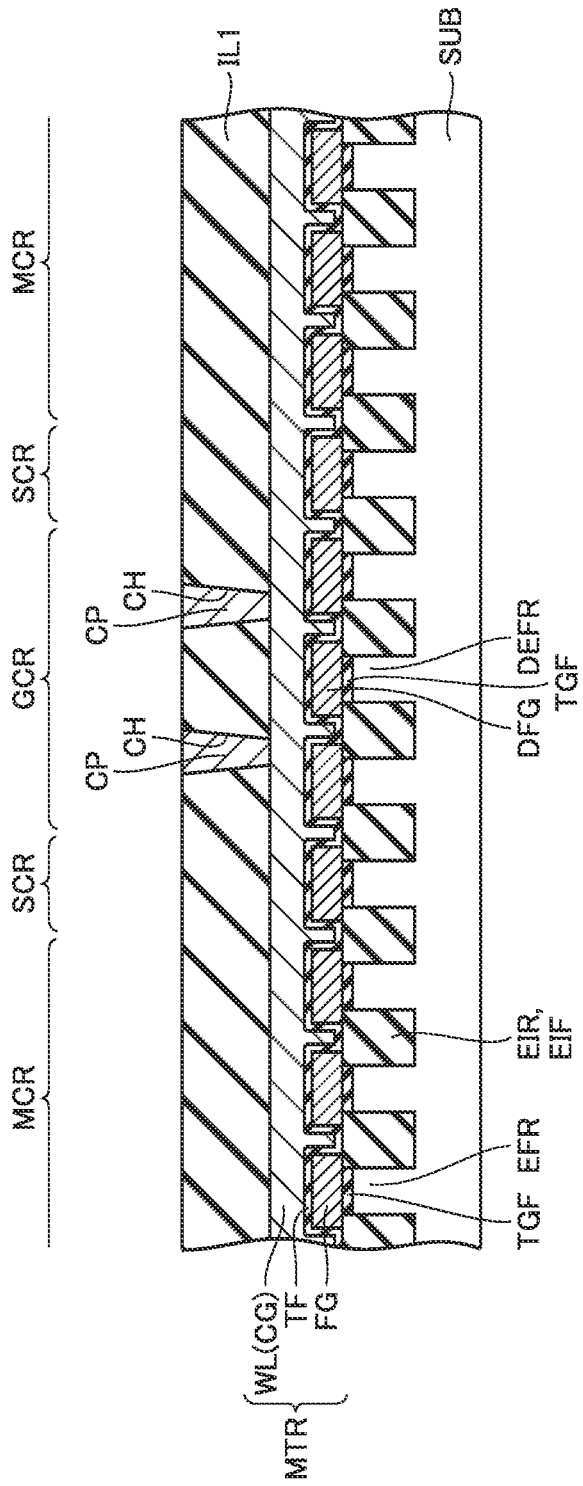
FIG. 19 is a cross-sectional view along the line XIX-XIX shown in FIG. 18 in the first embodiment.

Then, as shown in FIGS. 18 and 19, first interlayer insulating film IL1 formed from an undoped oxide film is formed, for example, with chemical vapor deposition so as to cover memory cell transistor MTR. Then, through a prescribed photolithography process and an etching process on first interlayer insulating film IL1, contact hole CH exposing word line WL is formed in gate contact region GCR. Here, contact hole CH is formed to partially be superimposed on element formation region EFR in a two-dimensional view. Then, contact plug CP is formed in contact hole CH. Thus, contact plug CP is partially superimposed on element formation region EFR in a two-dimensional view.

Figure 20:
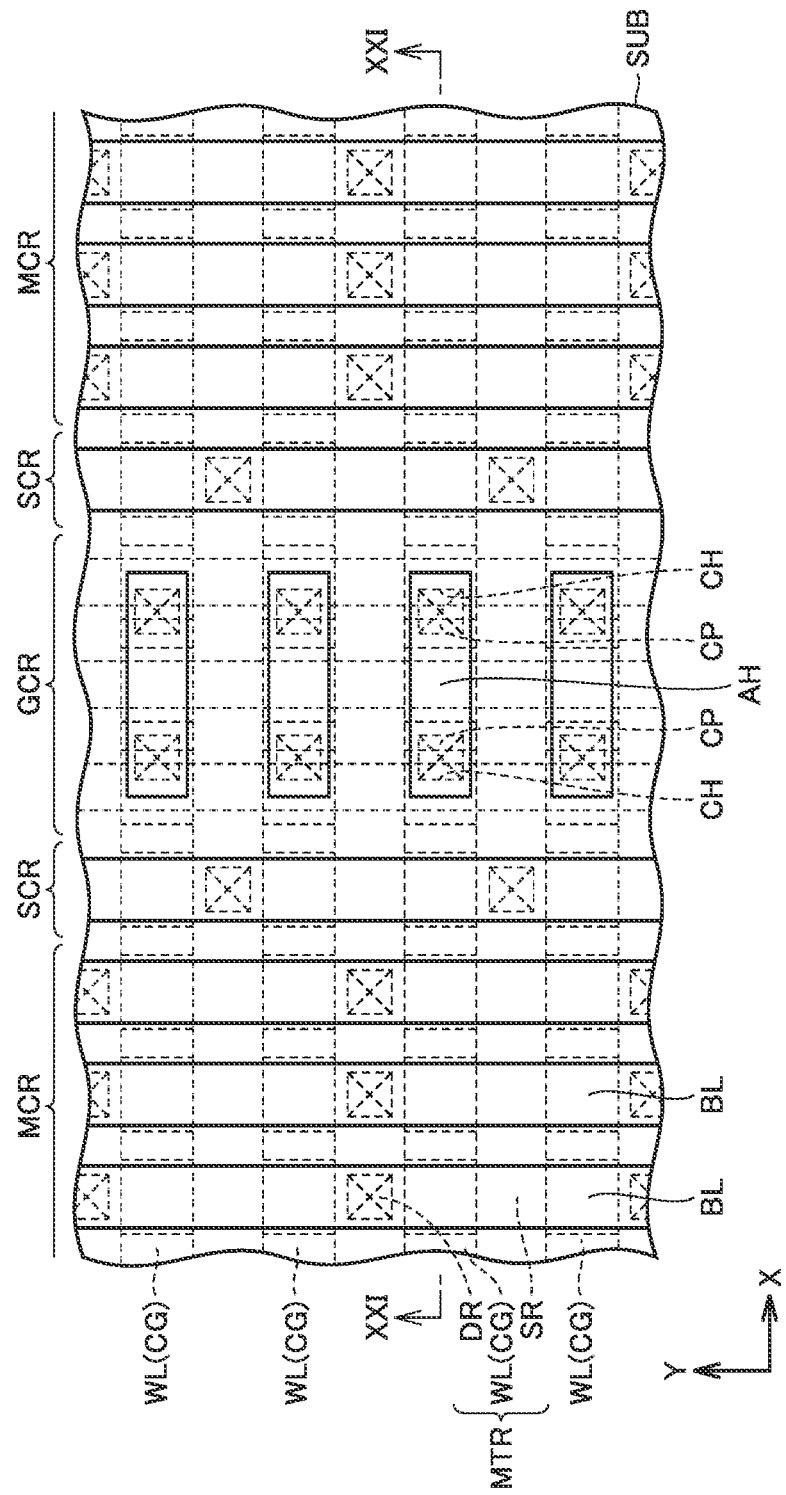
FIG. 20 is a plan view showing a step performed after the step shown in FIGS. 18 and 19 in the first embodiment.
Figure 21:
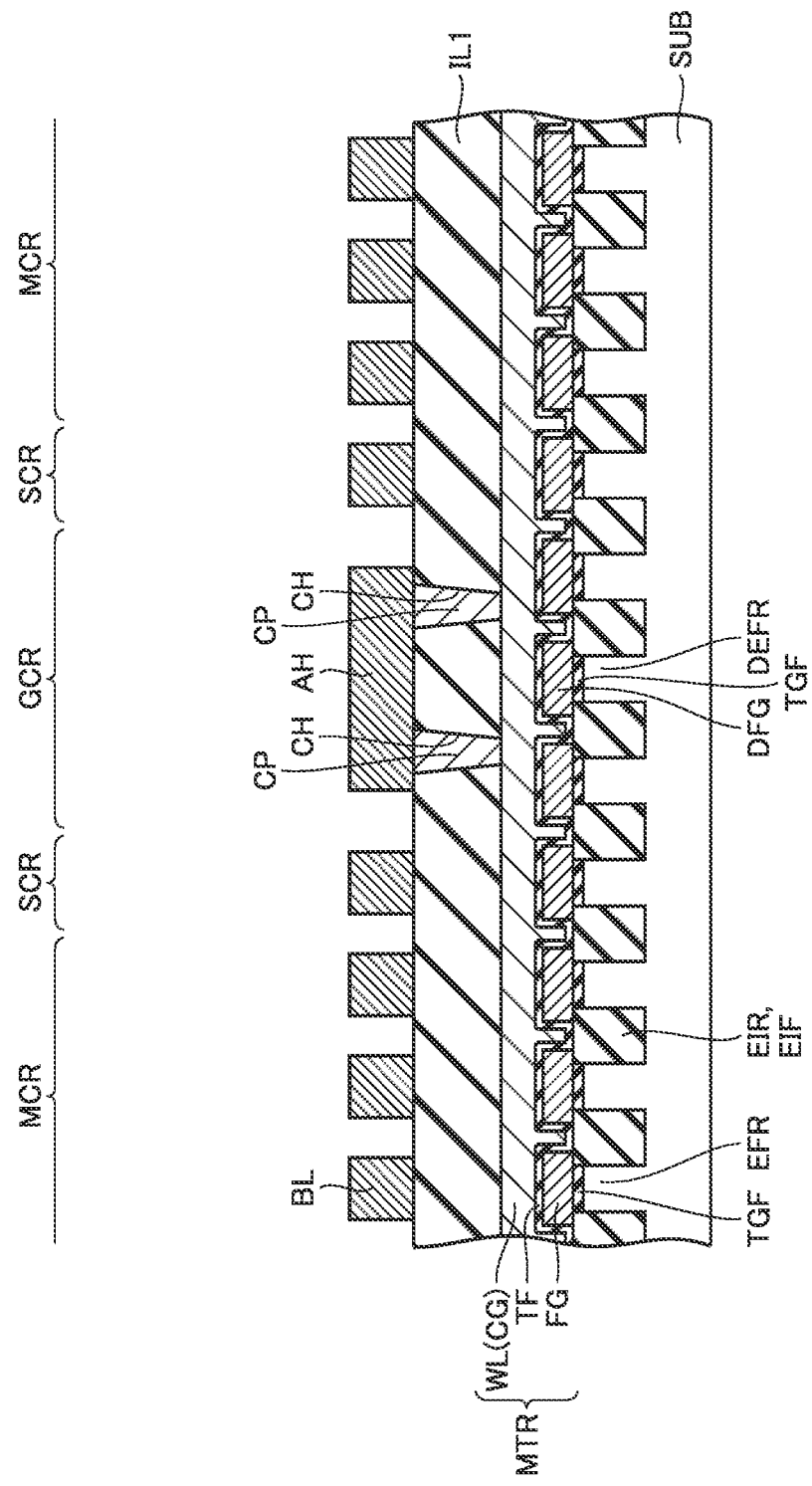
FIG. 21 is a cross-sectional view along the line XXI-XXI shown in FIG. 20 in the first embodiment.

Then, an aluminum film (not shown) is formed, for example, with sputtering so as to cover first interlayer insulating film IL1. Then, through a prescribed photolithography process and an etching process on that aluminum film, as shown in FIGS. 20 and 21, bit line BL is formed in memory cell array region MCR. Bit line BL is formed to substantially be orthogonal to word line WL. Interconnection AH electrically connected to contact plug CP is formed in gate contact region GCR.

Figure 22:
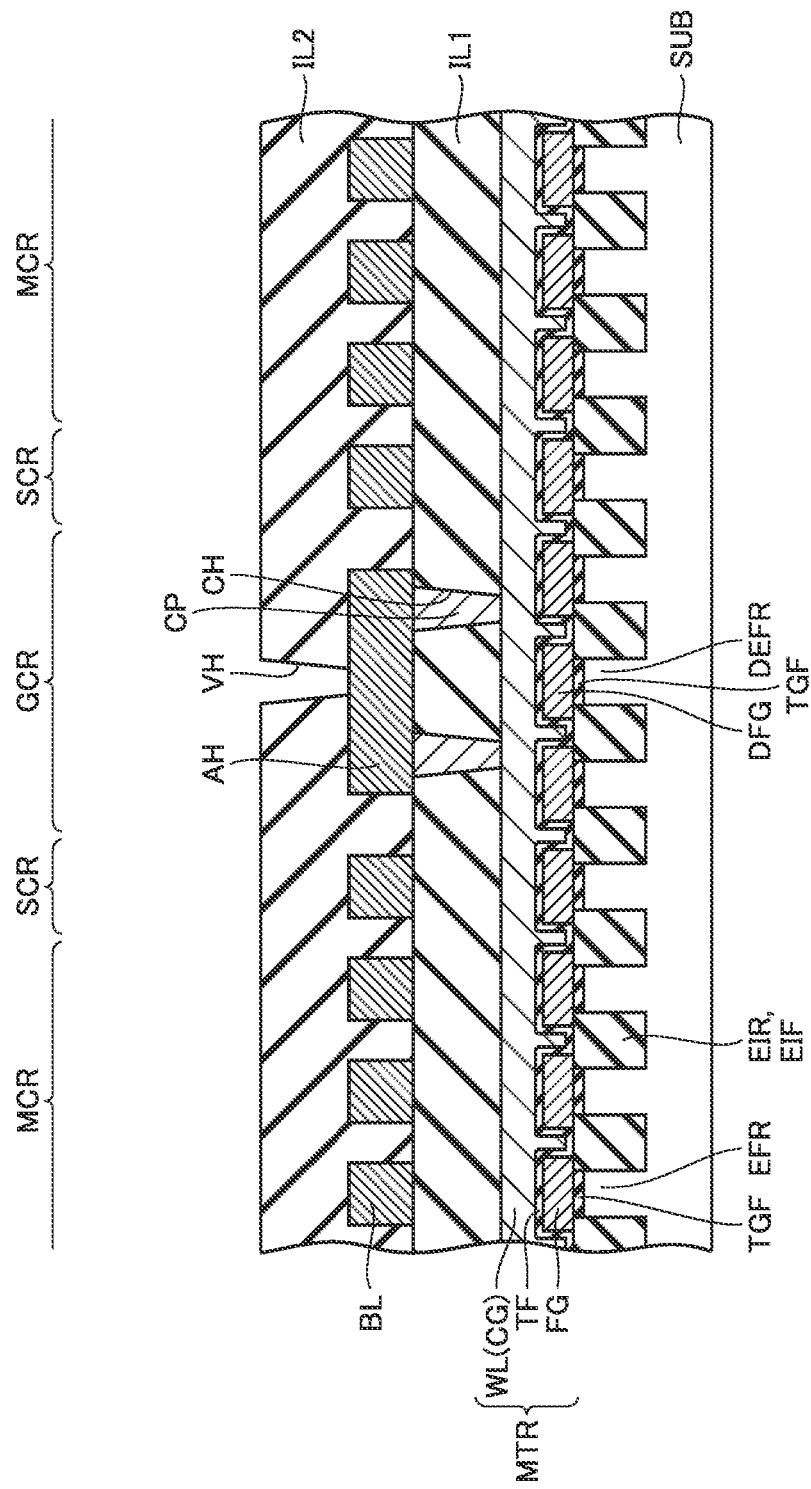
FIG. 22 is a cross-sectional view showing a step performed after the step shown in FIGS. 20 and 21 in the first embodiment.

Then, as shown in FIG. 22, second interlayer insulating film IL2 formed from an undoped oxide film is formed, for example, with chemical vapor deposition so as to cover bit line BL and interconnection AH. Then, through a prescribed photolithography process and an etching process on second interlayer insulating film IL2, via hole VH is formed. Then, via VA (see FIG. 24) is formed in via hole VH. Then, an aluminum film (not shown) is formed with sputtering so as to cover second interlayer insulating film IL2.

Figure 23:
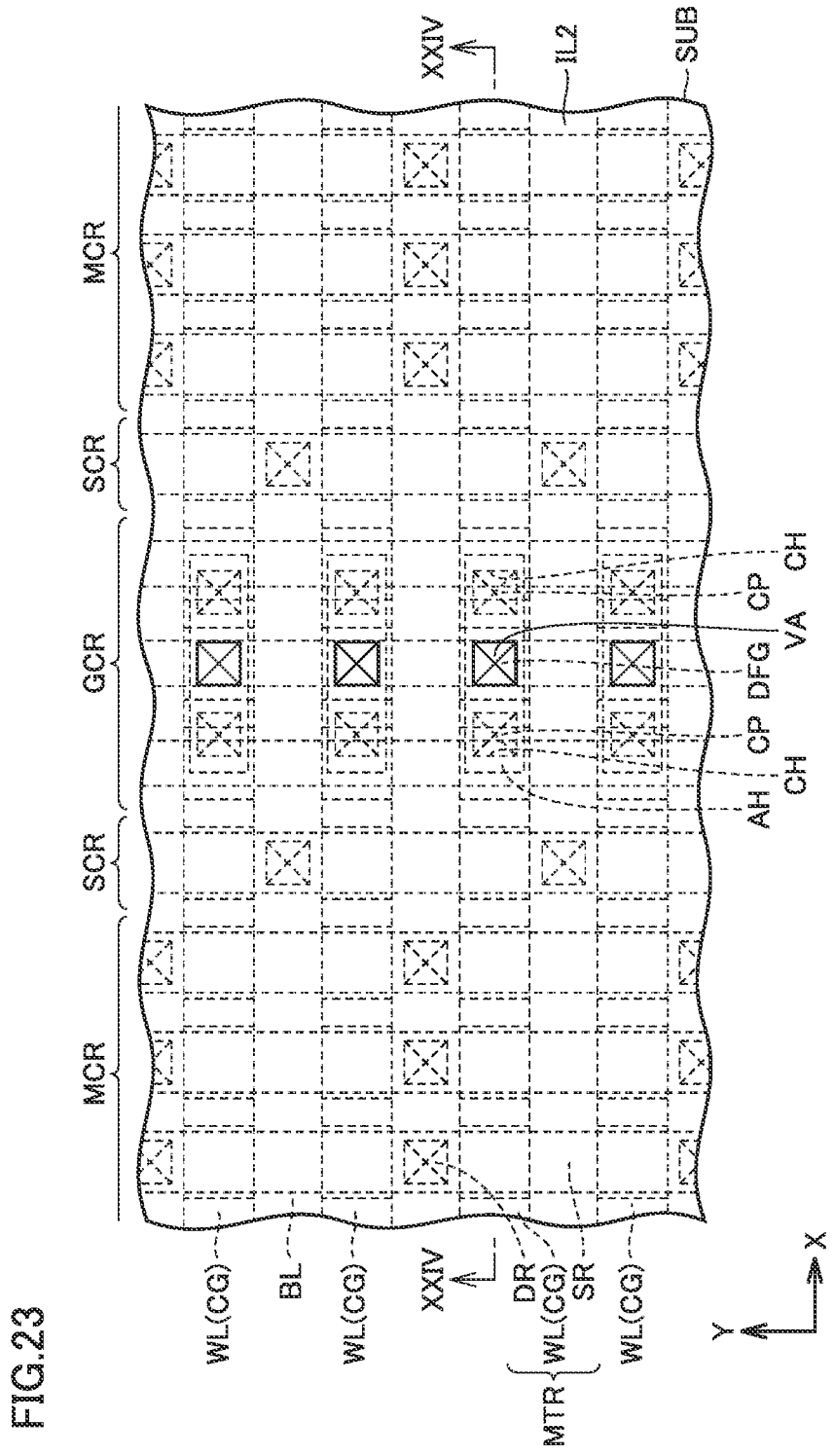
FIG. 23 is a plan view showing a step performed after the step shown in FIG. 22 in the first embodiment.
Figure 24:
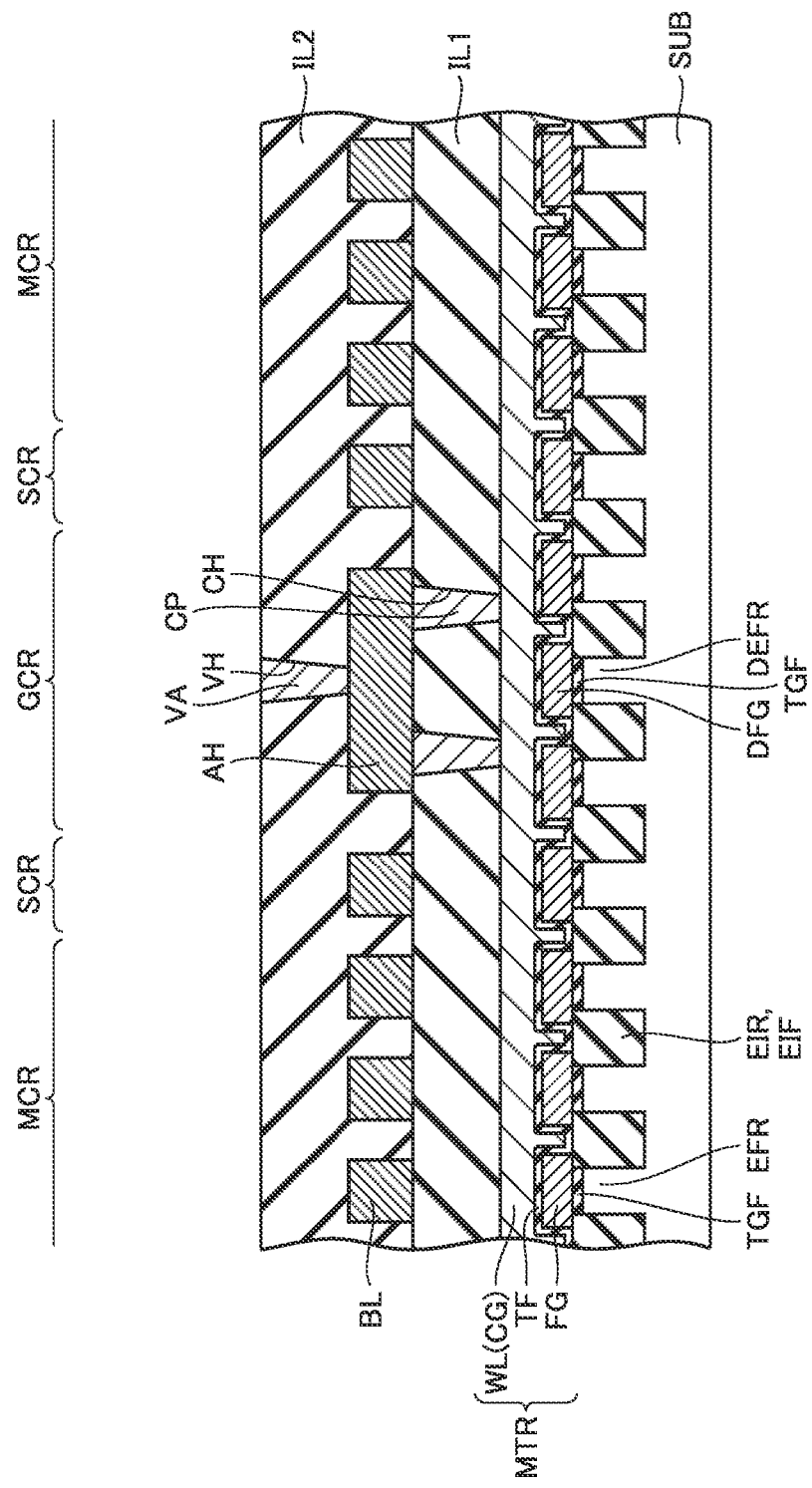
FIG. 24 is a cross-sectional view along the line XXIV-XXIV shown in FIG. 23 in the first embodiment.

Then, through a prescribed photolithography process and an etching process on the aluminum film, as shown in FIGS. 23 and 24, word line shunt WSL electrically connected to via VA is formed. Word line shunt WSL extends in the X direction. Thus, the main portion of the semiconductor device including the non-volatile memory is completed.

In the semiconductor device including the non-volatile memory described above, with a pattern in conformity with a pattern of element isolation region EIR formed in memory cell array region MCR, element isolation region EIR is formed in gate contact region GCR. Thus, a defective condition of a non-volatile memory cell resulting from charge up at the time of via opening or the like can be overcome, which will be described in comparison with a semiconductor device according to a comparative example.

Figure 25:
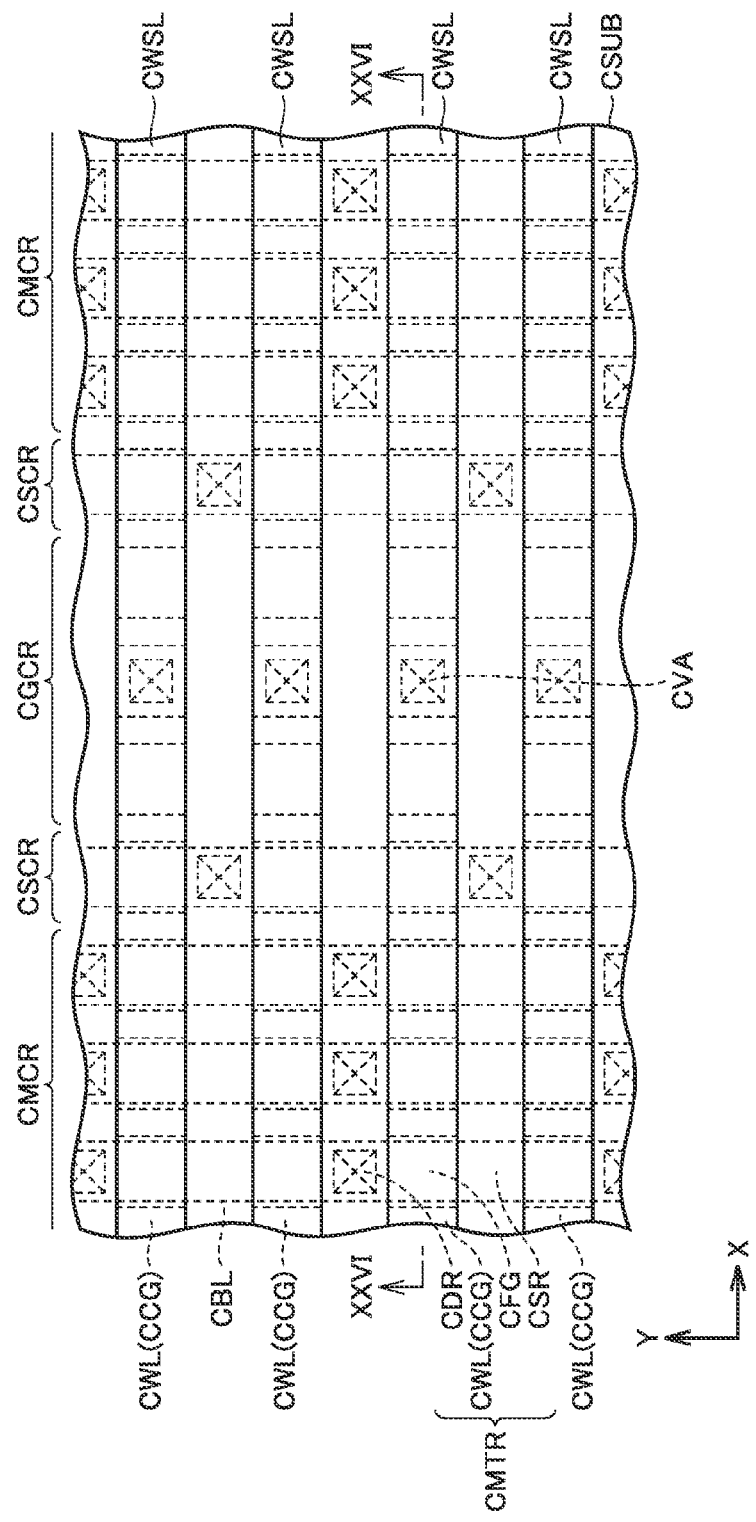
FIG. 25 is a plan view showing a layout of a semiconductor device according to a comparative example.
Figure 26:
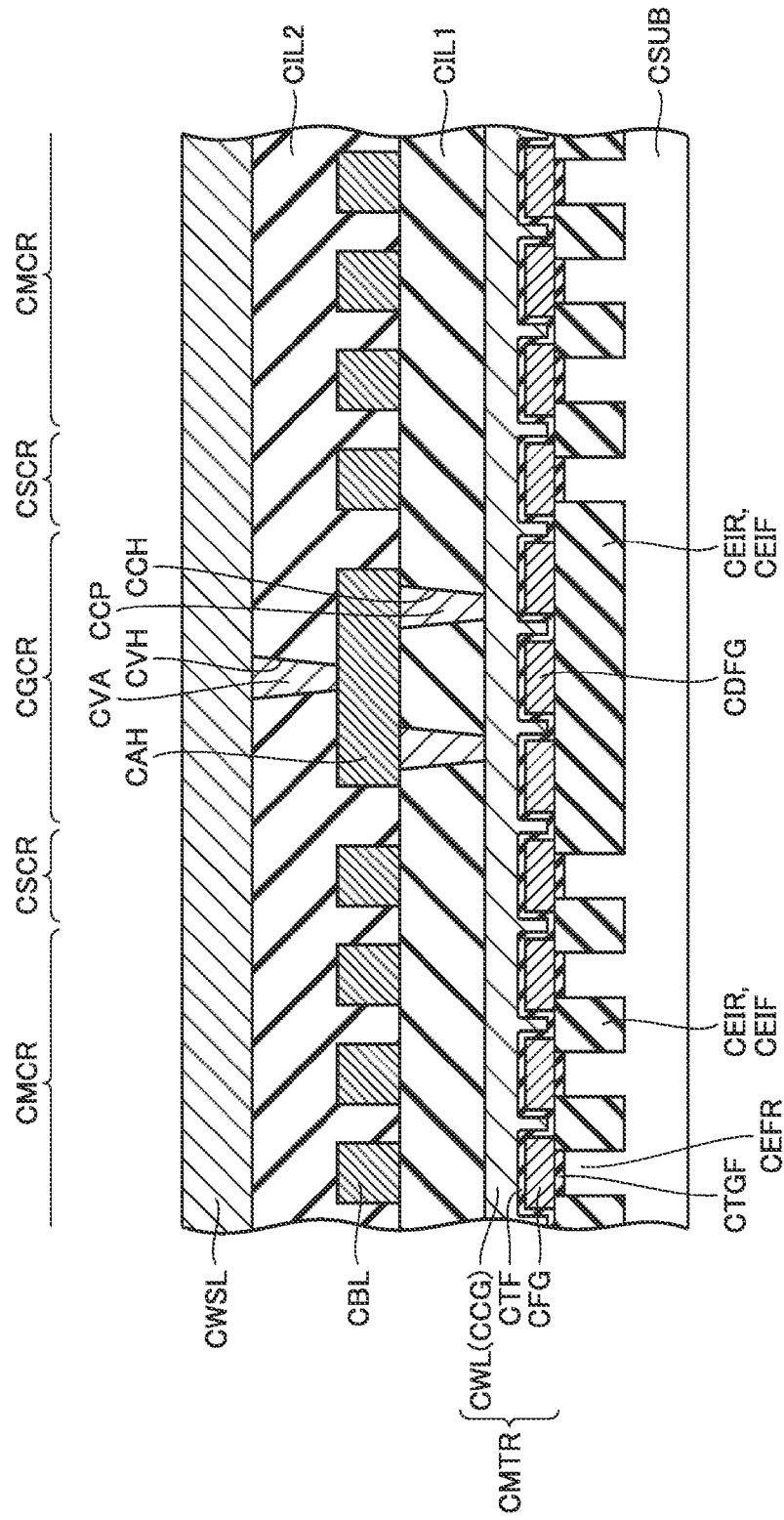
FIG. 26 is a cross-sectional view along the line XXVI-XXVI shown in FIG. 25.

As shown in FIGS. 25 and 26, in the semiconductor device according to the comparative example, a memory cell array region CMCR, a gate contact region CGCR, and a source contact region CSCR are defined in a surface of a semiconductor substrate CSUB. In memory cell array region CMCR and source contact region CSCR, an element formation region CEFR is defined by an element isolation region CEIR. In gate contact region CGCR, an element isolation region CEIR is formed over the entire gate contact region CGCR.

Since the construction is otherwise substantially the same as in the semiconductor device shown in FIGS. 1 and 2, brief description will be given.

In element formation region CEFR in memory cell array region CMCR and source contact region CSCR, a memory cell transistor CMTR including a floating gate electrode CFG, an ONO film CTF, a control gate electrode CCG, a source region CSR, and a drain region CDR is formed. In gate contact region GCR, a dummy floating gate electrode CDFG is formed.

A first interlayer insulating film CIL1 is formed to cover memory cell transistor CMTR. In gate contact region GCR, a contact plug CCP is formed in a contact hole CCH reaching a word line CWL. On a surface of first interlayer insulating film CIL1, an interconnection CAH electrically connected to contact plug CCP and a bit line CBL are formed.

A second interlayer insulating film CIL2 is formed to cover bit line CBL and interconnection CAH. In a portion of second interlayer insulating film CIL2 located in gate contact region CGCR, a via hole CVH reaching interconnection CAH is formed. A via CVA is formed in via hole CVH. On a surface of second interlayer insulating film CIL2, a word line shunt CWSL is formed.

Figure 27:
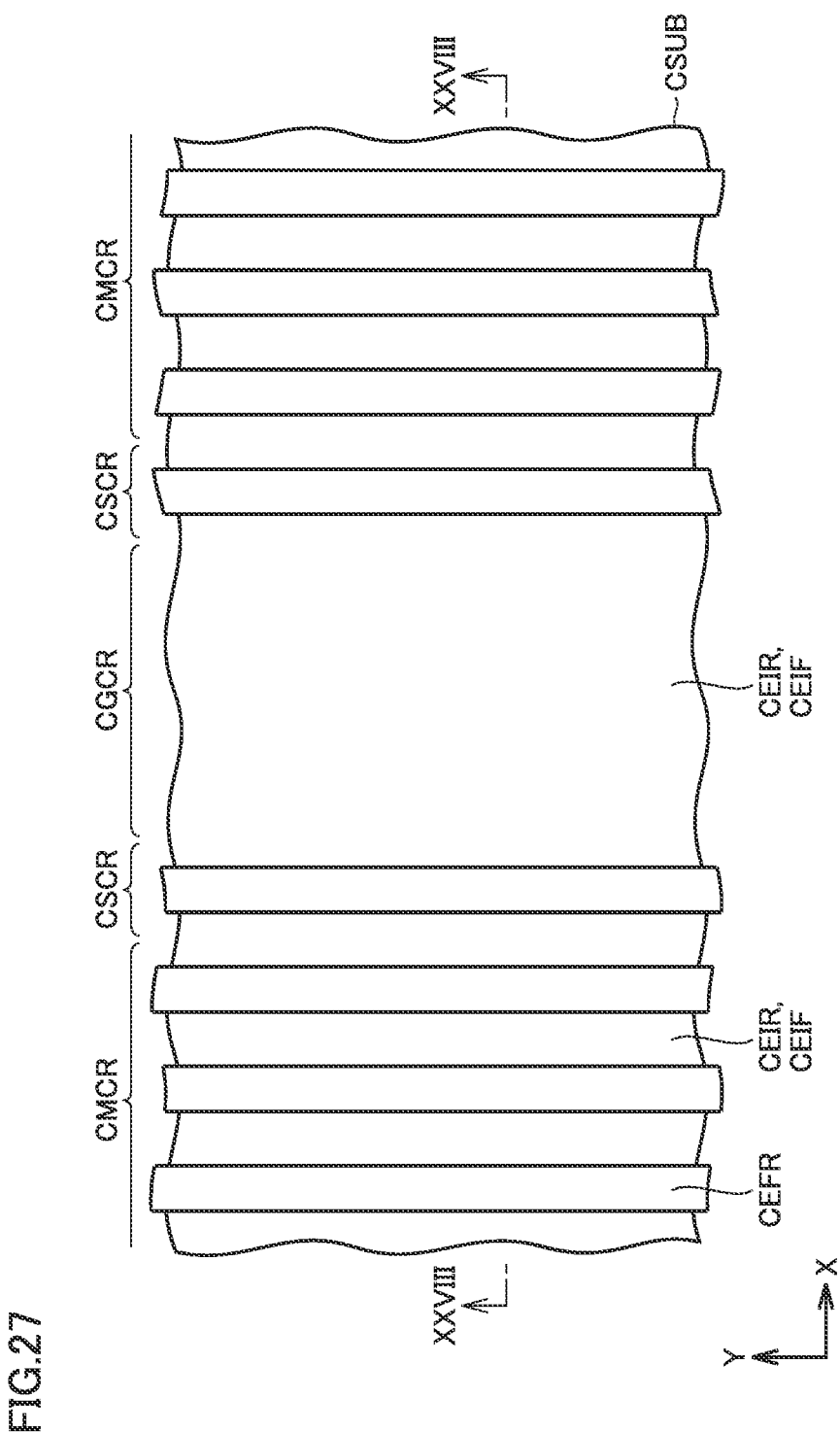
FIG. 27 is a plan view showing one step in a method of manufacturing a semiconductor device according to the comparative example.
Figure 28:
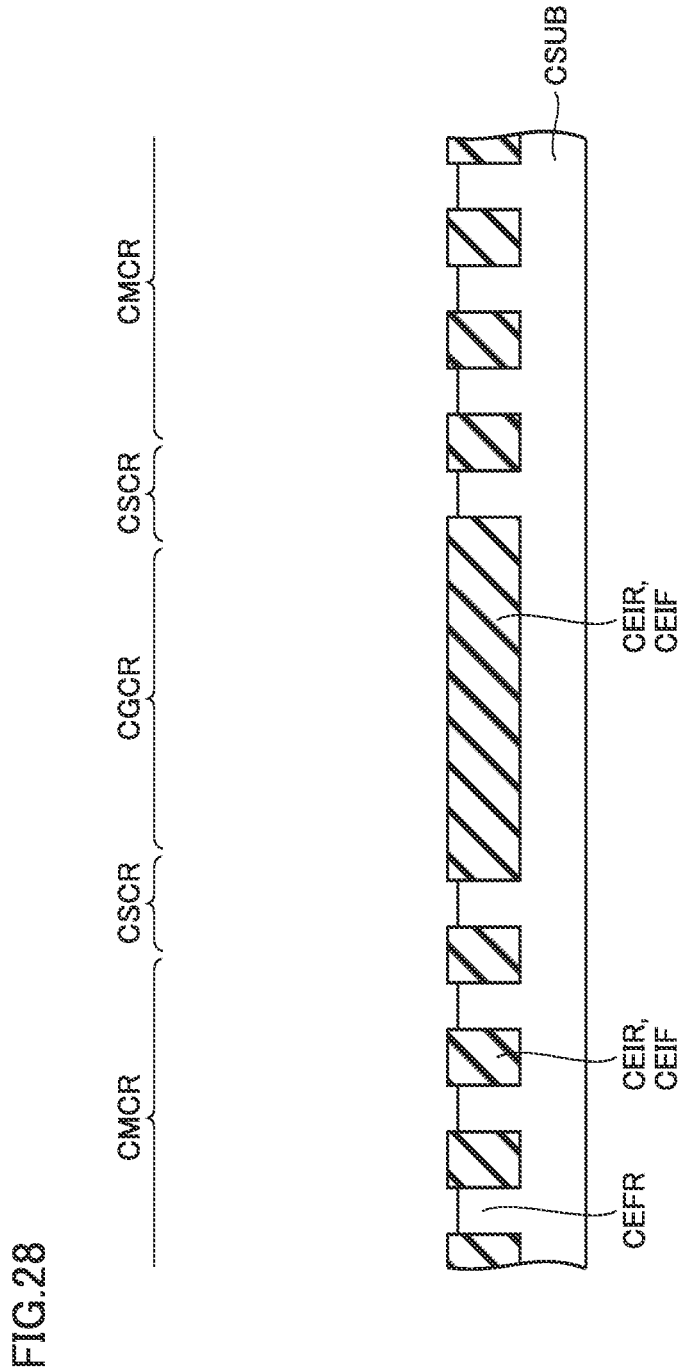
FIG. 28 is a cross-sectional view along the line XXVIII-XXVIII shown in FIG. 27.

A method of manufacturing the semiconductor device according to the comparative example will now be described. Initially, as shown in FIGS. 27 and 28, element isolation region CEIR is formed by forming an isolation trench in a surface of semiconductor substrate CSUB and filling the isolation trench with an element isolation insulating film CEIF. Element isolation region CEIR defines element formation region CEFR. In gate contact region CGCR, element isolation region CEIR is formed over the entire gate contact region CGCR.

Figure 29:
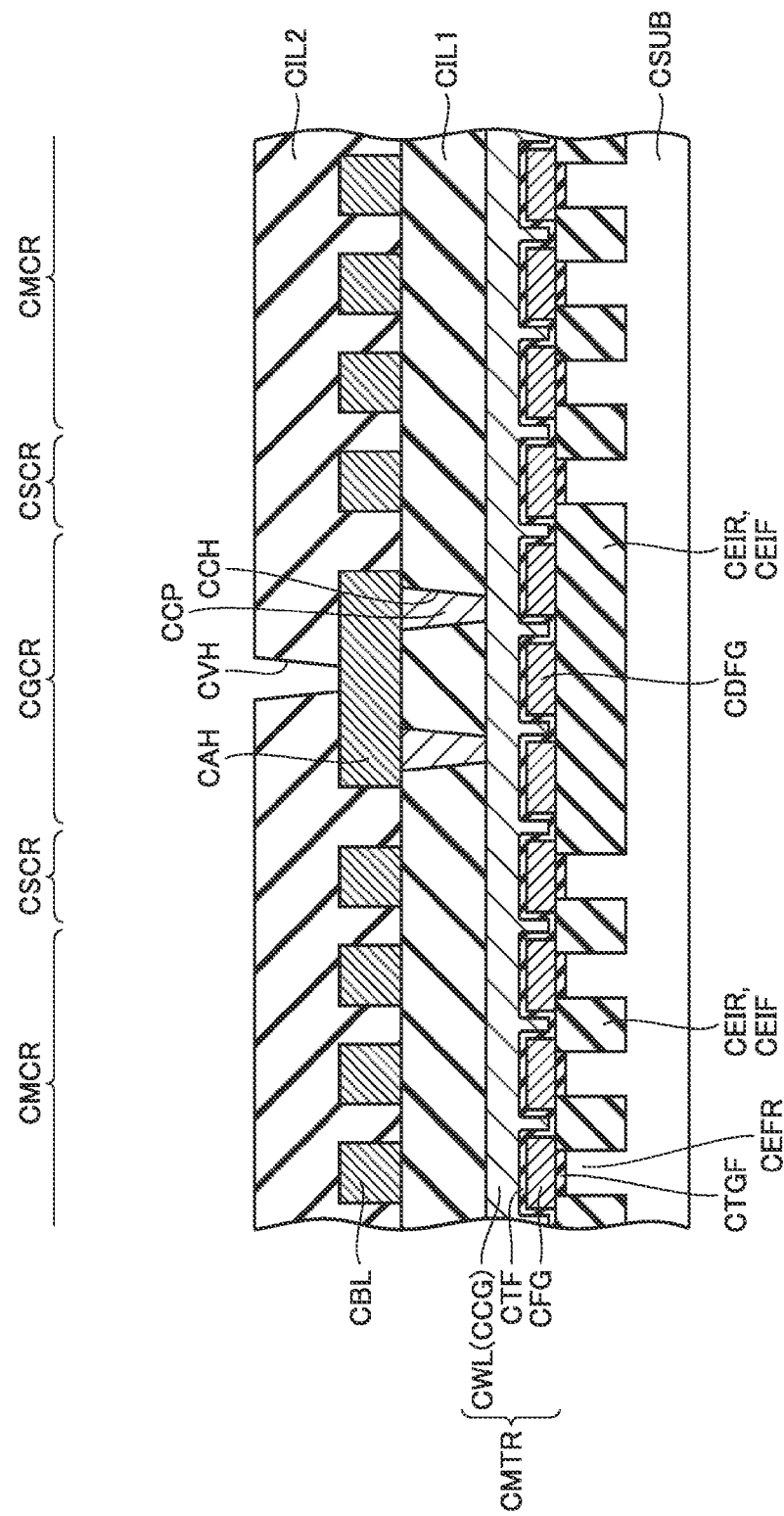
FIG. 29 is a cross-sectional view showing a step performed after the step shown in FIGS. 27 and 28.

Then, after the steps substantially the same as the steps shown in FIGS. 5 to 21, as shown in FIG. 29, second interlayer insulating film CIL2 is formed to cover bit line CBL and interconnection CAH. Then, through a prescribed photolithography process and an etching process on second interlayer insulating film CIL2, via hole CVH exposing interconnection CAH is formed in a portion of second interlayer insulating film CIL2 located in gate contact region CGCR. Thereafter, via CVA is formed in via hole CVH and word line shunt CWSL is formed. Thus, the main portion of the semiconductor device according to the comparative example is completed.

A potential of a floating gate electrode will now be described. Initially, generalization will be described. In a non-volatile semiconductor memory having a floating gate electrode and a control gate electrode, a threshold voltage applied to the control gate electrode for allowing a current to flow between a source and a drain varies depending on whether or not charges are accumulated in the floating gate electrode.

Figure 30:
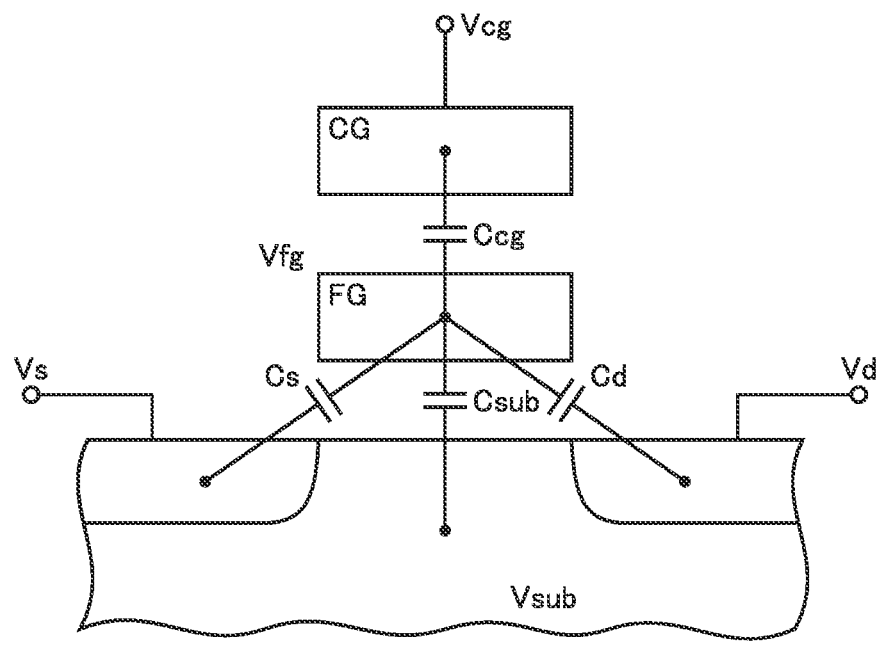
FIG. 30 is a schematic diagram for illustrating a capacitance in connection with a floating gate electrode in the first embodiment.

Here, as shown in FIG. 30, Csub represents a capacitance between floating gate electrode FG and semiconductor substrate SUB and Ccg represents a capacitance between floating gate electrode FG and control gate electrode CG. Cs represents a capacitance between floating gate electrode FG and a source region and Cd represents a capacitance between floating gate electrode FG and a drain region. Vfg represents a potential of floating gate electrode FG, Vcg represents a potential of control gate electrode CG, and Vsub represents a potential of the semiconductor substrate.

Then, charges Q in floating gate electrode FG are expressed in the following expression.

$$Q = Ccg \times (Vcg - Vfg) + Cd \times (Vd - Vfg) + Cs \times (Vs - Vfg) + Csub \times (Vsub - Vfg)$$

By solving this relational expression for potential Vfg of floating gate electrode FG by using two relational expressions below $$Ctotal = Ccg + Cd + Cs + Csub$$

$$Ccg > Cd + Cs + Csub,$$

the following relational expression is obtained.

$$Vfg \approx Q/Ctotal + Ccg \times Vcg/Ctotal \quad \text{(Expression 1)}$$

As above, potential (voltage) Vcg to be applied to control gate electrode CG in order to turn on memory cell transistor MTR varies depending on whether or not charges are accumulated in floating gate electrode FG. On the other hand, voltage Vfg to be applied to floating gate electrode FG in order to turn on memory cell transistor MTR can be concluded as not varying regardless of whether or not charges are accumulated, in consideration of the fact that the floating gate electrode corresponds to a gate electrode of a common MOS transistor.

Vthi represents a voltage to be applied to control gate electrode CG in order to initially turn on memory cell transistor MTR while no charges are accumulated in floating gate electrode FG (Q=0). Then, the following relational expression is obtained from the Expression 1.

$$Vfg = Ccg \times Vthi / Ctotal \quad \text{(Expression 2)}$$

Vth represents voltage (potential) Vcg to be applied to control gate electrode CG in order to turn on memory cell transistor MTR while charges are accumulated in floating gate electrode FG (Q>0). Then, the following relational expression is obtained from the Expression 1.

$$Vfg = Q/Ctotal + Ccg \times Vth / Ctotal \quad \text{(Expression 3)}$$

Since voltage Vfg to be applied to floating gate electrode FG does not vary regardless of whether or not charges are accumulated, the following relational expression is obtained.

$$Cg \times Vthi / Ctotal = Q/Ctotal + Ccg \times Vth / Ctotal$$

This is solved for Q and the following relational expression is obtained based on relation with a total capacitance Ctotal.

$$Vfg = Cr(Vcg - \Delta Vth) \quad \text{(Expression 4)}$$

Here, a condition of Cr=Ccg/Ctotal and ΔVth=Vth−Vthi is satisfied. Cr represents a coupling ratio. ΔVth represents fluctuation in threshold voltage involved with whether or not charges (electrons) are present in the floating gate electrode.

Figure 31:
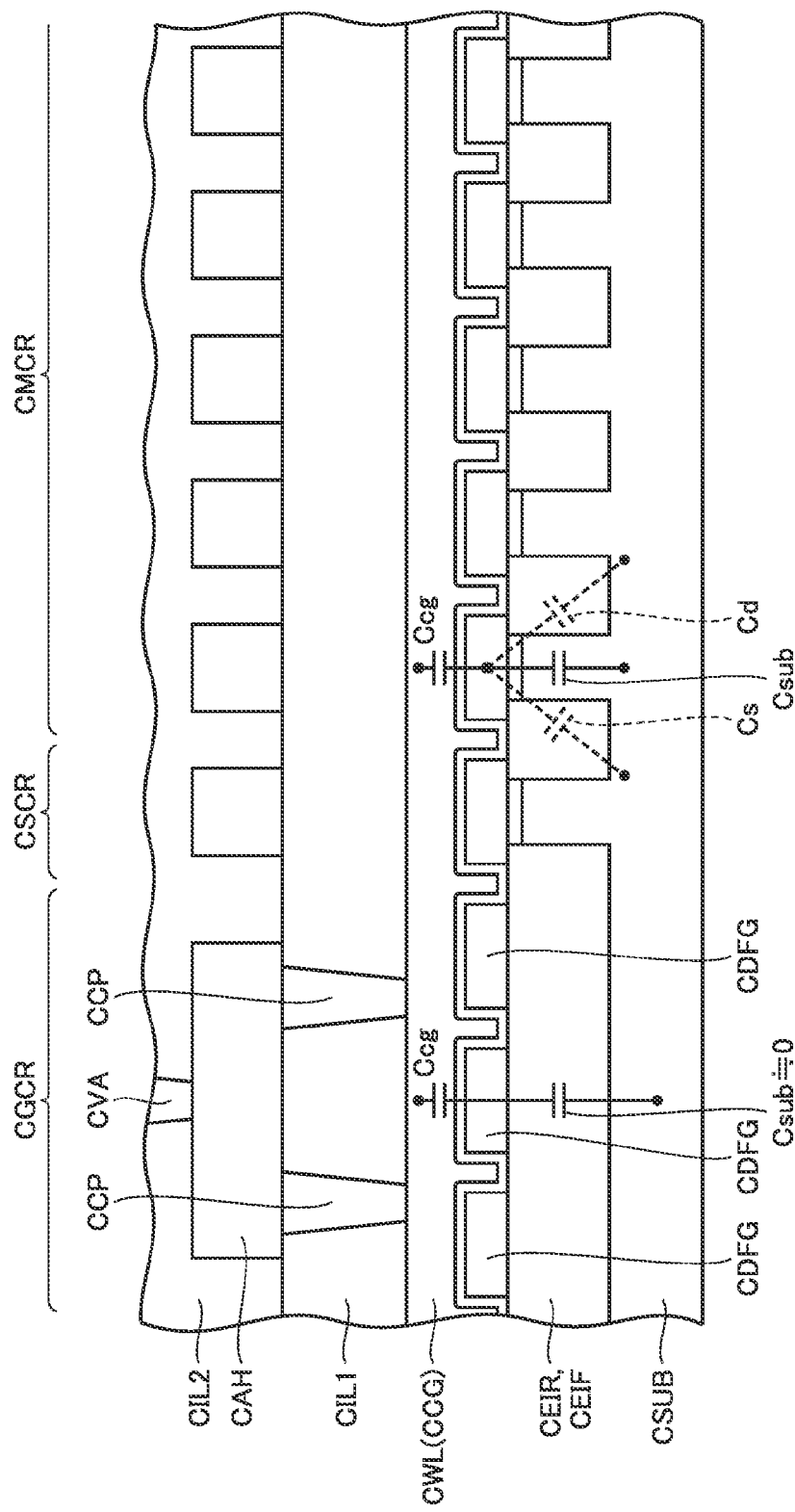
FIG. 31 is a first schematic cross-sectional view for illustrating a potential of a floating gate electrode in the semiconductor device according to the comparative example.

A potential of floating gate electrode CFG formed in memory cell array region CMCR and a potential of dummy floating gate electrode CDFG formed in gate contact region CGCR will now be described with reference to FIG. 31.

Initially, it has been known that a value for coupling ratio Cr of floating gate electrode CFG is around 0.7. On the other hand, in dummy floating gate electrode CDFG, since the source region and the drain region have not been formed, a condition of capacitance Cs=capacitance Cd=0 is satisfied. Since dummy floating gate electrode CDFG is arranged on element isolation insulating film CEIF formed over the entire gate contact region CGCR, a condition of capacitance Csub 0 is satisfied. Thus, a value for coupling ratio Cr of dummy floating gate electrode CDFG is close to 1.

This means that, from the Expression 4, with respect to potential Vcg of control gate electrode CCG, a potential of dummy floating gate electrode CDFG is different from a potential of floating gate electrode CFG. For example, when control gate electrode CCG is biased due to charge up caused by plasma in a process for manufacturing a semiconductor device, a potential of dummy floating gate electrode CDFG will be different from a potential of floating gate electrode CFG.

Figure 32:
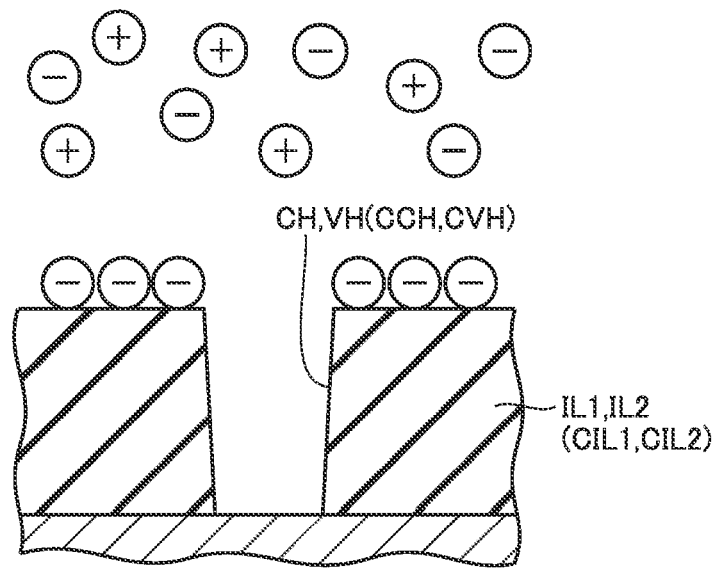
FIG. 32 is a first partial cross-sectional view showing one example of a step of exposure to plasma for illustrating a potential of the floating gate electrode in the first embodiment.
Figure 33:
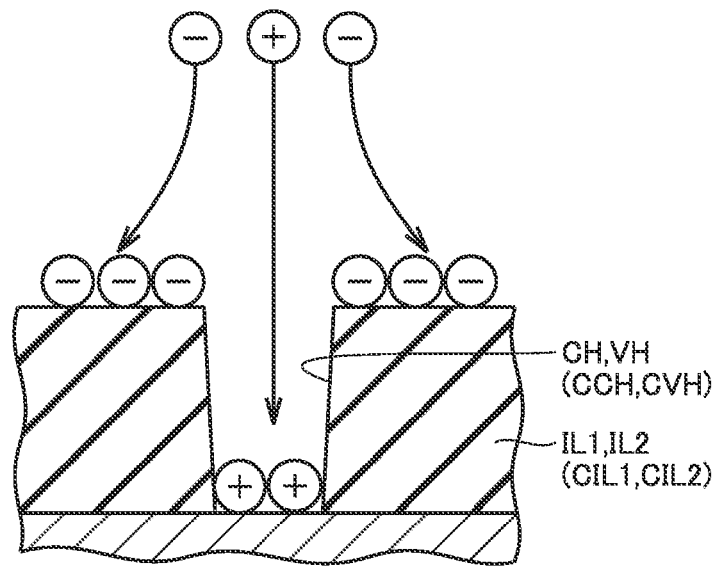
FIG. 33 is a second partial cross-sectional view showing one example of the step of exposure to plasma for illustrating a potential of the floating gate electrode in the first embodiment.

A step of exposure to plasma includes, for example, a step of forming a contact hole or a step of forming a via hole. In these steps, an insulating film (first interlayer insulating film CIL1 and second interlayer insulating film CIL2) is subjected to an etching process. In this case, as shown in FIG. 32, in forming a contact hole or a via hole, a surface of the insulating film exposed to plasma is charged up negatively due to a difference in mean free path between electrons and positive ions. Then, likeliness of electrons being trapped at the surface of the insulating film (a masking effect) makes it difficult for electrons to reach the bottom of the contact hole or the via hole as shown in FIG. 33, and mainly positive ions will reach the bottom.

Therefore, after contact holes CCH and CH are formed, a process in a subsequent step is performed while the bottom of contact holes CCH and CH is positively charged. After via holes CVH and VH are formed, a process in a subsequent step is performed while the bottom of via holes CVH and VH is positively charged.

After contact holes CCH and CH are formed and until bit lines CBL and BL are formed from an aluminum film, there is a step in which a process is performed at a relatively high temperature and charges accumulated at the bottom of contact holes CCH and CH tend to escape. On the other hand, in a manufacturing process after via holes CVH and VH are formed, bit lines CBL and BL have already been formed. Therefore, a process should be performed at a low temperature (around 400° C. at the maximum). Therefore, charges accumulated at the bottom of via holes CVH and VH are less likely to escape.

Vias CVA and VA formed in via holes CVH and VH are electrically connected to word line CWL (control gate electrode CCG) through interconnections CAH and AH and contact plugs CCP and CP. Therefore, positive charges accumulated at the bottom of via holes CVH and VH raise a potential of word lines CWL and WL.

In the semiconductor device according to the comparative example, as potential Vcg of word line CWL (control gate electrode CCG) increases, according to the Expression 4, the potential of dummy floating gate electrode CDFG will be higher than the potential of floating gate electrode CFG. Namely, a subsequent process is performed while dummy floating gate electrode DFG is positively charged.

As a wafer process (front-end process) is completed, a wafer test is conducted. In the wafer test, not only a test of an operation such as writing or erasure into or from a nonvolatile memory but also a baking process are performed. The baking process is performed, for example, under a temperature condition around 250° C. Here, for example, movable ions (positive ions) of sodium or the like in first interlayer insulating film CIL1 tend to migrate owing to heat.

Figure 34:
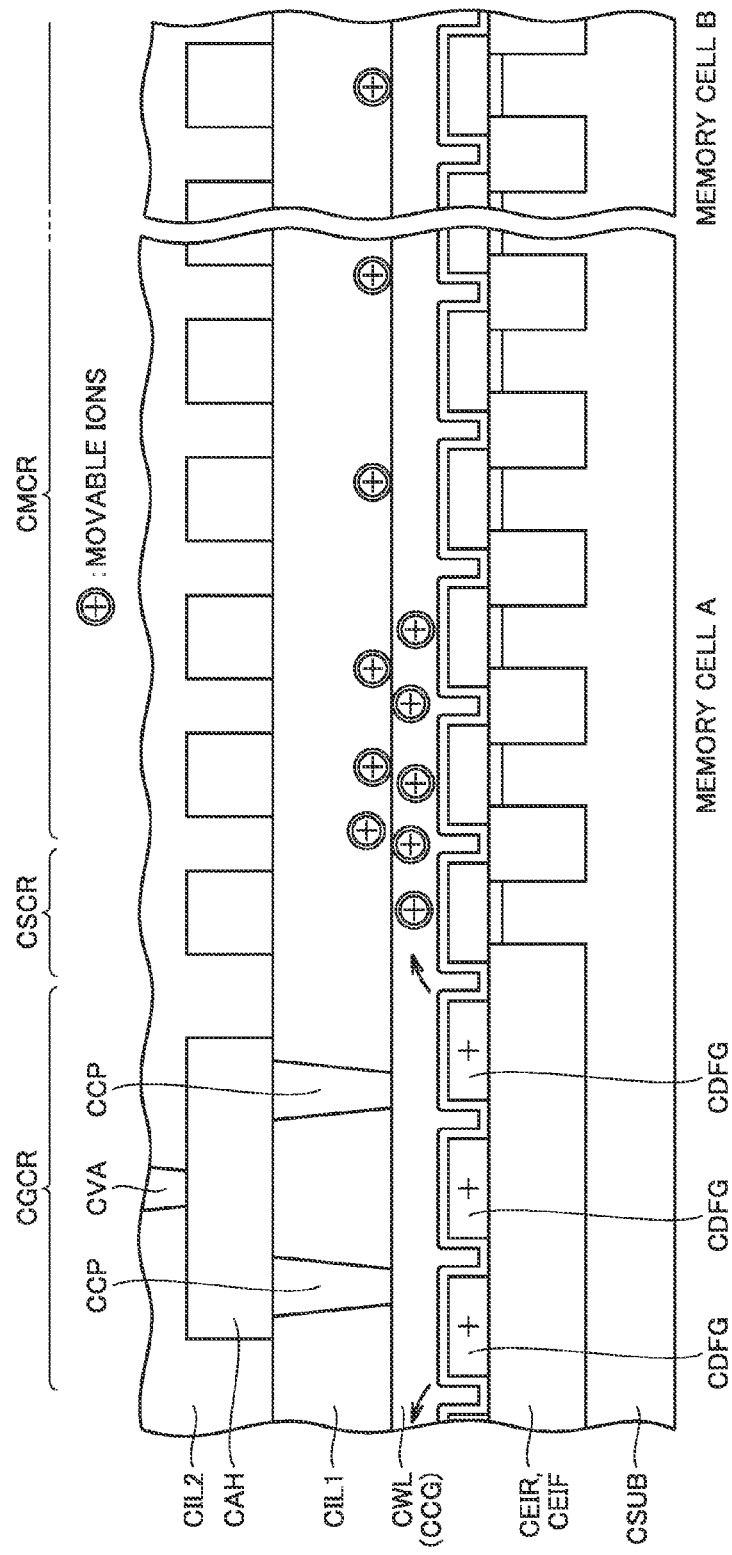
FIG. 34 is a second schematic cross-sectional view for illustrating a potential of the floating gate electrode and distribution of movable ions in the semiconductor device according to the comparative example.

Then, as shown in FIG. 34, in the vicinity of positively charged dummy floating gate electrode DFG, repulsion is generated between dummy floating gate electrode DFG and movable ions, and movable ions are concentrated in a portion of memory cell array region CMCR located in the vicinity of gate contact region CGCR.

Therefore, a portion (a portion A) of memory cell array region CMCR located in the vicinity of gate contact region CGCR and a portion (a portion B) of memory cell array region CMCR sufficiently distant from gate contact region CGCR are different from each other in density of movable ions, and portion A is higher in density of movable ions than portion B. Consequently, erroneous determination is made in the wafer test, which will be described.

Initially, normally, an erasing operation is performed before a writing operation and electrons are pulled out of the floating gate electrode. For example, electrons are pulled out of the floating gate electrode toward the semiconductor substrate by applying approximately −10V (Vcg) to the control gate electrode, 0 V (Vd) to the drain region, 0 V (Vs) to the source region, and approximately 10 V to the semiconductor substrate.

Figure 35:
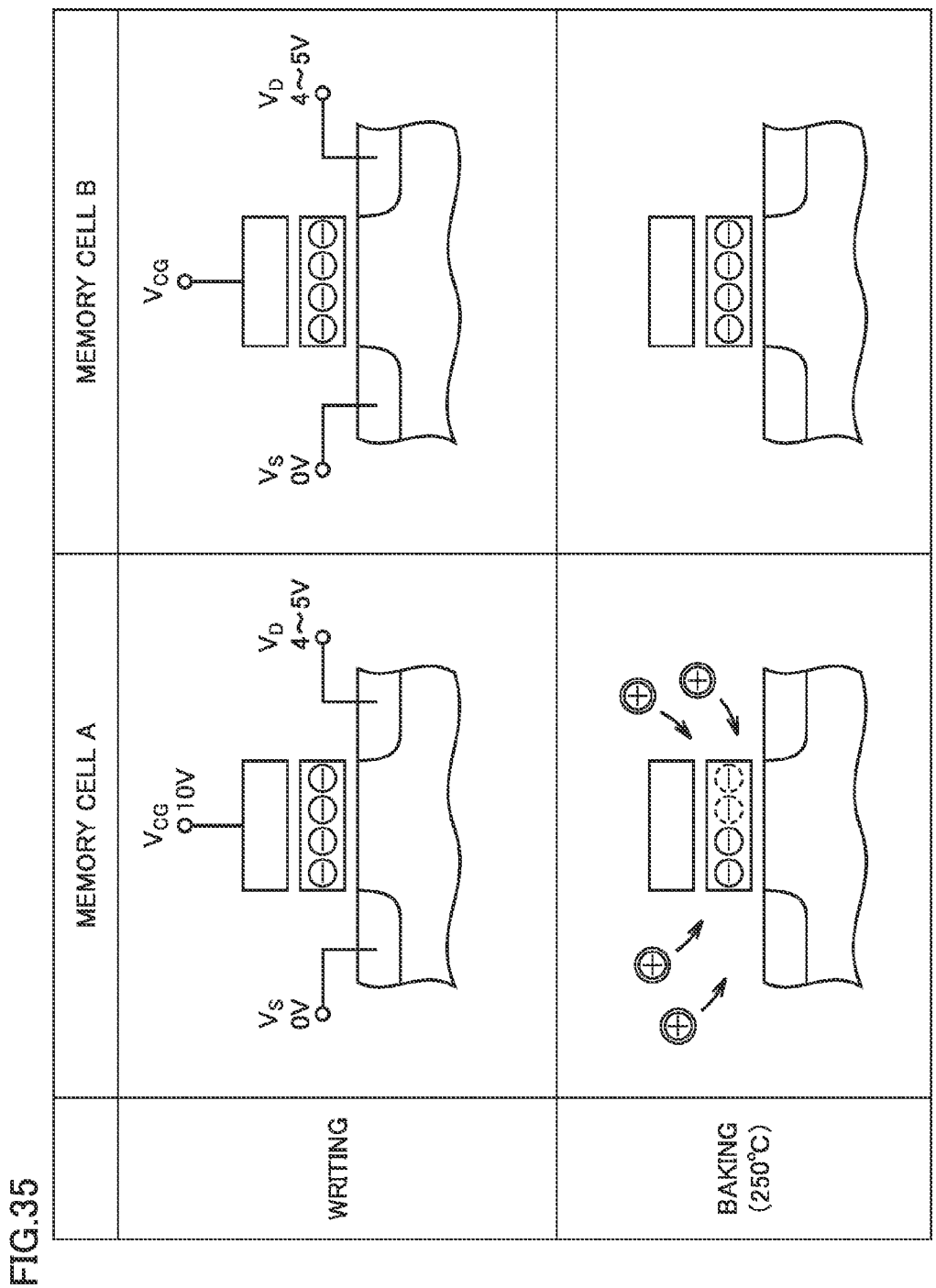
FIG. 35 is a diagram for illustrating an operation for writing and baking of the semiconductor device according to the comparative example.

Then, during the writing operation, as shown in FIG. 35, electrons are injected into the floating gate electrode. For example, electrons are injected into the floating gate electrode by applying approximately 10 V (Vcg) to the control gate electrode, approximately 4 to 5 V (Vd) to the drain region, and 0 V (Vs) to the source region. Here, memory cell A located in portion A and memory cell B located in portion B are substantially the same in a manner of injection of electrons into the floating gate electrode.

Baking is carried out after the writing operation. During baking, for example, under a temperature condition of approximately 250° C., whether or not a state that electrons have been injected into the floating gate electrode is maintained is tested. This heat during baking facilitates migration of movable ions (positive ions) in first interlayer insulating film CIL1. Here, more movable ions are present around memory cell A than around memory cell B.

Therefore, a probability of movable ions (positive ions) being attracted to the floating gate electrode of memory cell A is higher, negative bias of the floating gate electrode in memory cell A is cancelled in part, and a state the same as a state that the number of accumulated electrons is apparently smaller than the number of electrons accumulated in the floating gate electrode in memory cell B is established. Consequently, a threshold voltage of memory cell A is lower than a threshold voltage of memory cell B, and in spite of the fact that data is actually held in memory cell A, it is determined that data is missing (retention failure).

Figure 36:
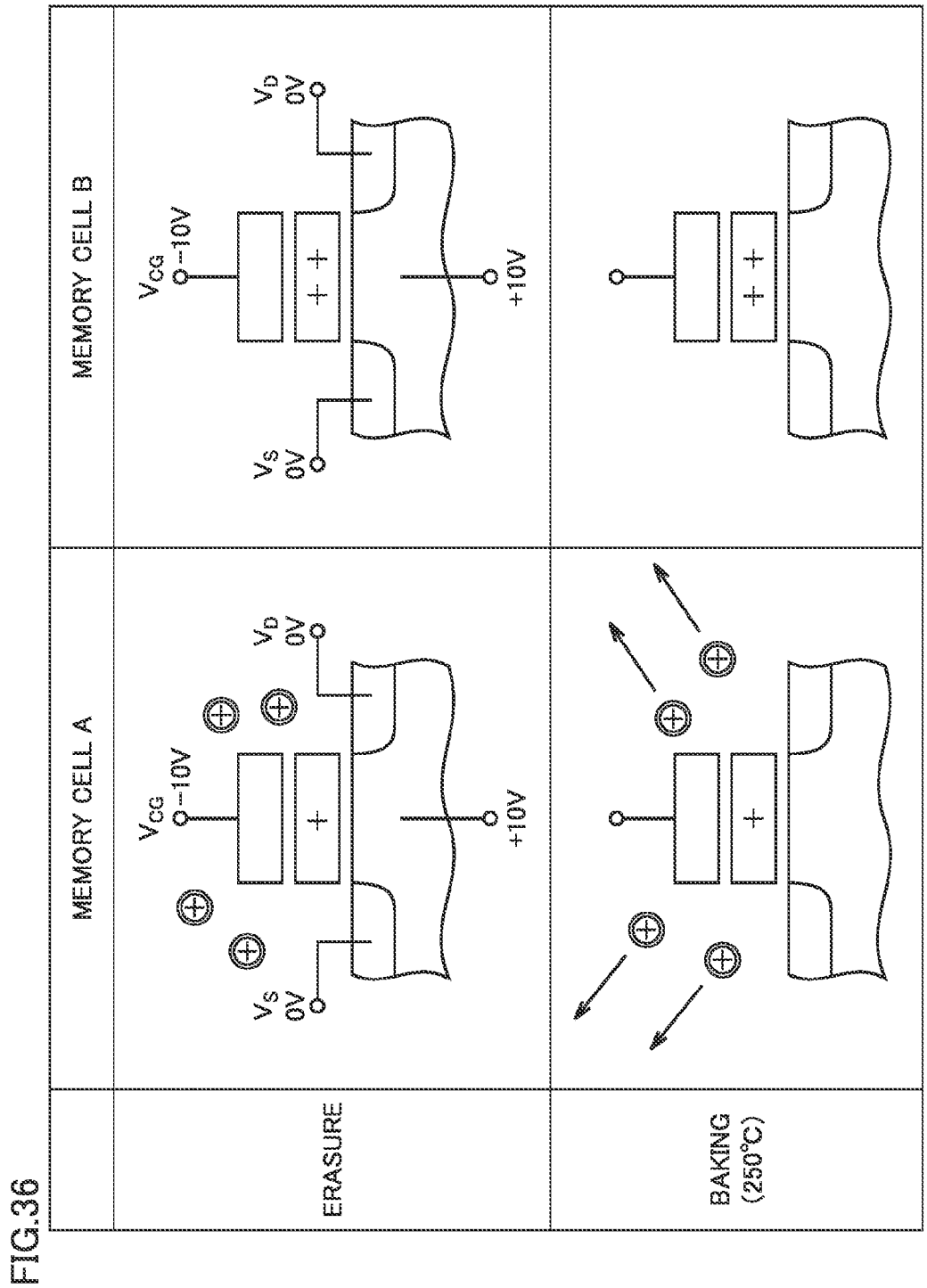
FIG. 36 is a diagram illustrating an operation for erasure and baking of the semiconductor device according to the comparative example.

In the erasing operation, as shown in FIG. 36, electrons are pulled out of the floating gate electrode. For example, electrons are pulled out of the floating gate electrode toward the semiconductor substrate by applying approximately −10 V (Vcg) to the control gate electrode, 0 V (Vd) to the drain region, 0 V (Vs) to the source region, and approximately 10 V to the semiconductor substrate, and the floating gate electrode is positively charged.

When erasure to the same threshold voltage (Vth) is carried out (threshold voltage Vth is lowered) in memory cell A and memory cell B, positive movable ions are present around the floating gate electrode in memory cell A and hence an amount of positive charges of the floating gate electrode itself is smaller in memory cell A than in memory cell B.

Baking is carried out after the erasing operation. During baking, for example, under a temperature condition of approximately 250° C., whether or not a state that electrons have been pulled out of the floating gate electrode is maintained is tested. Here, repulsion is applied between the positively charged floating gate electrode and movable ions in the floating gate electrode in memory cell A, and movable ions which now easily migrate owing to heat during baking will move away from the floating gate electrode.

Then, in memory cell A, an apparent amount of positive charges was the same as a result of movable ions being attracted, however, as movable ions move away, the amount of positive charges of the floating gate electrode in memory cell A is smaller than the amount of positive charges in the floating gate electrode in memory cell B. Therefore, the threshold voltage of memory cell A is higher than the threshold voltage of memory cell B, and erroneous determination that data has not been erased (retention failure) is made for memory cell A.

Thus, in the semiconductor device according to the comparative example, even though memory cell A located in the vicinity of gate contact region CGCR is actually normally functioning, erroneous determination as retention failure highly tends to be made.

Positive charge up has been described by way of example of charge up owing to plasma. A step of exposure to plasma includes not only a step of forming a contact hole or a via hole but also a step of forming an insulating film, for example, with plasma CVD. In this case, it is also assumed that a dummy floating gate electrode is negatively charged as a word line is negatively charged.

In this case, it is possible that movable ions are concentrated in the gate contact region and a phenomenon reverse to a case of positive charging of the dummy floating gate electrode occurs. In that case as well, it is highly likely that erroneous determination as retention failure is made for a memory cell located in the vicinity of the gate contact region.

The inventor has clarified for the first time that such retention failure resulting from migration of movable ions had occurred as a result of application of an undoped oxide film as first interlayer insulating film IL1 (CIL1) and second interlayer insulating film IL2 (CIL2).

A semiconductor device according to the embodiment will now be described. In the semiconductor device according to the comparative example, element isolation region CEIR is formed over the entire gate contact region CGCR, whereas in gate contact region GCR in the semiconductor device according to the embodiment, with a pattern in conformity with a pattern of element isolation region EIR formed in memory cell array region MCR, element isolation region EIR is formed and dummy element formation region DEFR is defined. Dummy floating gate electrode DFG is arranged to partially be superimposed on dummy element formation region DEFR in a two-dimensional view. A source region and a drain region are not formed in dummy element formation region DEFR. Contact plug CP is also arranged to partially be superimposed on dummy element formation region DEFR in a two-dimensional view.

Figure 37:
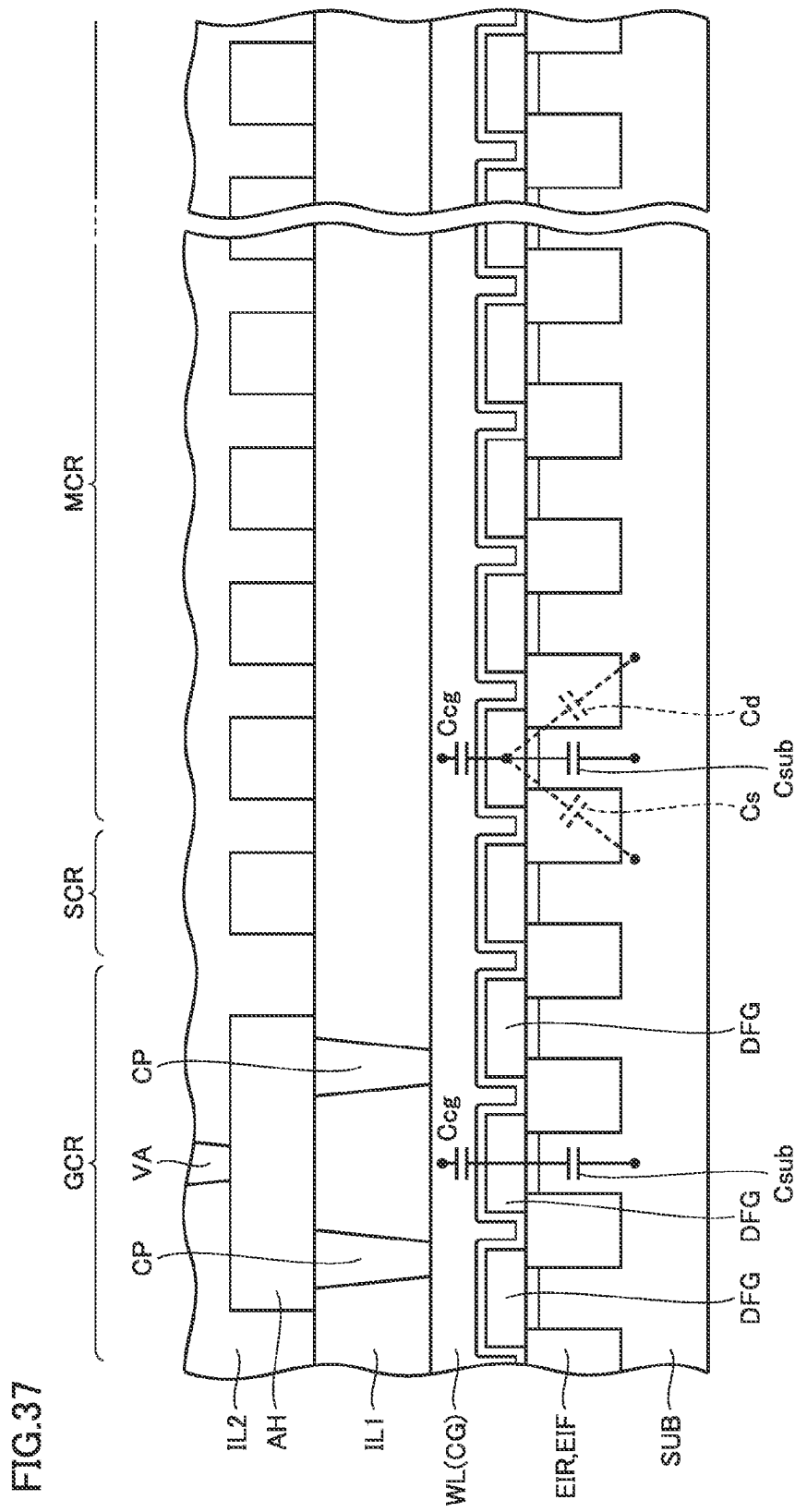
FIG. 37 is a first schematic cross-sectional view for illustrating a potential of the floating gate electrode in the first embodiment.

Therefore, though values for capacitance Cs and capacitance Cd are 0 in gate contact region GCR, there is capacitance Csub between dummy floating gate electrode DFG and semiconductor substrate SUB as shown in FIG. 37. Thus, a value for coupling ratio Cr of dummy floating gate electrode DFG can be closer to a value for coupling ratio Cr of floating gate electrode FG located in memory cell array region MCR than in the comparative example in which a value for capacitance Csub is substantially 0.

Then, based on the Expression 4, a potential (Vdfg) of dummy floating gate electrode DFG and a potential (Vfg) of floating gate electrode FG are substantially the same (Vdfg≈Vfg) with respect to potential Vcg of control gate electrode CG.

Figure 38:
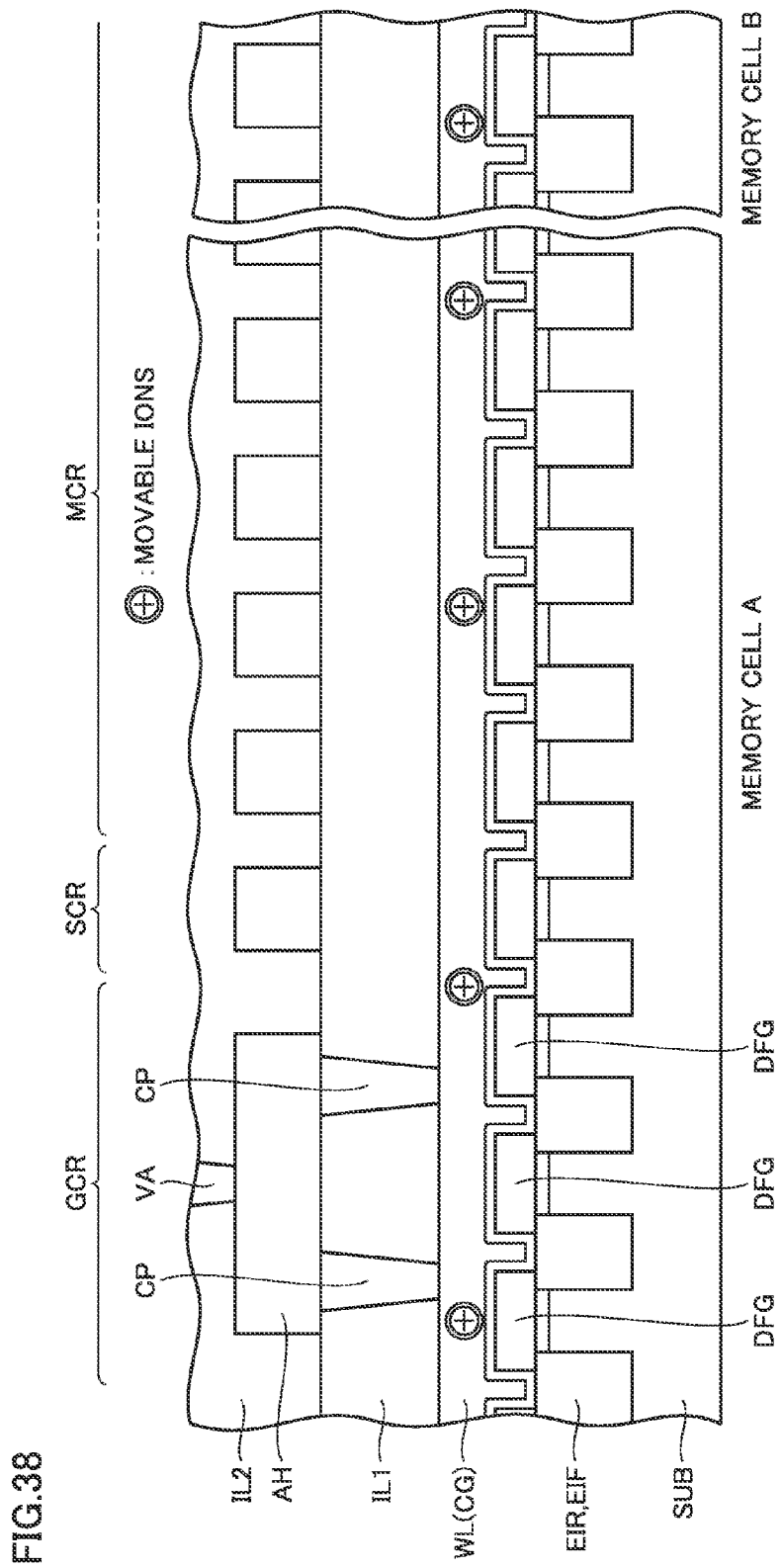
FIG. 38 is a second schematic cross-sectional view for illustrating a potential of the floating gate electrode and distribution of movable ions in the first embodiment.

Therefore, even though a potential of word line WL increases owing to positive charges accumulated at the bottom of via hole VH, a state that dummy floating gate electrode DFG is positively charged relative to the potential of floating gate electrode FG is eliminated or mitigated. Then, concentration of movable ions in first interlayer insulating film IL1 in a portion of memory cell array region MCR located in the vicinity of gate contact region GCR as in the semiconductor device according to the comparative example is suppressed, and movable ions are substantially uniformly distributed as shown in FIG. 38. Thus, erroneous determination for a memory cell can be suppressed.

Figure 39:
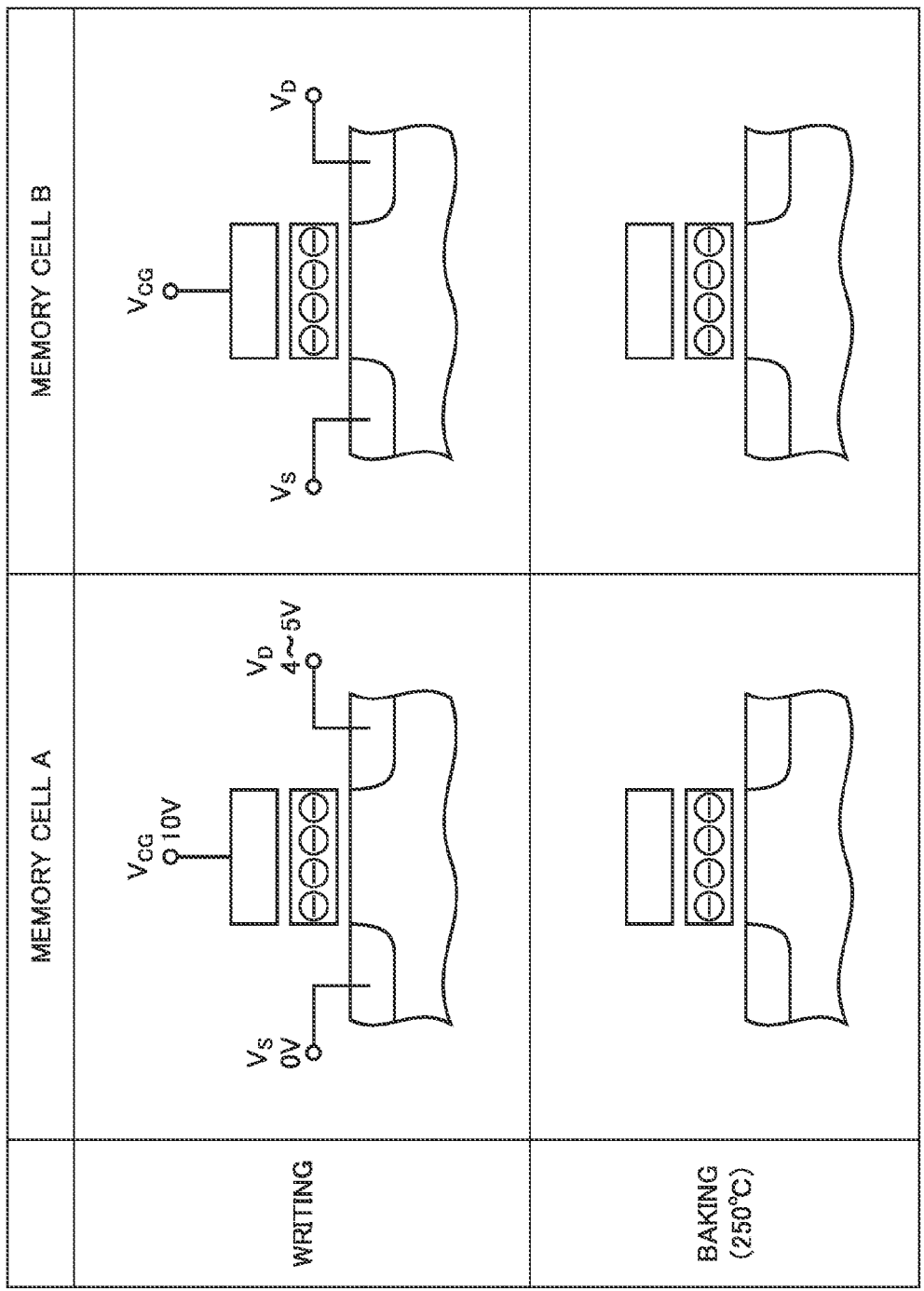
FIG. 39 is a diagram for illustrating a writing operation and baking in the first embodiment.

Initially, in the writing operation, as shown in FIG. 39, electrons are injected into the floating gate electrode by applying, for example, approximately 10 V (Vcg) to the control gate electrode, approximately 4 to 5 V (Vd) to the drain region, and 0 V (Vs) to the source region. Here, memory cell A located in the vicinity of gate contact region GCR and memory cell B located sufficiently distant from gate contact region GCR are substantially the same in a manner of injection of electrons into the floating gate electrode.

Baking is carried out under a temperature condition of approximately 250° C. after the writing operation. Here, even though migration of movable ions is facilitated, a threshold voltage Vtha of memory cell A is substantially the same as a threshold voltage Vthb of memory cell B (Vtha≈Vthb) owing to uniform distribution of movable ions, and determination as data being missing for memory cell A (retention failure) is suppressed.

Figure 40:
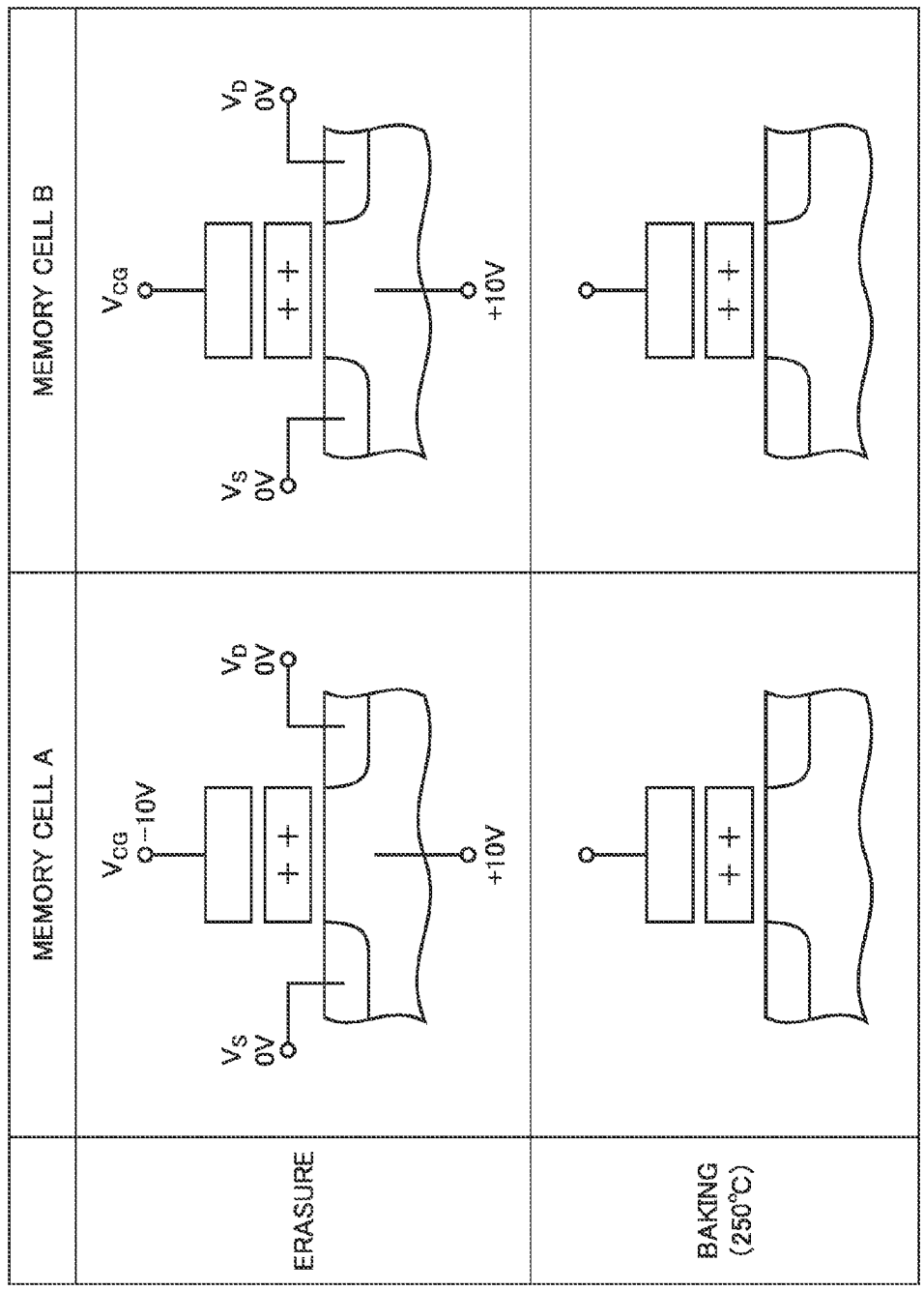
FIG. 40 is a diagram illustrating an erasing operation and baking in the first embodiment.

Then, in the erasing operation, as shown in FIG. 40, electrons are pulled out of the floating gate electrode toward the semiconductor substrate by applying, for example, approximately −10 V (Vcg) to the control gate electrode, 0 V (Vd) to the drain region, 0 V (Vs) to the source region, and approximately 10 V to the semiconductor substrate.

Baking is carried out under a temperature condition of approximately 250° C. after the erasing operation. Here, electrons injected into floating gate electrode FG have completely been pulled out to the semiconductor substrate in memory cell A and memory cell B. In addition, movable ions are substantially uniformly distributed. Therefore, even though migration of movable ions is facilitated, threshold voltage Vtha of memory cell A is substantially the same as threshold voltage Vthb of memory cell B (Vtha≈Vthb) and determination as data not having been erased (retention failure) for memory cell A is suppressed.

Thus, in the semiconductor device according to the embodiment, as compared with the semiconductor device according to the comparative example, erroneous determination as retention failure of memory cell A located in the vicinity of gate contact region GCR can be suppressed.

Second Embodiment

A second example of a semiconductor device including a non-volatile memory will now be described.

Figure 41:
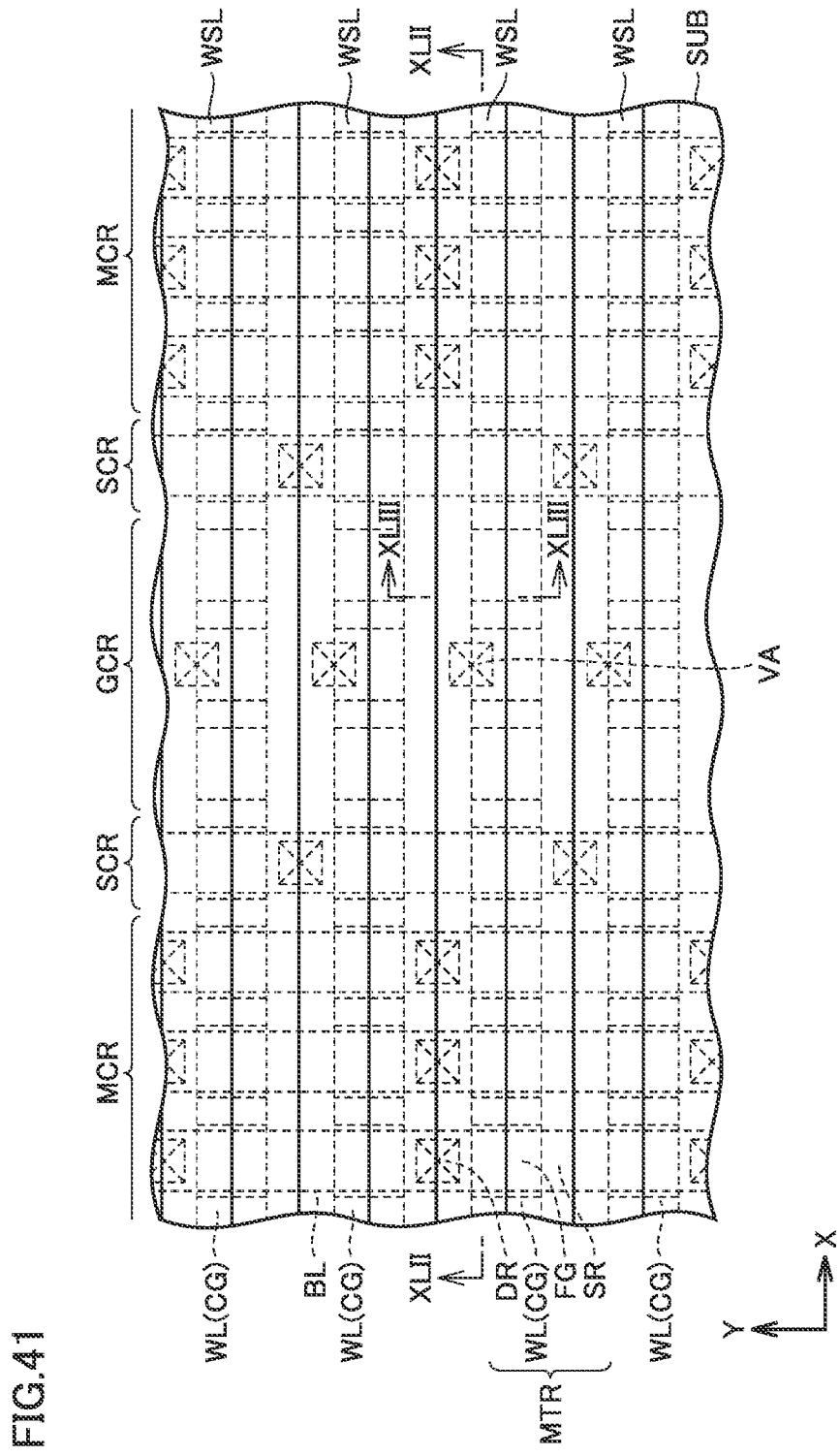
FIG. 41 is a plan view showing a layout of a semiconductor device according to a second embodiment.
Figure 42:
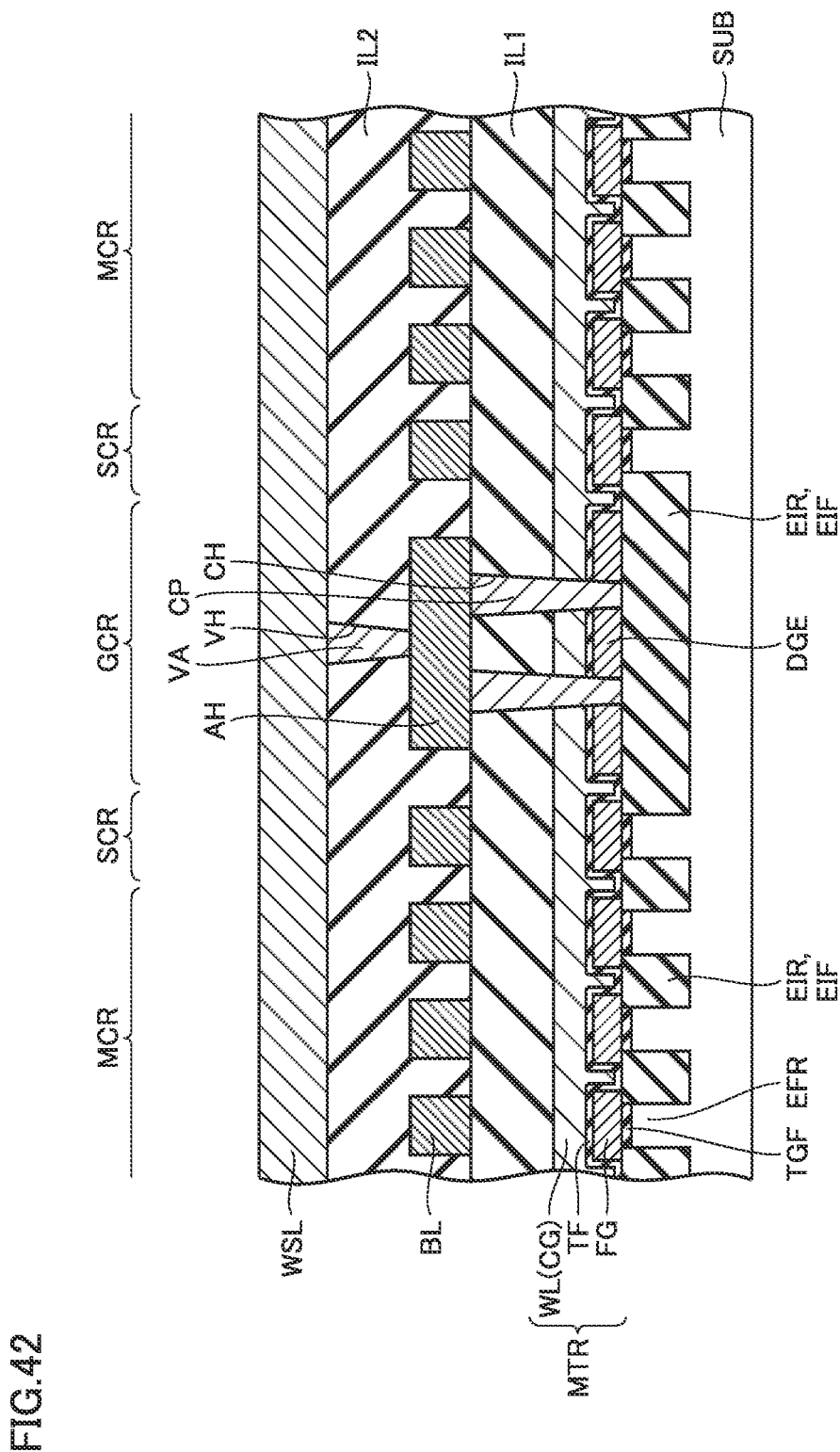
FIG. 42 is a cross-sectional view along the line XLII-XLII shown in FIG. 41 in the second embodiment.
Figure 43:
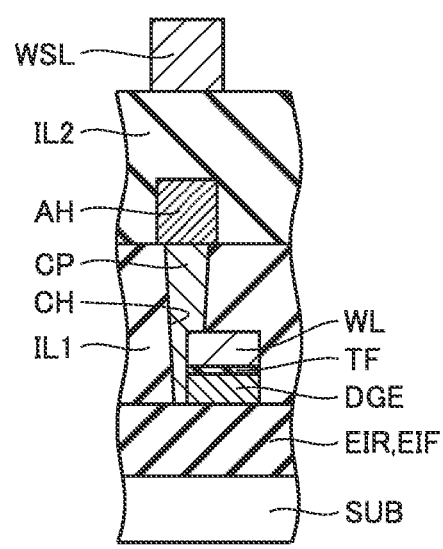
FIG. 43 is a cross-sectional view along the line XLIII-XLIII shown in FIG. 41 in the second embodiment.

As shown in FIGS. 41, 42, and 43, in a surface of semiconductor substrate SUB, memory cell array region MCR and source contact region SCR as well as gate contact region GCR are defined. In memory cell array region MCR and source contact region SCR, element isolation region EIR defines element formation region EFR. In gate contact region GCR, element isolation region EIR is formed over the entire gate contact region GCR.

In memory cell array region MCR, memory cell transistor MTR is formed. In gate contact region GCR, dummy gate electrode DGE is formed. First interlayer insulating film IL1 formed from an undoped oxide film is formed to cover memory cell transistor MTR. In a portion of first interlayer insulating film IL1 located in gate contact region GCR, contact hole CH penetrating first interlayer insulating film IL1 and word line WL and reaching element isolation region EIR is formed.

Contact plug CP is formed in contact hole CH. Dummy gate electrode DGE is electrically connected to word line WL through contact plug CP. Since the construction is otherwise the same as in the semiconductor device shown in FIGS. 1 and 2, the same member has the same reference character allotted and description thereof will not be repeated unless it is necessary.

Figure 44:
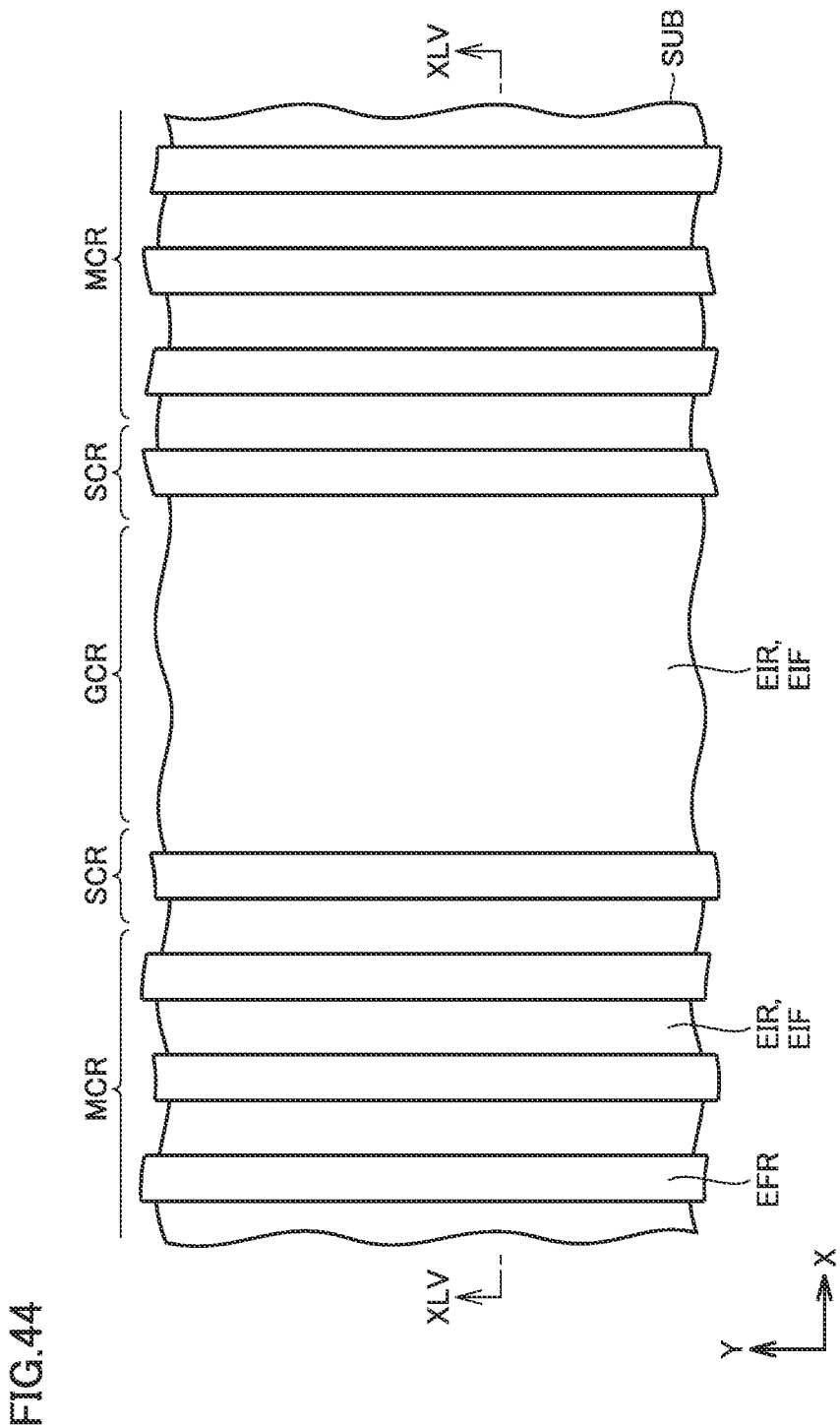
FIG. 44 is a plan view showing one step in a method of manufacturing a semiconductor device in the second embodiment.
Figure 45:
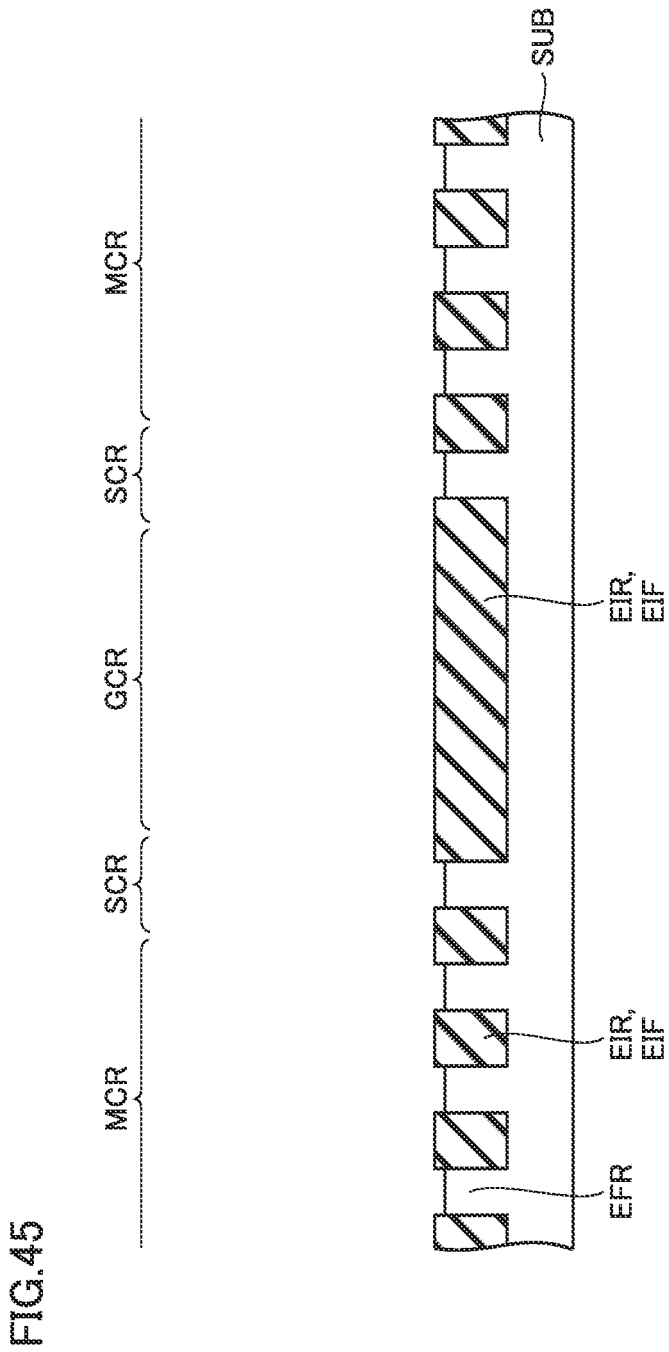
FIG. 45 is a cross-sectional view along the line XLV-XLV shown in FIG. 44 in the second embodiment.

One example of a method of manufacturing the semiconductor device described above will now be described. Initially, as shown in FIGS. 44 and 45, element isolation region EIR is formed by forming prescribed isolation trench TC in the surface of the semiconductor substrate and filling isolation trench TC with element isolation insulating film EIF.

Element isolation region EIR defines element formation region EFR. Element isolation region EIR is formed over the entire gate contact region GCR in gate contact region GCR.

Then, through a step the same as the step shown in FIGS. 5 and 6, a polysilicon film pattern (not shown) to be floating gate electrode FG (see FIG. 46) in memory cell array region MCR and source contact region SCR and to be dummy gate electrode DGE (see FIG. 46) in gate contact region GCR is formed. Then, through steps the same as the steps shown in FIGS. 7 to 17, memory cell transistor MTR including word line WL is formed and thereafter first interlayer insulating film IL1 (see FIG. 46) formed from undoped oxide film is formed to cover memory cell transistor MTR.

Figure 46:
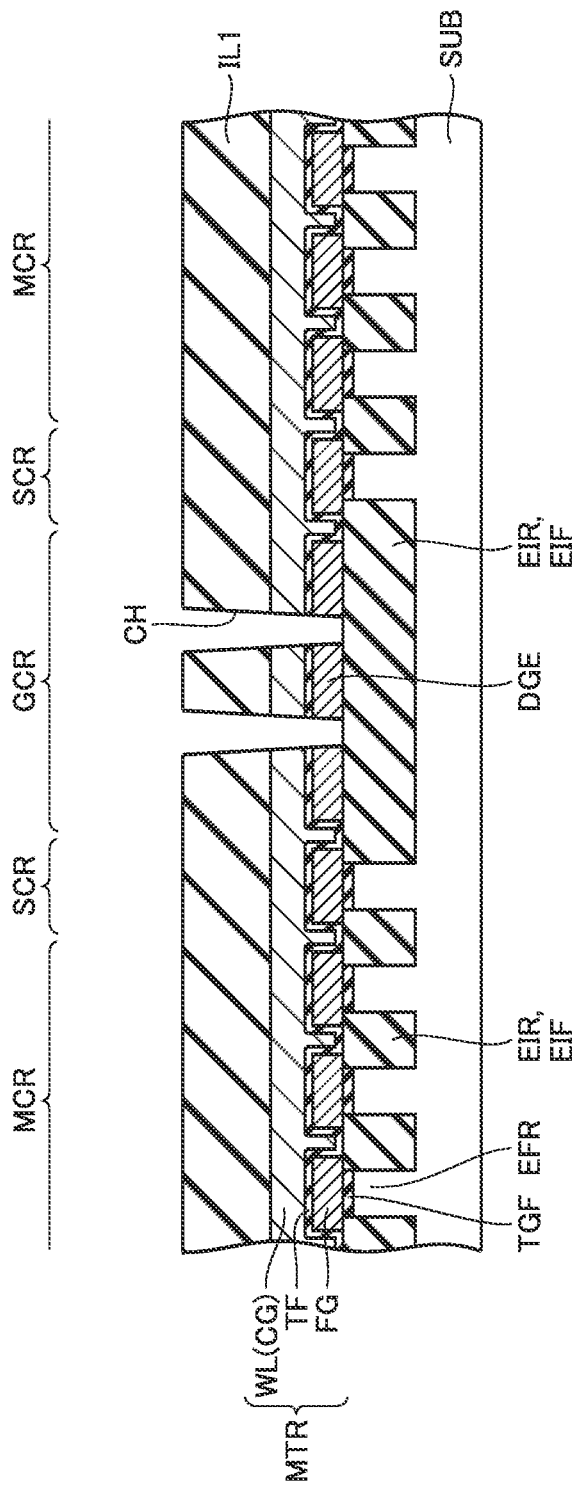
FIG. 46 is a cross-sectional view along the line XLII-XLII shown in FIG. 41, which shows a step performed after the step shown in FIGS. 44 and 45 in the second embodiment.
Figure 47:
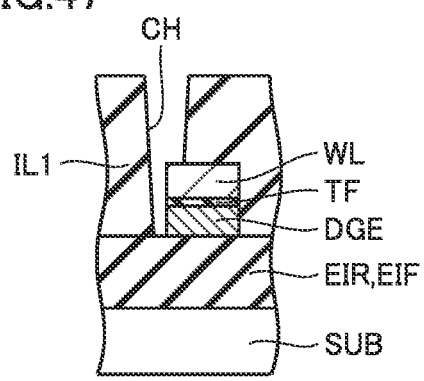
FIG. 47 is a cross-sectional view along the line XLIII-XLIII shown in FIG. 41, which shows a step performed after the step shown in FIGS. 44 and 45 in the second embodiment.
Figure 48:
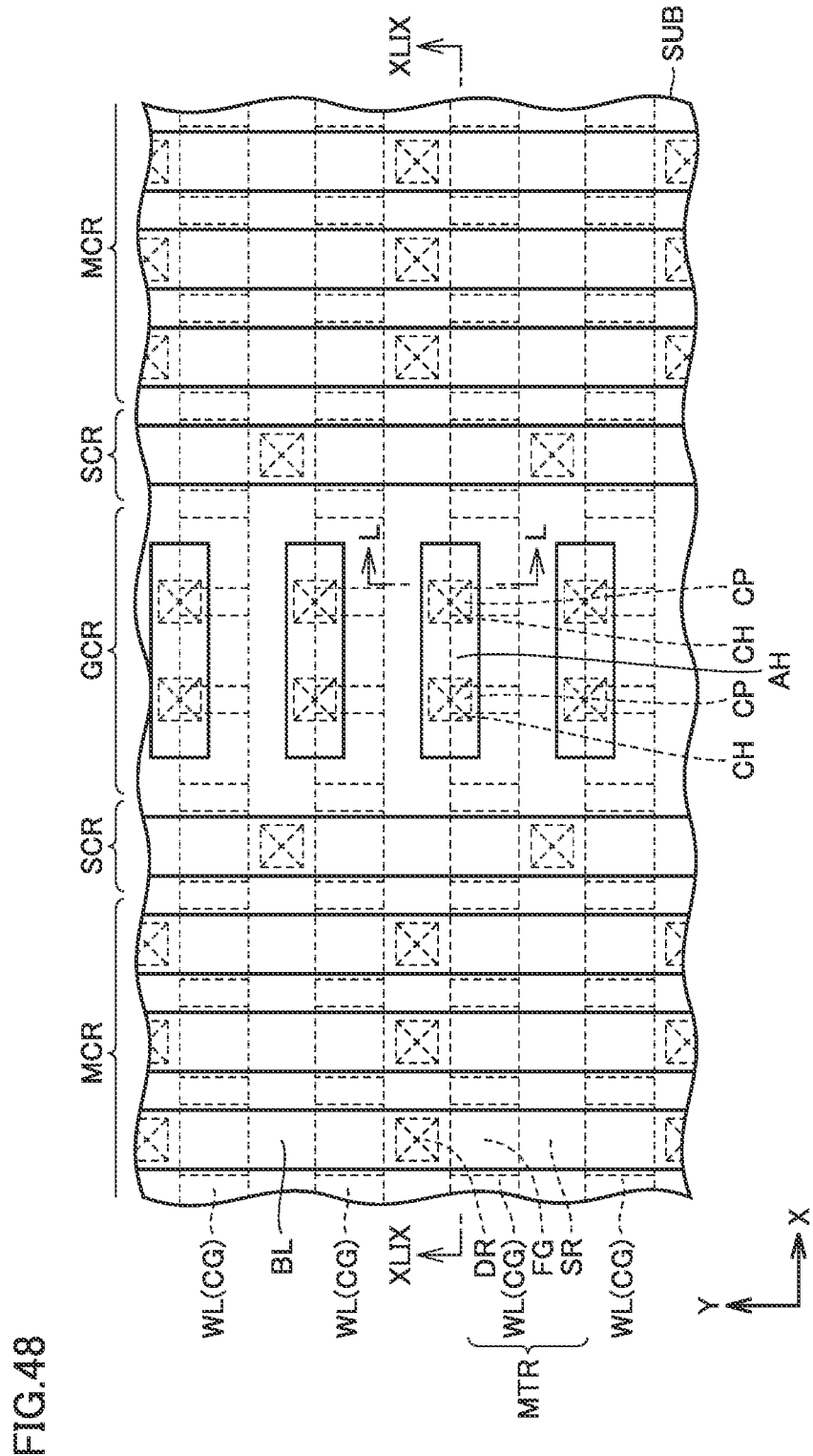
FIG. 48 is a plan view showing a step performed after the step shown in FIGS. 46 and 47 in the second embodiment.
Figure 49:
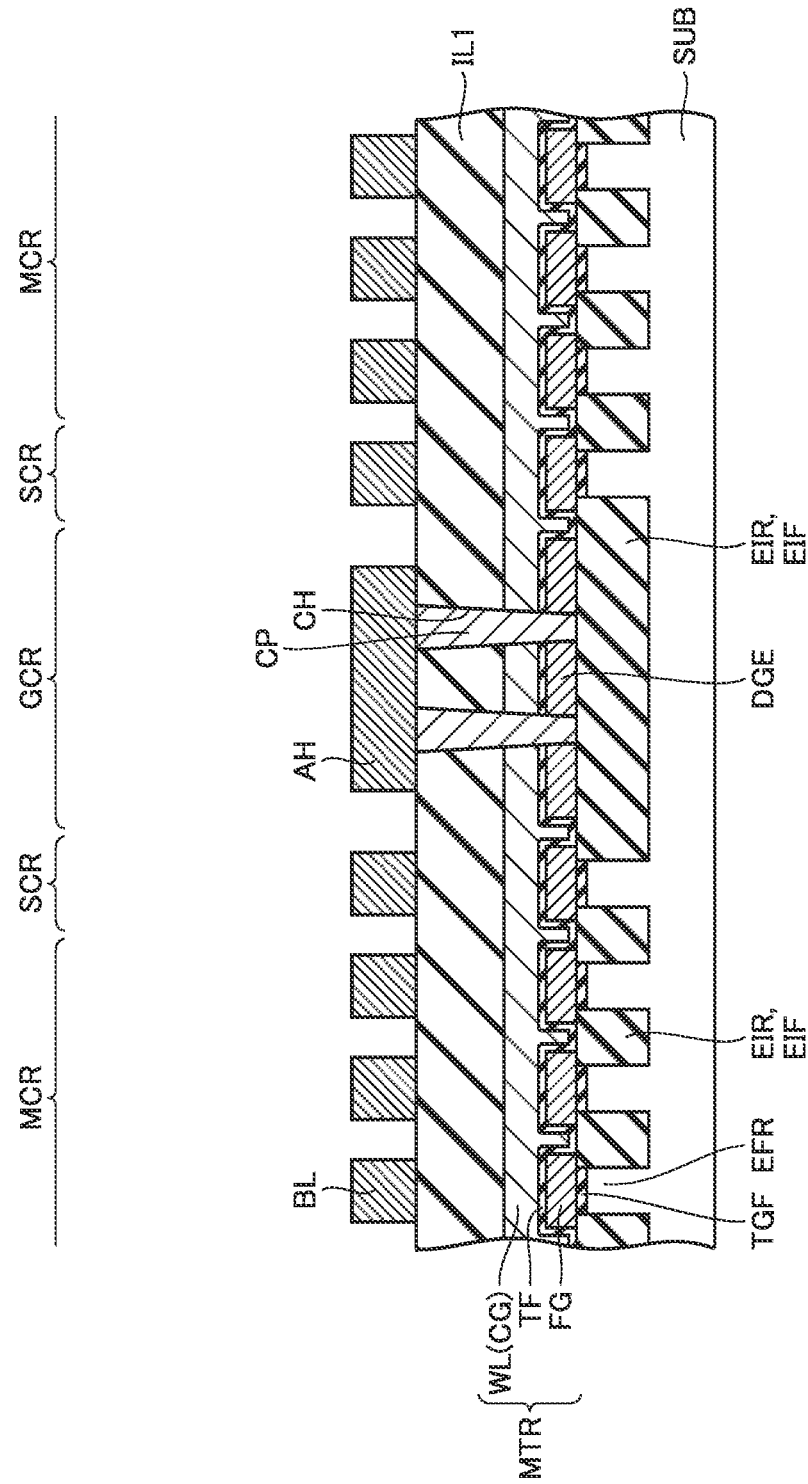
FIG. 49 is a cross-sectional view along the line XLIX-XLIX shown in FIG. 48 in the second embodiment.
Figure 50:
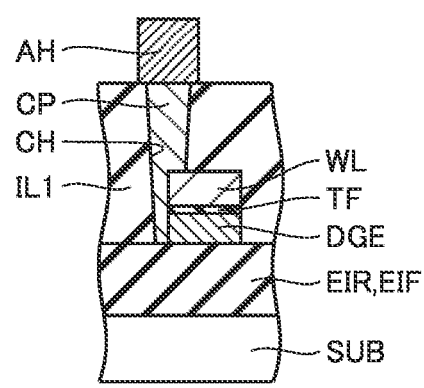
FIG. 50 is a cross-sectional view along the line L-L shown in FIG. 48 in the second embodiment.

Then, as shown in FIGS. 46 and 47, through a prescribed photolithography process and an etching process on first interlayer insulating film IL1, contact hole CH exposing word line WL and dummy gate electrode DGE is formed in gate contact region GCR. Then, as shown in FIGS. 48, 49, and 50, contact plug CP is formed in contact hole CH. Thus, dummy gate electrode DGE and word line WL are electrically short-circuited to each other through contact plug CP. Then, bit line BL is formed in memory cell array region MCR and interconnection AH is formed in gate contact region GCR.

Figure 51:
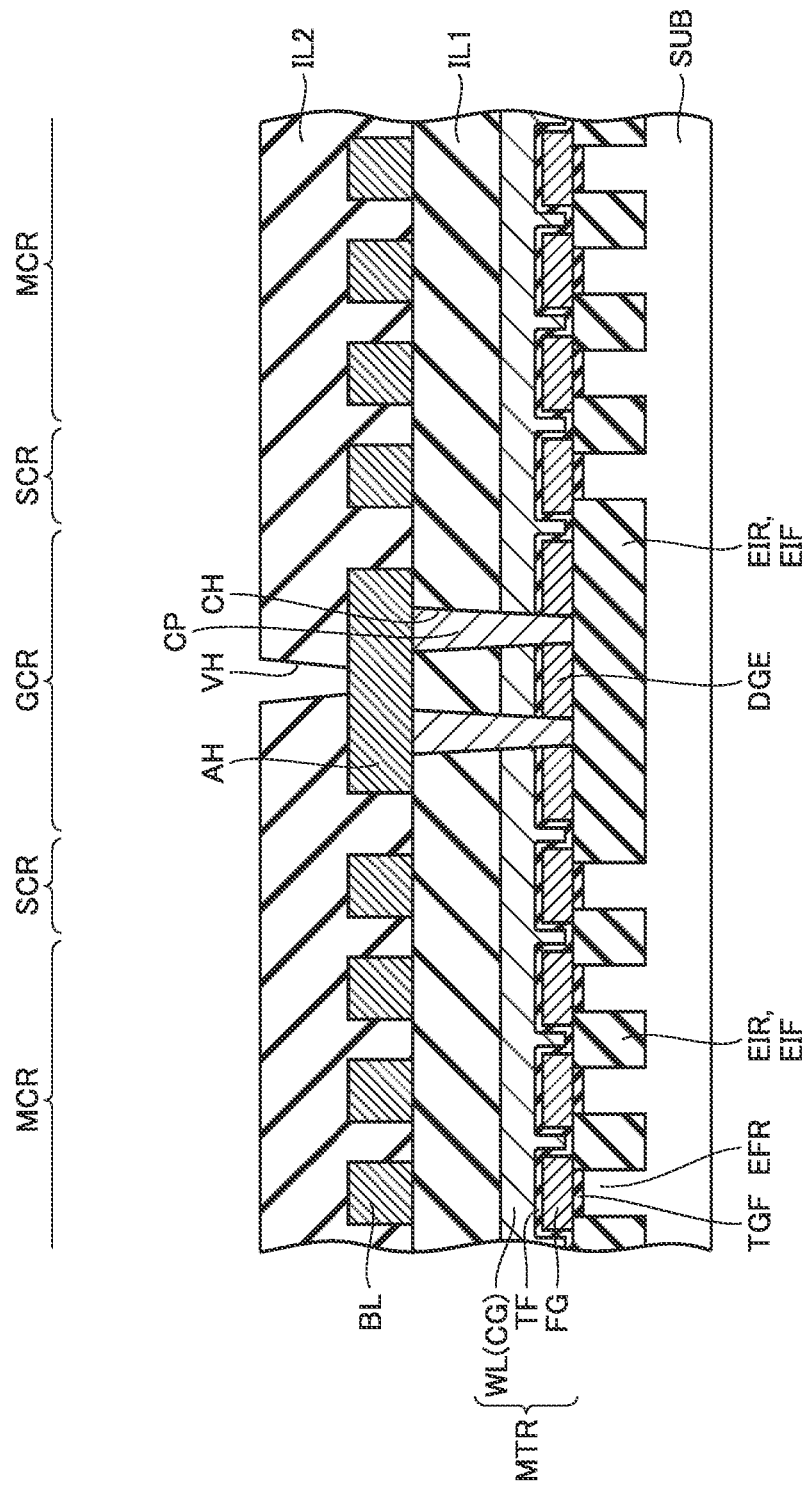
FIG. 51 is a cross-sectional view showing a step performed after the step shown in FIGS. 48, 49, and 50 in the second embodiment.

Then, as shown in FIG. 51, second interlayer insulating film IL2 formed from an undoped oxide film is formed to cover bit line BL and interconnection AH. Then, through a prescribed photolithography process and an etching process on second interlayer insulating film IL2, via hole VH is formed. Then, via VA (see FIG. 42) is formed in via hole VH. Thereafter, word line shunt WSL electrically connected to via VA is formed on the surface of second interlayer insulating film IL2 and a main portion of the semiconductor device including the non-volatile memory shown in FIGS. 41 and 42 is completed.

In the semiconductor device including the non-volatile memory described above, dummy gate electrode DGE and control gate electrode CG are electrically short-circuited to each other through contact plug CP. Therefore, even though positive charging at the bottom of via hole VH takes place and a potential of control gate electrode CG (word line WL) increases in forming a via hole exposing interconnection AH electrically connected to contact plug CP, charges in dummy gate electrode DGE escape by the time of end of the process. Namely, charge up of dummy gate electrode DGE resulting from a value for coupling ratio Cr being close to 1 as in the comparative example can be prevented.

Figure 52:
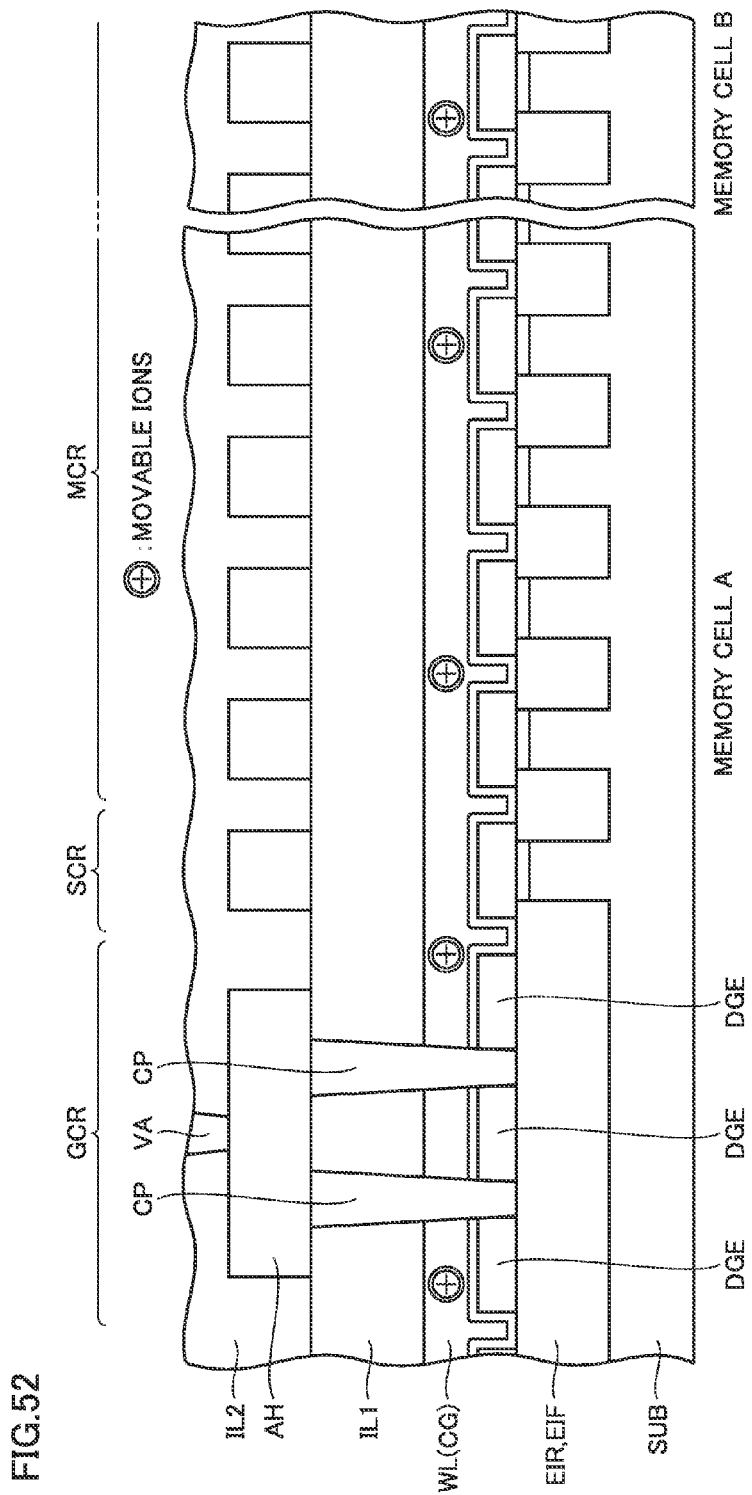
FIG. 52 is a schematic cross-sectional view showing distribution of movable ions in the second embodiment.

Thus, even though migration of movable ions is facilitated by heat treatment, concentration at a specific location due to a potential of dummy gate electrode DGE as in the comparative example is suppressed and movable ions are distributed substantially uniformly as shown in FIG. 52. Consequently, as described in the first embodiment, determination as data being missing for memory cell A (retention failure) in baking after the writing operation is suppressed. During baking after the erasing operation, determination as data not having been erased (retention failure) for memory cell A is suppressed.

In the semiconductor device including the non-volatile memory described above, as described in the first embodiment, it is also possible that plasma negatively charges control gate electrode CG (word line WL). In such a case as well, as a result of electrical short-circuiting between dummy gate electrode DGE and word line WL, charges in dummy gate electrode DGE escape by the time of end of the process.

Consequently, determination for memory cell A as data being missing (retention failure) during baking after the writing operation is suppressed. In addition, determination for memory cell A as data not having been erased (retention failure) during baking after the erasing operation is suppressed.

Thus, in the semiconductor device according to the second embodiment, as compared with the semiconductor device according to the comparative example described in the first embodiment, erroneous determination as retention failure of memory cell A located in the vicinity of gate contact region GCR can be suppressed.

Third Embodiment

A third example of a semiconductor device including a non-volatile memory will now be described.

Figure 53:
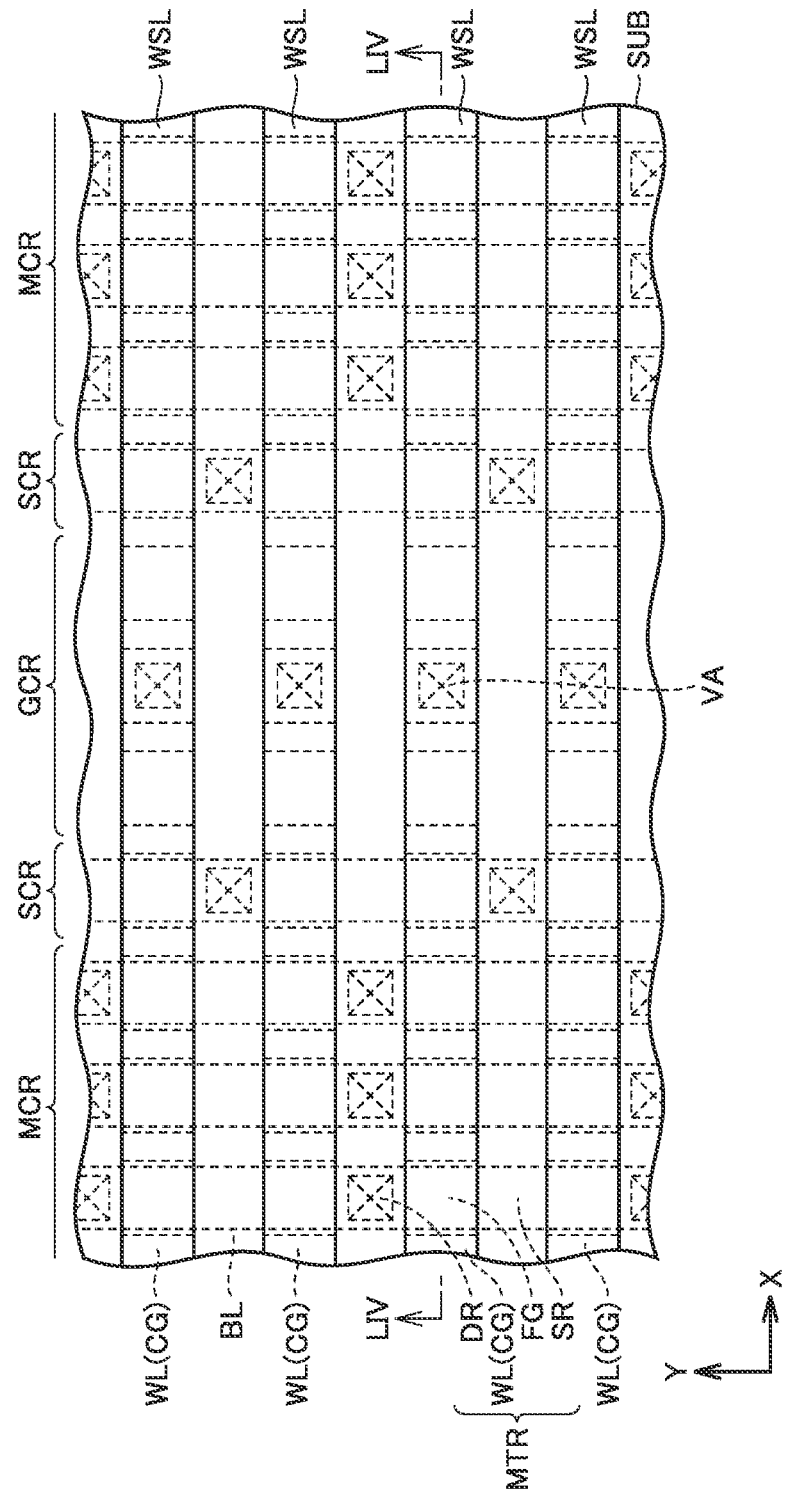
FIG. 53 is a plan view showing a layout of a semiconductor device according to a third embodiment.
Figure 54:
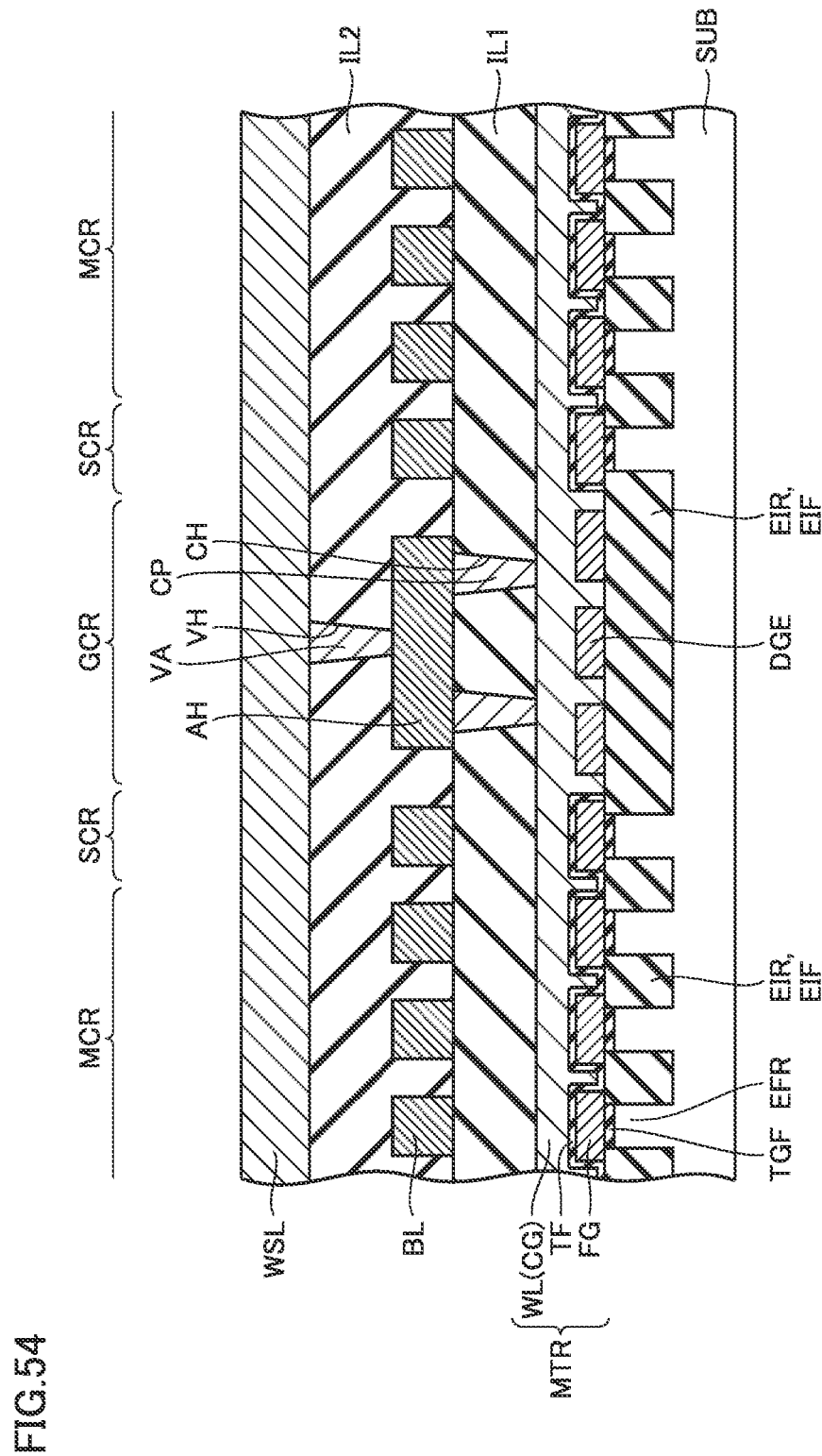
FIG. 54 is a cross-sectional view along the line LIV-LIV shown in FIG. 53 in the third embodiment.

As shown in FIGS. 53 and 54, memory cell array region MCR and source contact region SCR as well as gate contact region GCR are defined in the surface of semiconductor substrate SUB. In memory cell array region MCR and source contact region SCR, element isolation region EIR defines element formation region EFR. In gate contact region GCR, element isolation region EIR is formed over the entire gate contact region GCR.

Memory cell transistor MTR is formed in memory cell array region MCR. Dummy gate electrode DGE is formed in gate contact region GCR. Dummy gate electrode DGE and word line WL (control gate electrode CG) are in direct contact with each other. First interlayer insulating film IL1 formed from an undoped oxide film is formed to cover memory cell transistor MTR. In a portion of first interlayer insulating film IL1 located in gate contact region GCR, contact hole CH penetrating first interlayer insulating film IL1 and word line WL and reaching element isolation region EIR is formed.

Contact plug CP is formed in contact hole CH. Dummy gate electrode DGE is electrically connected to word line WL through contact plug CP. Since the construction is otherwise the same as in the semiconductor device shown in FIGS. 1 and 2, the same member has the same reference character allotted and description thereof will not be repeated unless it is necessary.

Figure 55:
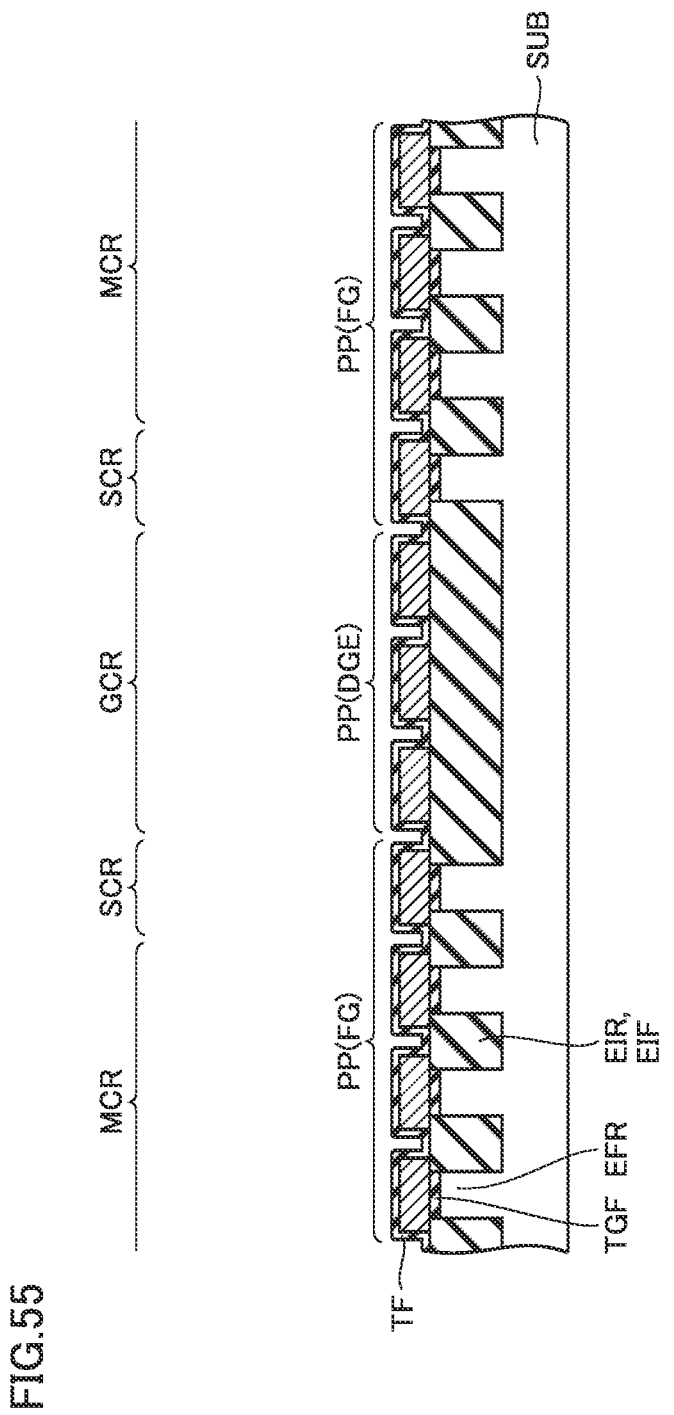
FIG. 55 is a cross-sectional view showing one step in a method of manufacturing a semiconductor device in the third embodiment.

A method of manufacturing the semiconductor device described above will now be described. Through steps the same as the step shown in FIGS. 44 and 45 and the step shown in FIGS. 5 and 6, as shown in FIG. 55, in memory cell array region MCR and source contact region SCR, polysilicon film pattern PP to be floating gate electrode FG is formed. In gate contact region GCR, polysilicon film pattern PP to be dummy gate electrode DGE is formed.

Figure 56:
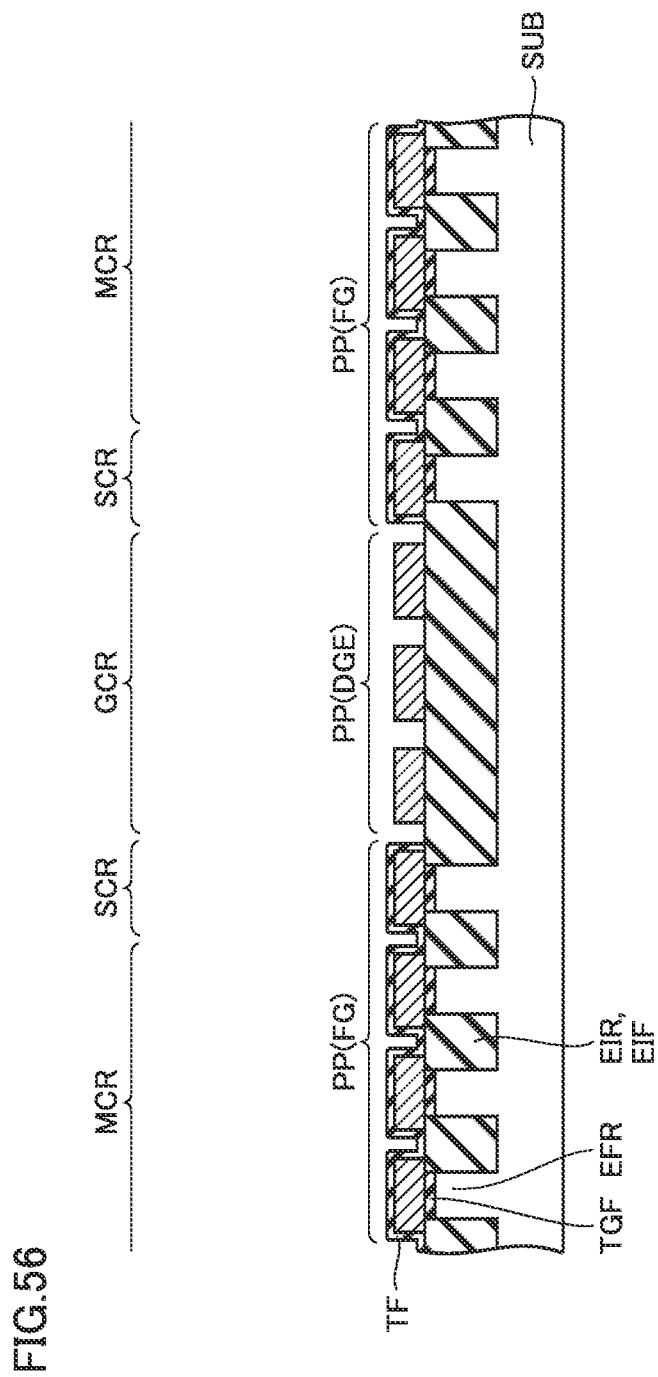
FIG. 56 is a cross-sectional view showing a step performed after the step shown in FIG. 55 in the third embodiment.
Figure 57:
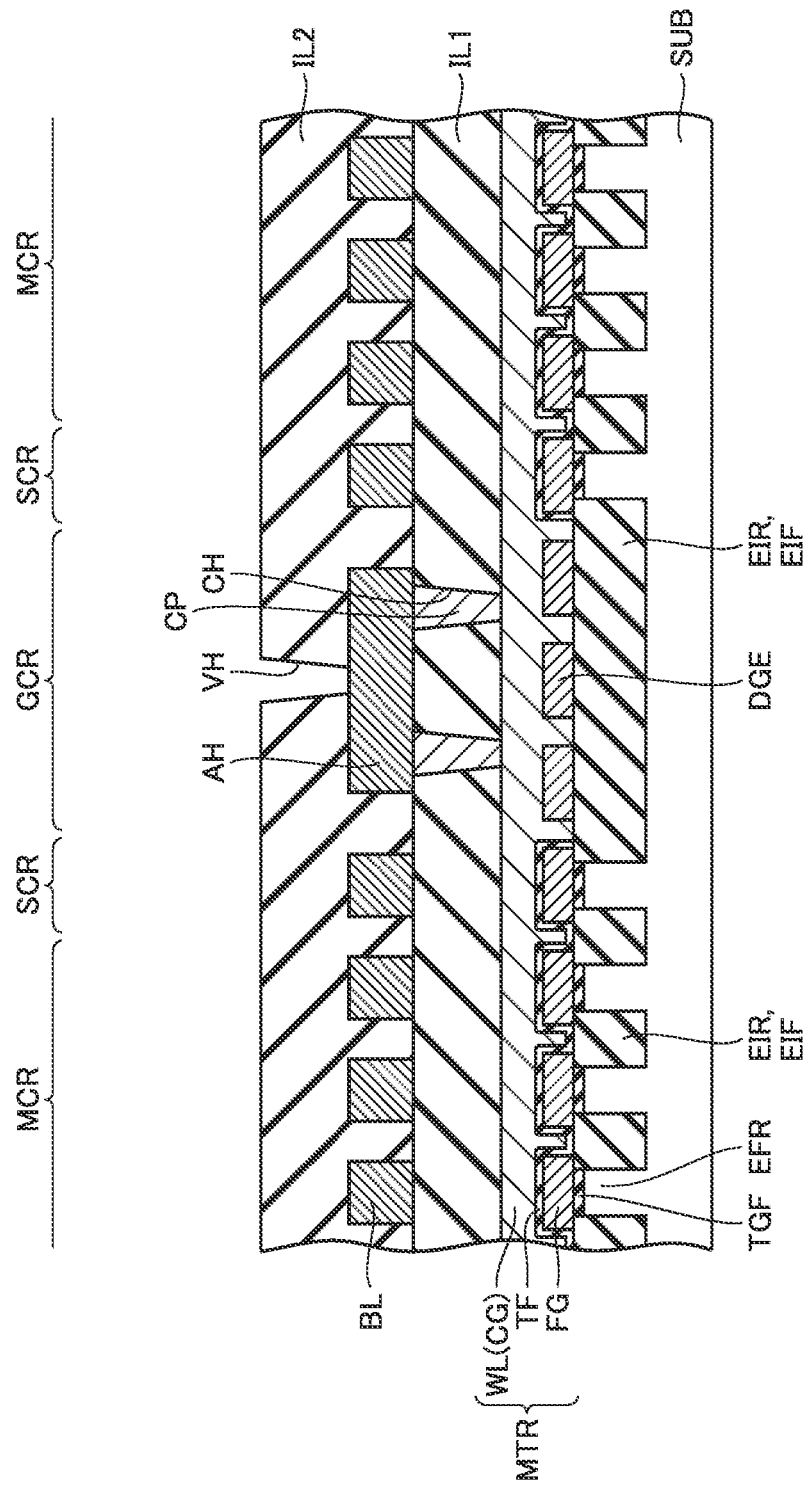
FIG. 57 is a cross-sectional view showing a step performed after the step shown in FIG. 56 in the third embodiment.

Then, ONO film TF is formed to cover polysilicon film pattern PP. Then, through a prescribed photolithography process and an etching process on ONO film TF, as shown in FIG. 56, a portion of ONO film TF located in gate contact region GCR is removed. Then, through steps the same as the steps shown in FIGS. 7 to 22, as shown in FIG. 57, through a prescribed photolithography process and an etching process on second interlayer insulating film IL2, via hole VH is formed.

Then, via VA (see FIG. 54) is formed in via hole VH. Thereafter, on the surface of second interlayer insulating film IL2, word line shunt WSL electrically connected to via VA is formed, and a main portion of the semiconductor device including the non-volatile memory shown in FIGS. 53 and 54 is completed.

In the semiconductor device including the non-volatile memory described above, dummy gate electrode DGE and word line WL (control gate electrode CG) are in direct contact with each other and electrically short-circuited to each other. Therefore, even though positive charging at the bottom of via hole VH takes place and a potential of control gate electrode CG (word line WL) increases in forming a via hole exposing interconnection AH electrically connected to contact plug CP, charges in dummy gate electrode DGE escape by the time of end of the process. Namely, charge up of dummy gate electrode DGE resulting from a value for coupling ratio Cr being close to 1 as in the comparative example can be prevented.

Figure 58:
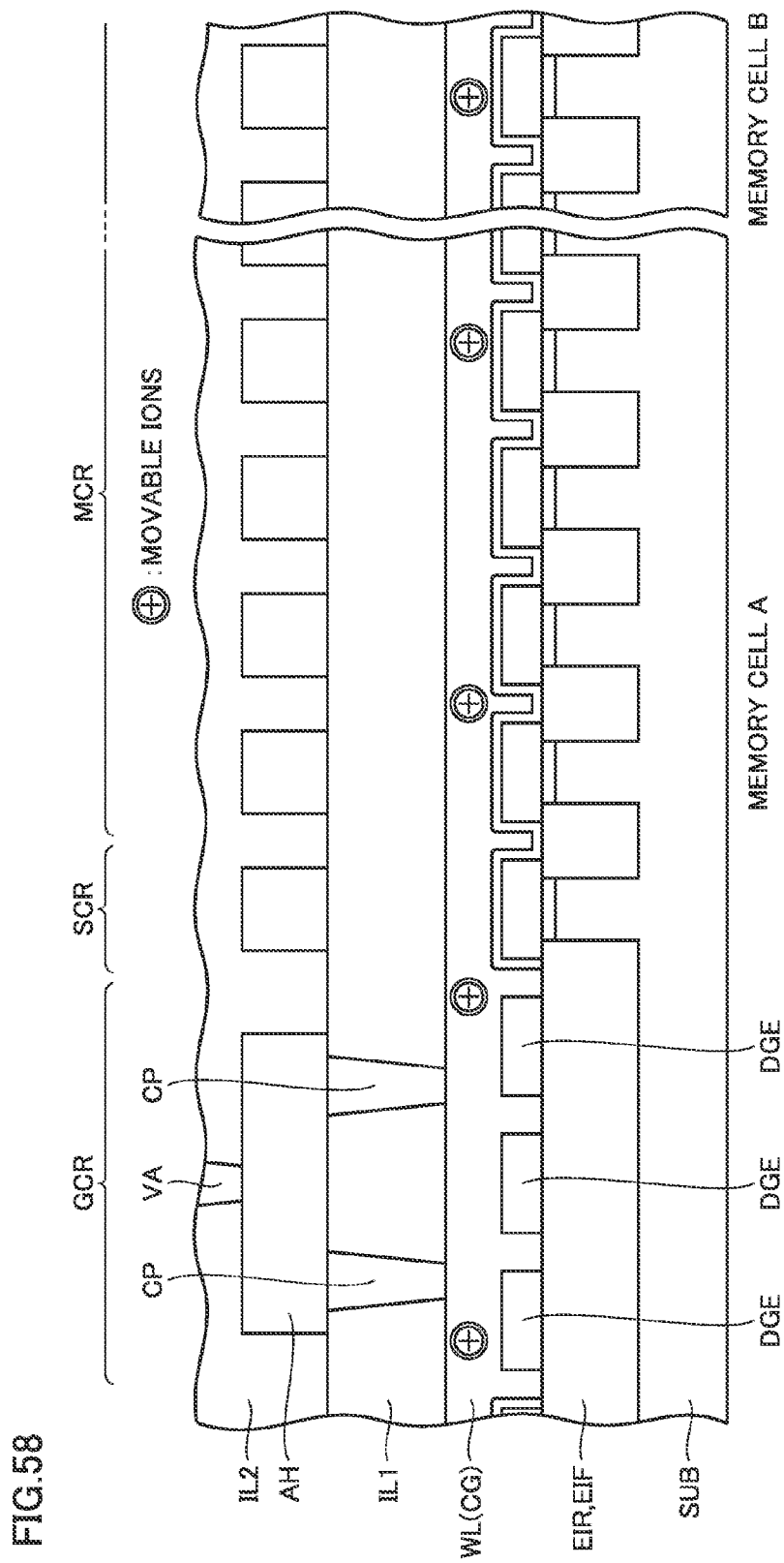
FIG. 58 is a schematic cross-sectional view showing distribution of movable ions in the third embodiment.

Thus, even though migration of movable ions is facilitated by heat treatment, concentration at a specific location due to a potential of dummy gate electrode DGE as in the comparative example is suppressed and movable ions are distributed substantially uniformly as shown in FIG. 58. Consequently, as described in the first embodiment, determination for memory cell A as data being missing (retention failure) in baking after the writing operation is suppressed. During baking after the erasing operation, determination for memory cell A as data not having been erased (retention failure) is suppressed.

In the semiconductor device including the non-volatile memory described above, as described in the first embodiment, it is also possible that plasma negatively charges control gate electrode CG (word line WL). In such a case as well, charges in dummy gate electrode DGE escape by the time of end of the process because dummy gate electrode DGE and word line WL are electrically short-circuited to each other.

Consequently, determination for memory cell A as data being missing (retention failure) in baking after the writing operation is suppressed. During baking after the erasing operation, determination for memory cell A as data not having been erased (retention failure) is suppressed.

In the semiconductor device according to the third embodiment, as compared with the semiconductor device according to the comparative example described in the first embodiment, erroneous determination as retention failure of memory cell A located in the vicinity of gate contact region GCR can be suppressed.

The semiconductor device described in each embodiment may be combined as appropriate as necessary.

Although the invention made by the present inventor has specifically been described based on embodiments, the present invention is not limited to the embodiments but is naturally susceptible to various modifications without departing the gist of the invention.

What is claimed is:
1. A semiconductor device, comprising:
 a semiconductor substrate;
 a first region arranged in a surface of said semiconductor substrate and including a plurality of first element formation regions each defined by a first element isolation region;
 a second region arranged in said surface of said semiconductor substrate as being adjacent to said first region and including a dummy element formation region defined by a second element isolation region;
 a plurality of memory cell transistors formed in a plurality of said first element formation regions and each including a floating gate electrode and a control gate electrode;
 a dummy floating gate electrode formed in said second region;
 a word line formed on said dummy floating gate electrode so as to cross said dummy floating gate electrode and electrically connected to the control gate electrode of at least one memory cell transistor of said plurality of memory cell transistors;
 an interlayer insulating film formed to cover said word line; and a conductor portion formed in a portion of said interlayer insulating film located in said second region and electrically connected to said word line, said dummy floating gate electrode being arranged to partially be superimposed on said dummy element formation region in a two-dimensional view.

2. The semiconductor device according to claim 1, wherein said interlayer insulating film includes a first interlayer insulating film and a second interlayer insulating film formed to cover said first interlayer insulating film, and said conductor portion includes a contact plug formed in said first interlayer insulating film and electrically connected to said word line and a via formed in said second interlayer insulating film and electrically connected to said contact plug, and said contact plug is arranged to partially be superimposed on said dummy element formation region in a two-dimensional view.

3. The semiconductor device according to claim 2, further comprising an interconnection formed between a portion of said first interlayer insulating film and a portion of said second interlayer insulating film which are located in said second region, wherein said contact plug and said via are electrically connected to each other through said interconnection.

4. The semiconductor device according to claim 1, wherein said interlayer insulating film is an undoped insulating film.

5. A semiconductor device, comprising:
a semiconductor substrate;
a first region arranged in a surface of said semiconductor substrate and including a plurality of first element formation regions each defined by a first element isolation region;
a second region arranged in said surface of said semiconductor substrate as being adjacent to said first region and including a dummy element formation region defined by a second element isolation region;
a plurality of memory cell transistors formed in a plurality of said first element formation regions and each including a floating gate electrode and a control gate electrode;
a dummy floating gate electrode formed in said second region;
a word line formed on said dummy floating gate electrode so as to cross said dummy floating gate electrode and electrically connected to the control gate electrode of at least one memory cell transistor of said plurality of memory cell transistors;
an interlayer insulating film formed to cover said word line; and
a conductor portion formed in a portion of said interlayer insulating film located in said second region and electrically connected to said word line, said dummy floating gate electrode and said word line being electrically connected to each other.

6. The semiconductor device according to claim 5, wherein said interlayer insulating film includes a first interlayer insulating film and a second interlayer insulating film formed to cover said first interlayer insulating film, said conductor portion includes a contact plug formed in said first interlayer insulating film and electrically connected to said word line and a via formed in said second interlayer insulating film and electrically connected to said contact plug, and said dummy floating gate electrode and said word line are electrically connected to each other through said contact plug.

7. The semiconductor device according to claim 6, further comprising an interconnection formed between a portion of said first interlayer insulating film and a portion of said second interlayer insulating film which are located in said second region, wherein said contact plug and said via are electrically connected to each other through said interconnection.

8. The semiconductor device according to claim 5, wherein said interlayer insulating film includes a first interlayer insulating film and a second interlayer insulating film formed to cover said first interlayer insulating film, said conductor portion includes a contact plug formed in said first interlayer insulating film and electrically connected to said word line and a via formed in said second interlayer insulating film and electrically connected to said contact plug, and said dummy floating gate electrode and said word line are electrically connected to each other by being in direct contact with each other.

9. The semiconductor device according to claim 8, further comprising an interconnection formed between a portion of said first interlayer insulating film and a portion of said second interlayer insulating film which are located in said second region, wherein said contact plug and said via are electrically connected to each other through said interconnection.

10. The semiconductor device according to claim 5, wherein said interlayer insulating film is an undoped insulating film.

* * * * *